(12) United States Patent
Moe et al.

(10) Patent No.: US 12,549,150 B2
(45) Date of Patent: Feb. 10, 2026

(54) METHODS OF FORMING EPITAXIAL AlScN RESONATORS WITH SUPERLATTICE STRUCTURES INCLUDING AlGaN INTERLAYERS AND VARIED SCANDIUM CONCENTRATIONS FOR STRESS CONTROL AND RELATED STRUCTURES

(71) Applicant: Akoustis Technologies Corp., Huntersville, NC (US)

(72) Inventors: Craig Moe, Penfield, NY (US); Jeffrey M. Leathersich, Rochester, NY (US); Jeffrey B. Shealy, Cornelius, NC (US)

(73) Assignee: Akoustis Technologies Corp., Huntersville, NC (US)

( * ) Notice: Subject to any disclaimer, the term of this patent is extended or adjusted under 35 U.S.C. 154(b) by 1016 days.

(21) Appl. No.: 17/527,866

(22) Filed: Nov. 16, 2021

(65) Prior Publication Data
US 2022/0416756 A1    Dec. 29, 2022

Related U.S. Application Data

(60) Provisional application No. 63/216,049, filed on Jun. 29, 2021.

(51) Int. Cl.
*C30B 25/02*    (2006.01)
*H03H 3/02*    (2006.01)
(Continued)

(52) U.S. Cl.
CPC .......... *H03H 9/02133* (2013.01); *H03H 3/02* (2013.01); *H03H 9/02031* (2013.01);
(Continued)

(58) Field of Classification Search
CPC ...... H03H 9/02133; H03H 3/02; H03H 9/533; H03H 9/02031; H03H 9/0514;
(Continued)

(56) References Cited

U.S. PATENT DOCUMENTS

2013/0140525 A1    6/2013   Chen et al.
2016/0203972 A1    7/2016   Sundaram et al.
(Continued)

FOREIGN PATENT DOCUMENTS

CN    108899403 A  *  11/2018    ........... H01L 33/007
EP    3786321 A2   *   3/2021    ........... C23C 16/303

OTHER PUBLICATIONS

Hardy, et al., "Epitaxial ScAlN grown by molecular beam epitaxy on GaN and SiC substrates," Applied Physics Letters, 110, 162104 (2017) https://doi.org/10.1063/1.4981807.
(Continued)

*Primary Examiner* — Robert M Kunemund
(74) *Attorney, Agent, or Firm* — Polsinelli PC

(57) ABSTRACT

A method of forming a resonator structure can be provided by forming one or more template layers on a substrate, (a) epitaxially forming an AlScN layer on the template layer to a first thickness, (b) epitaxially forming an AlGaN interlayer on the AlScN layer to a second thickness that is substantially less than the first thickness, and repeating operations (a) and (b) until a total thickness of all AlScN layers and AlGaN interlayers provides a target thickness for a single crystal AlScN/AlGaN superlattice resonator structure on the template layer.

16 Claims, 72 Drawing Sheets

(51) Int. Cl.
H03H 9/02 (2006.01)
H03H 9/05 (2006.01)
H03H 9/17 (2006.01)

(52) U.S. Cl.
CPC ........ *H03H 9/0514* (2013.01); *H03H 9/0533* (2013.01); *H03H 9/173* (2013.01); *H03H 9/175* (2013.01); *H03H 9/176* (2013.01); *H03H 2003/021* (2013.01); *H03H 2003/025* (2013.01)

(58) Field of Classification Search
CPC ........ H03H 9/175; H03H 9/173; H03H 9/176; H03H 2003/021; H03H 2003/025; C30B 25/02; C30B 29/403
See application file for complete search history.

(56) References Cited

U.S. PATENT DOCUMENTS

| | | |
|---|---|---|
| 2021/0066070 A1 | 3/2021 | Leone et al. |
| 2021/0359664 A1* | 11/2021 | Tabrizian ........... H03H 9/02543 |
| 2024/0274507 A1* | 8/2024 | Bothe ................ H10D 62/8503 |

OTHER PUBLICATIONS

Ligl, et al., "Metalorganic chemical vapor phase deposition of AlScN/GaN heterostructures," J. Appl. Phys. 127, 195704 (2020) https://doi.org/10.1063/5.0003095.

* cited by examiner

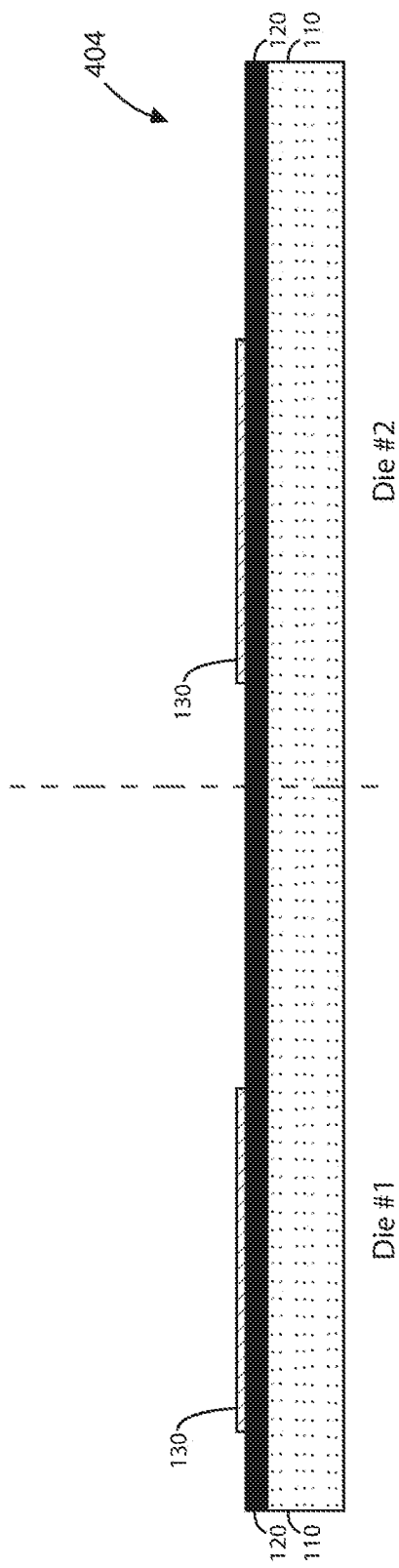
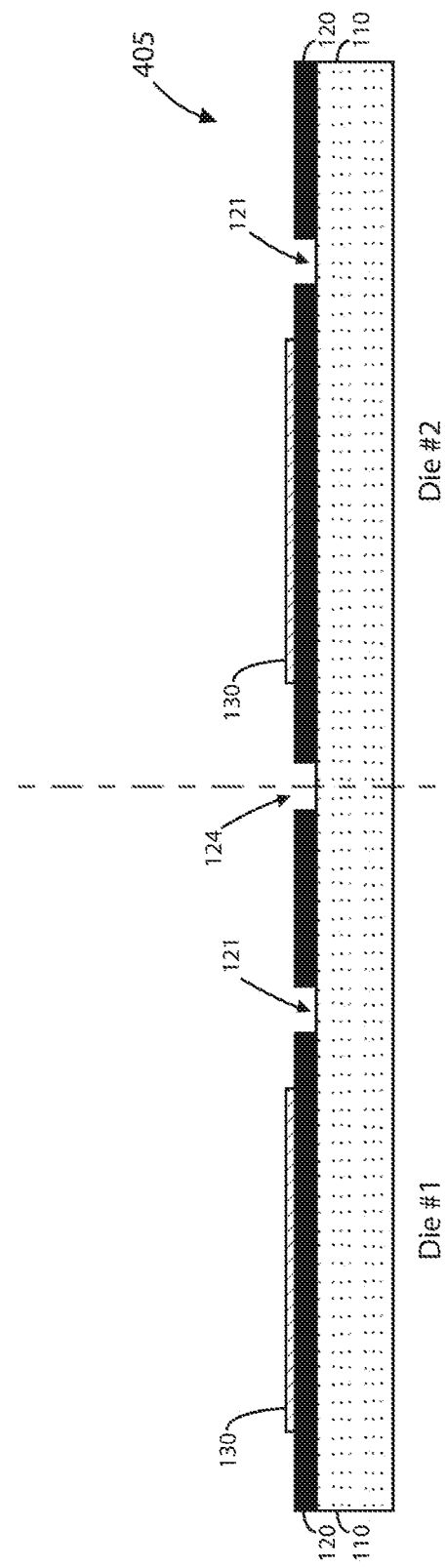

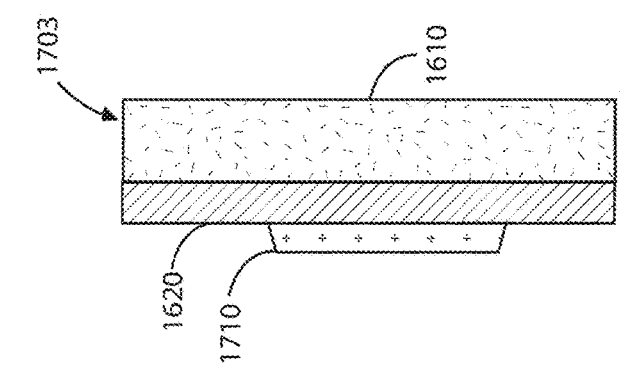
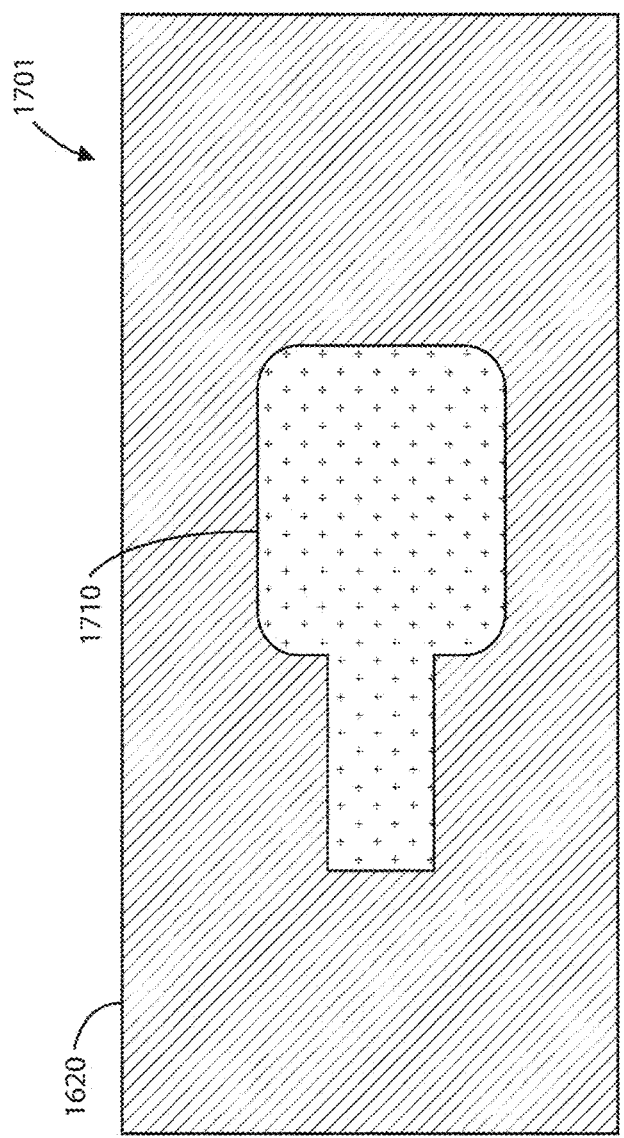
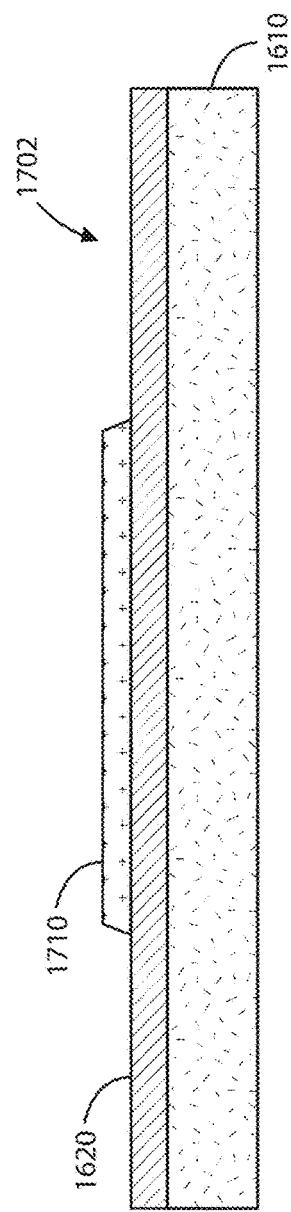
FIG. 17A
FIG. 17B
FIG. 17C

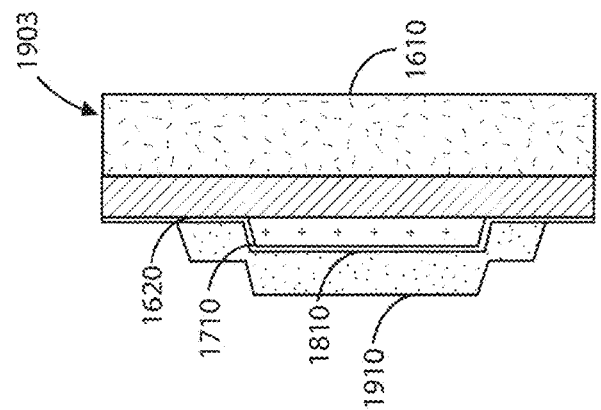
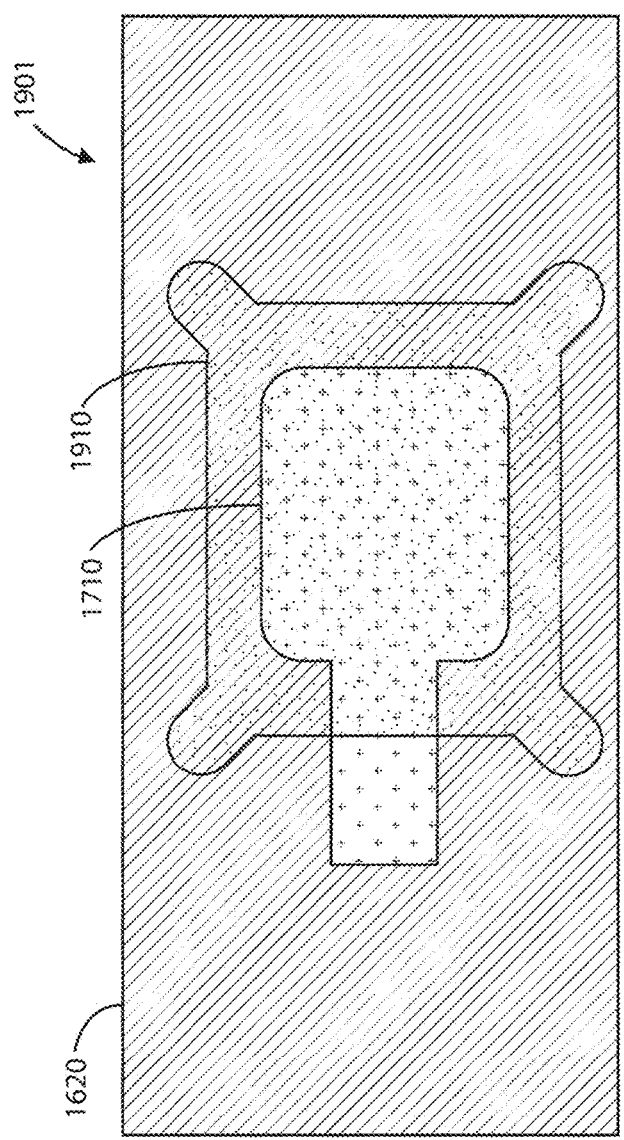
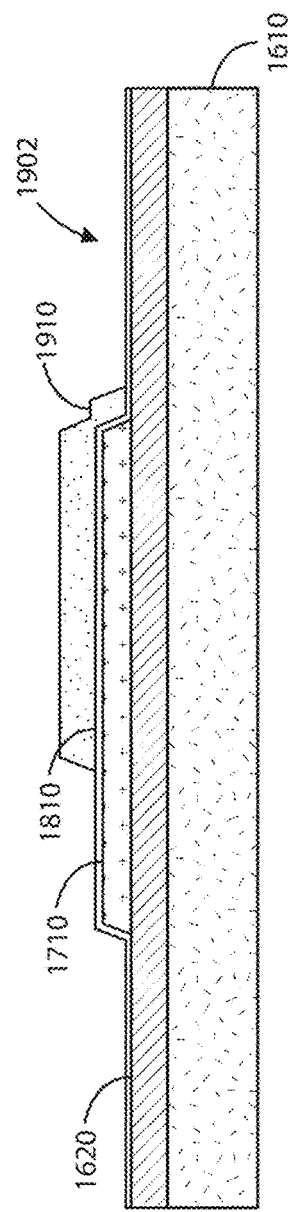
FIG. 19C
FIG. 19A
FIG. 19B

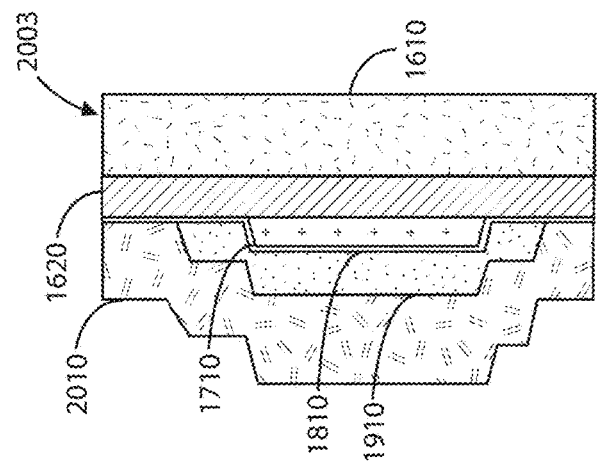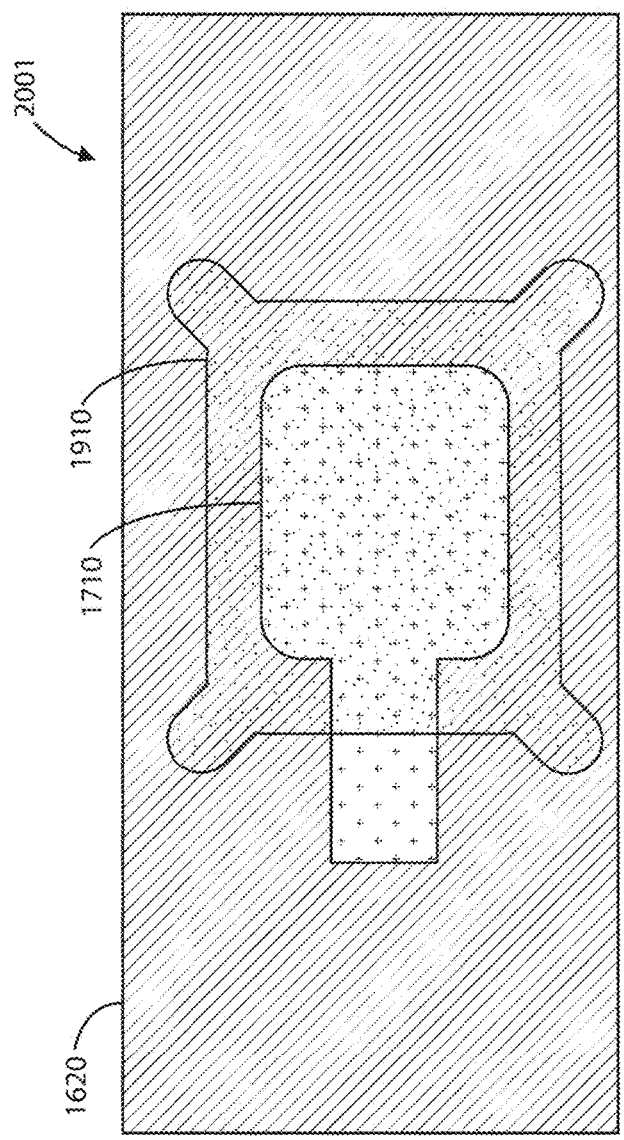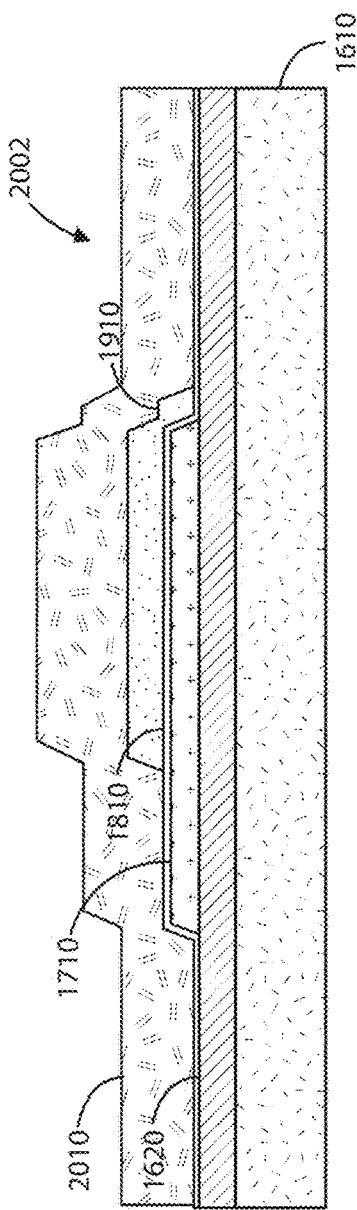

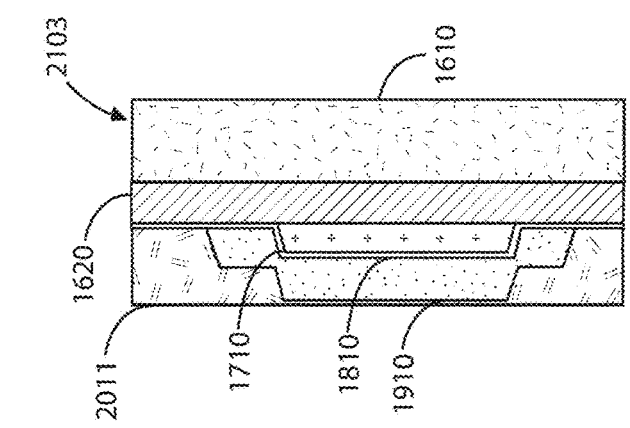
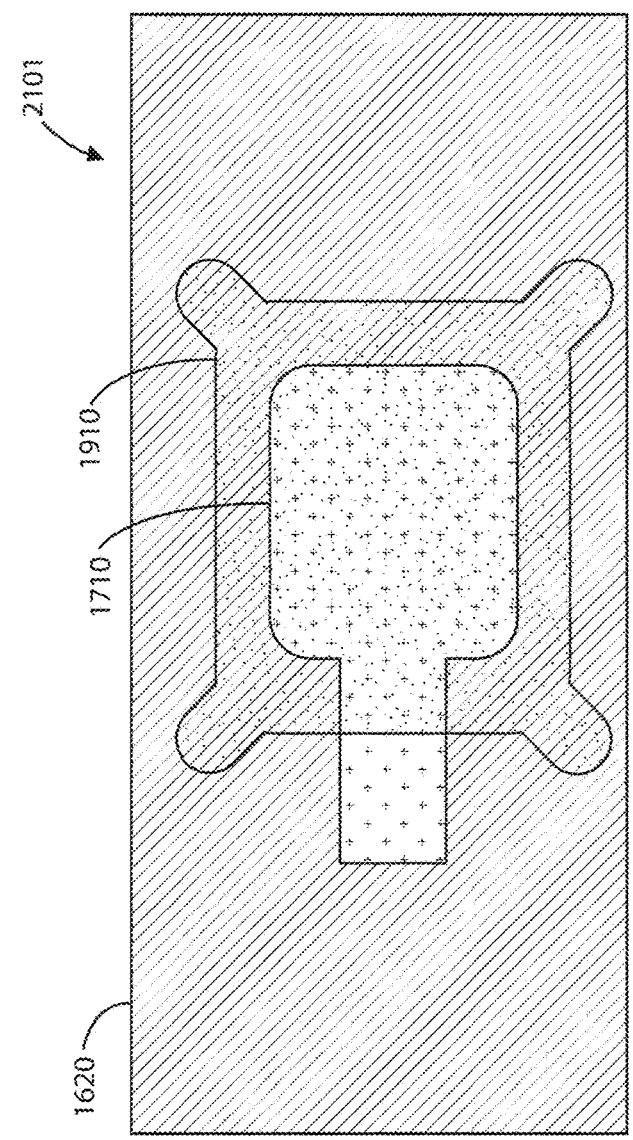
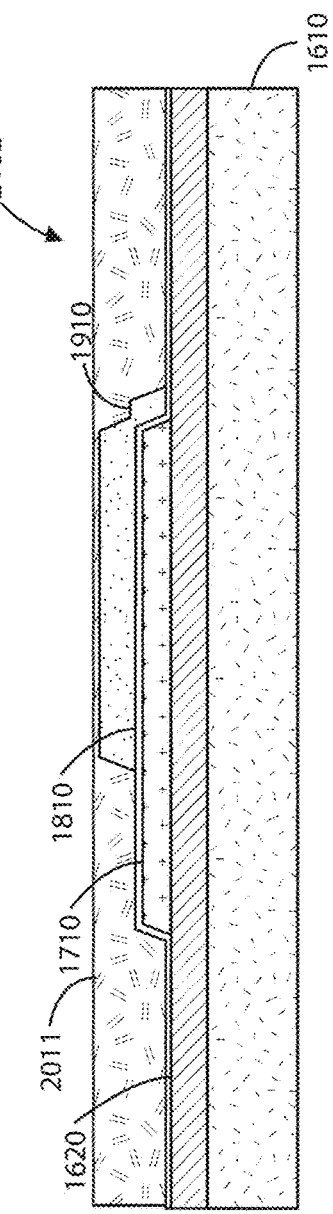
FIG. 21C
FIG. 21A
FIG. 21B

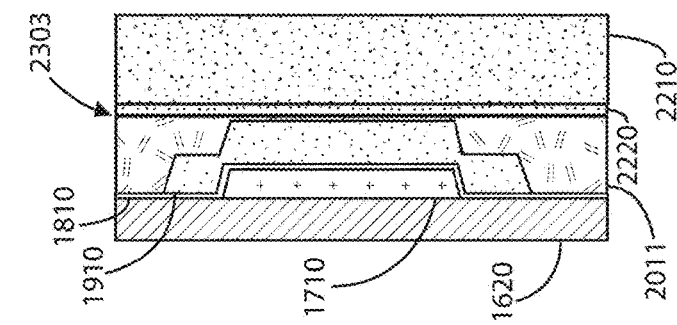
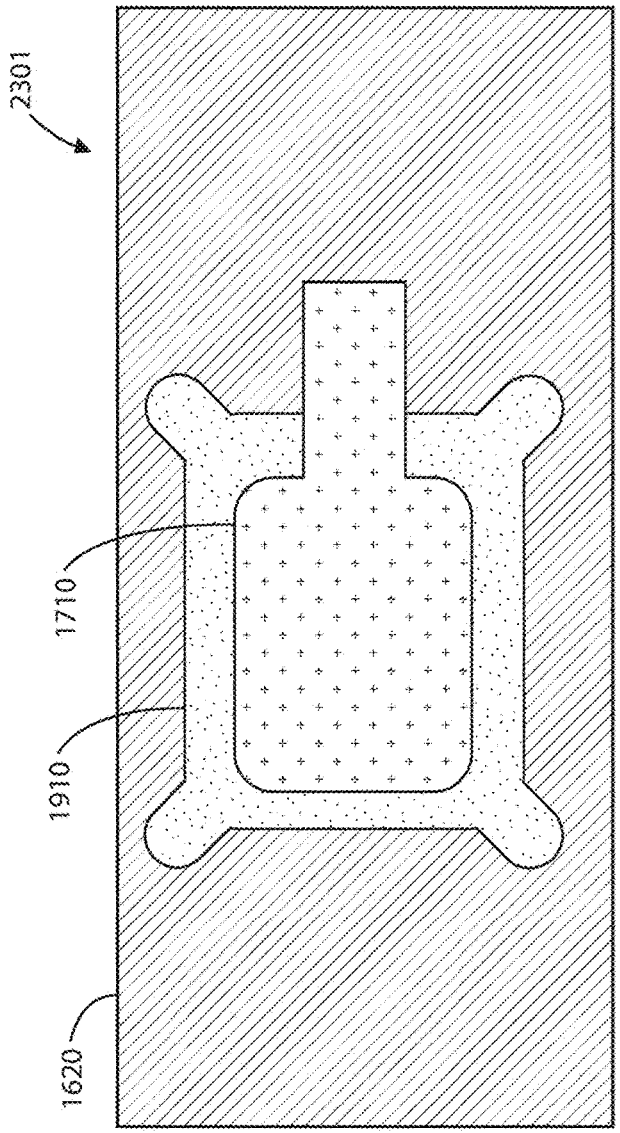
FIG. 23A
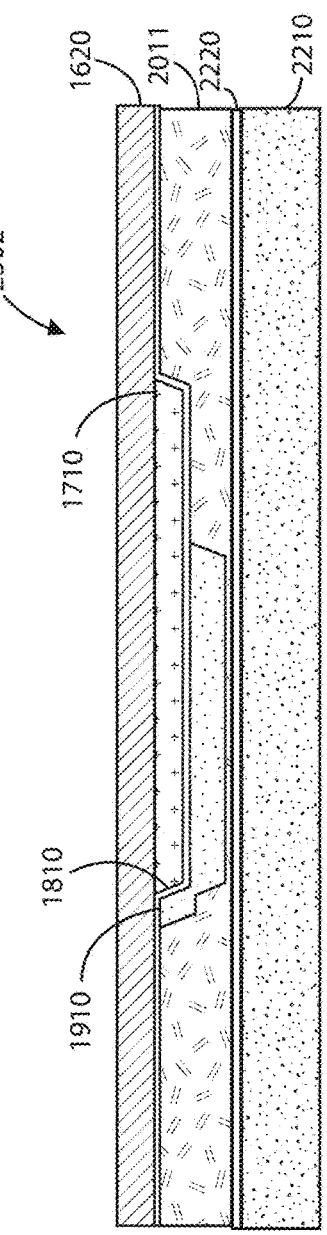
FIG. 23B
FIG. 23C

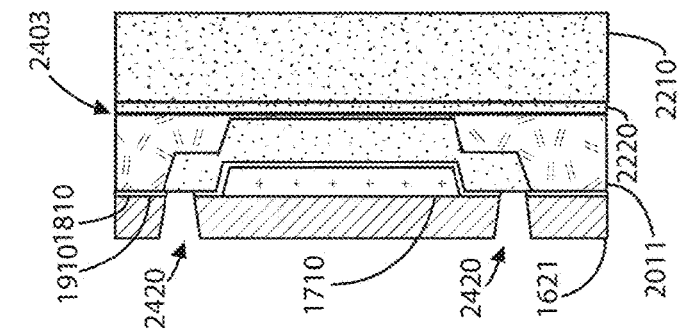
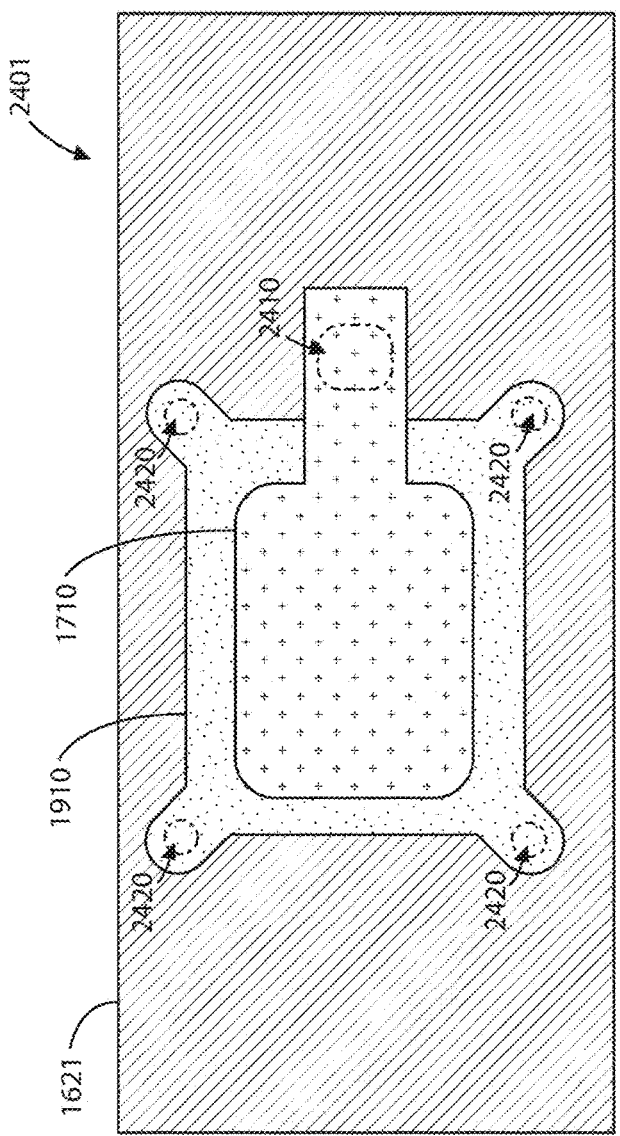
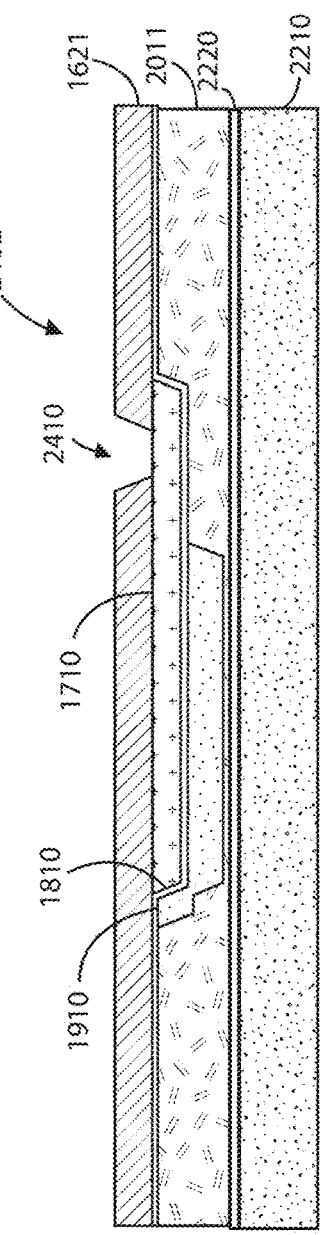

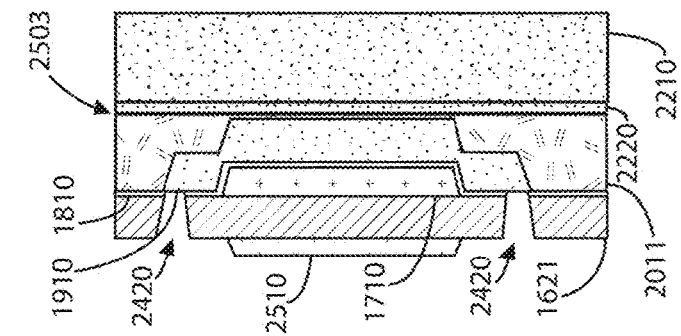
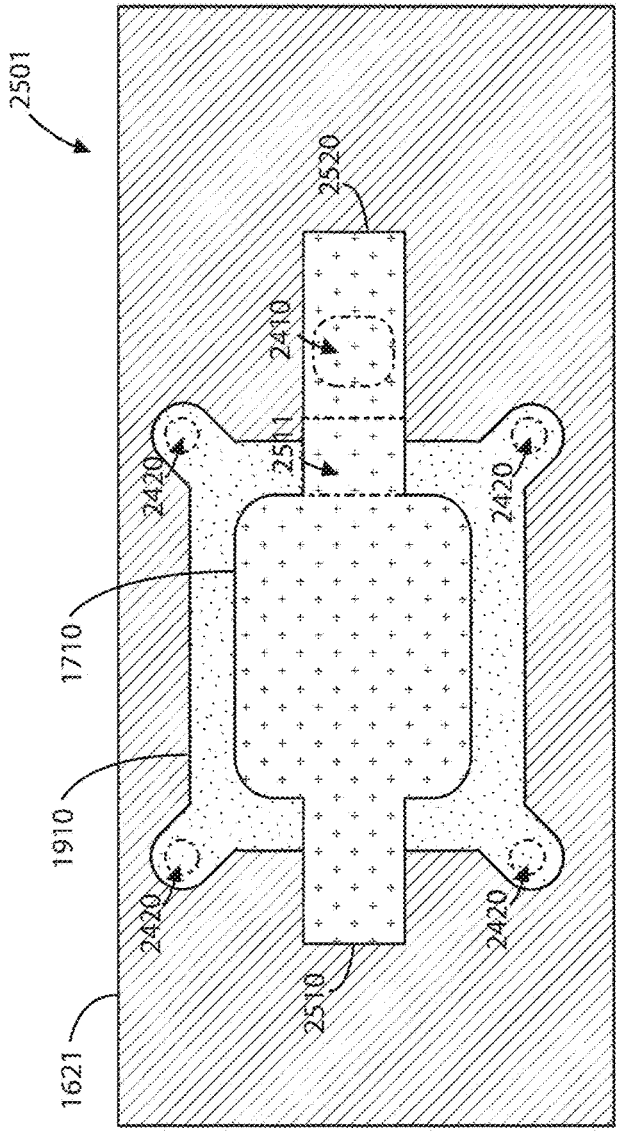
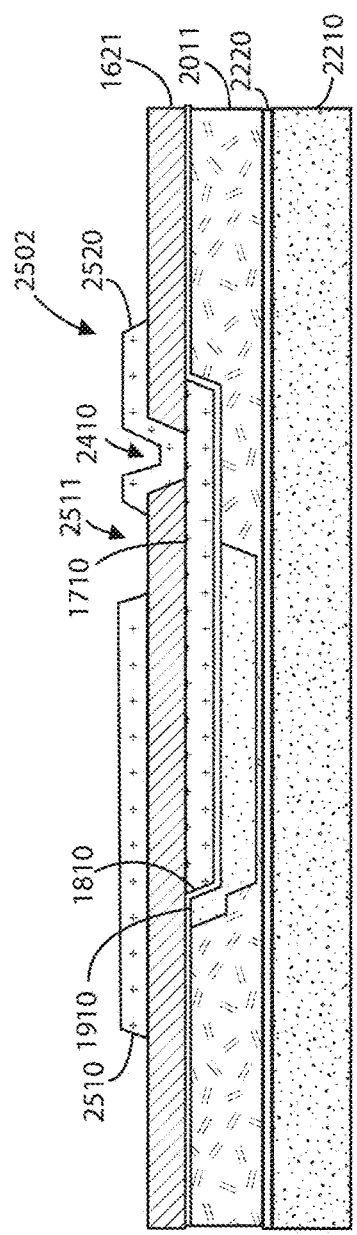

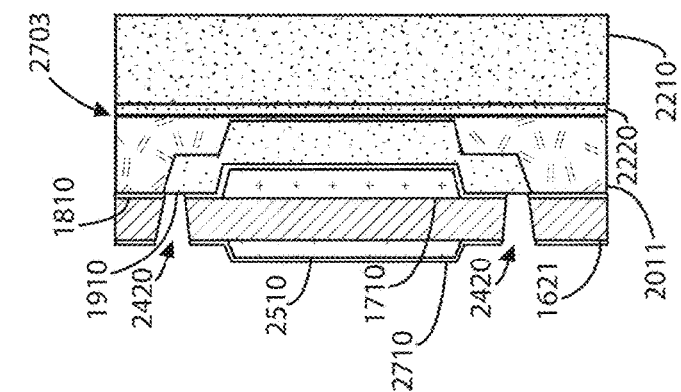
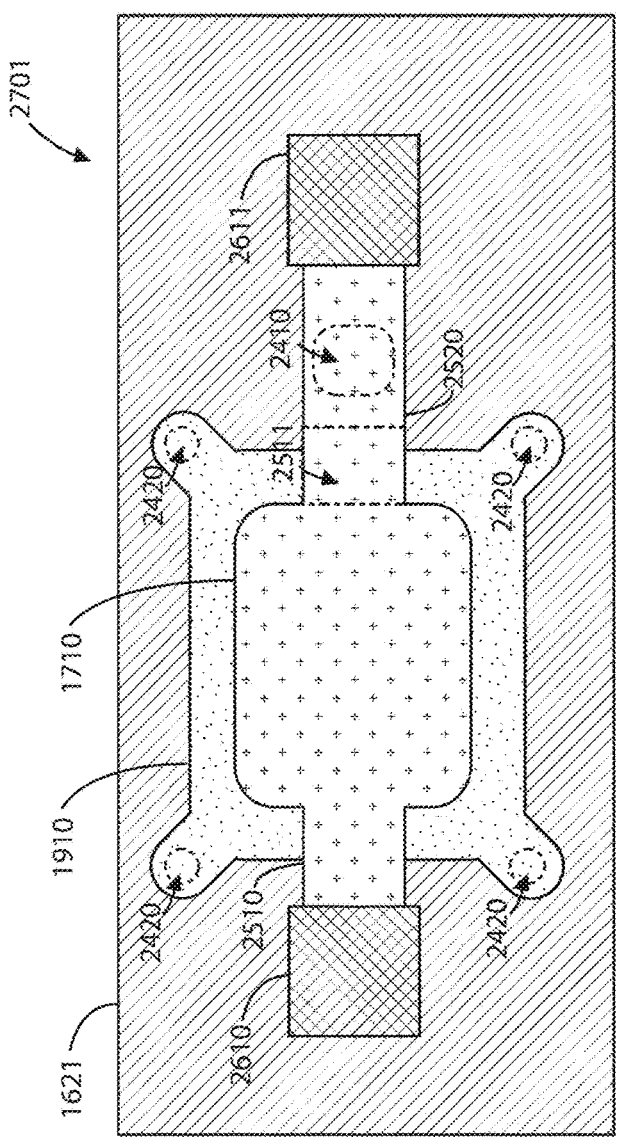
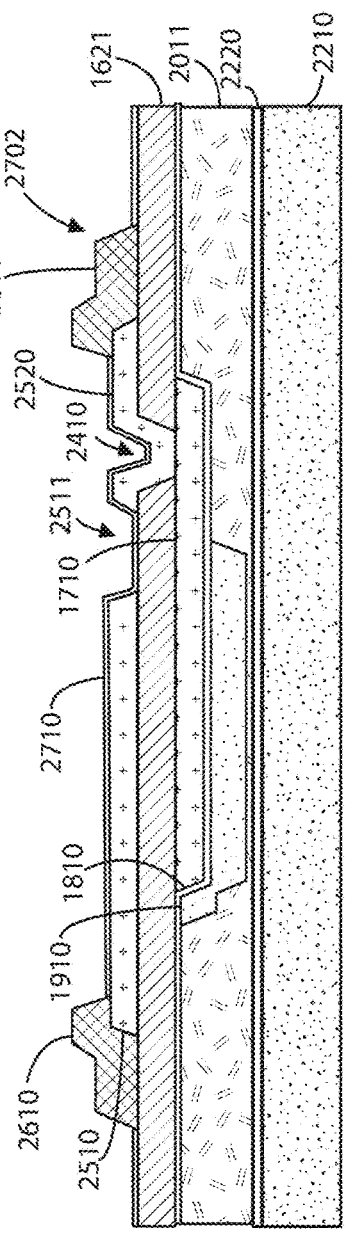
FIG. 27C
FIG. 27A
FIG. 27B

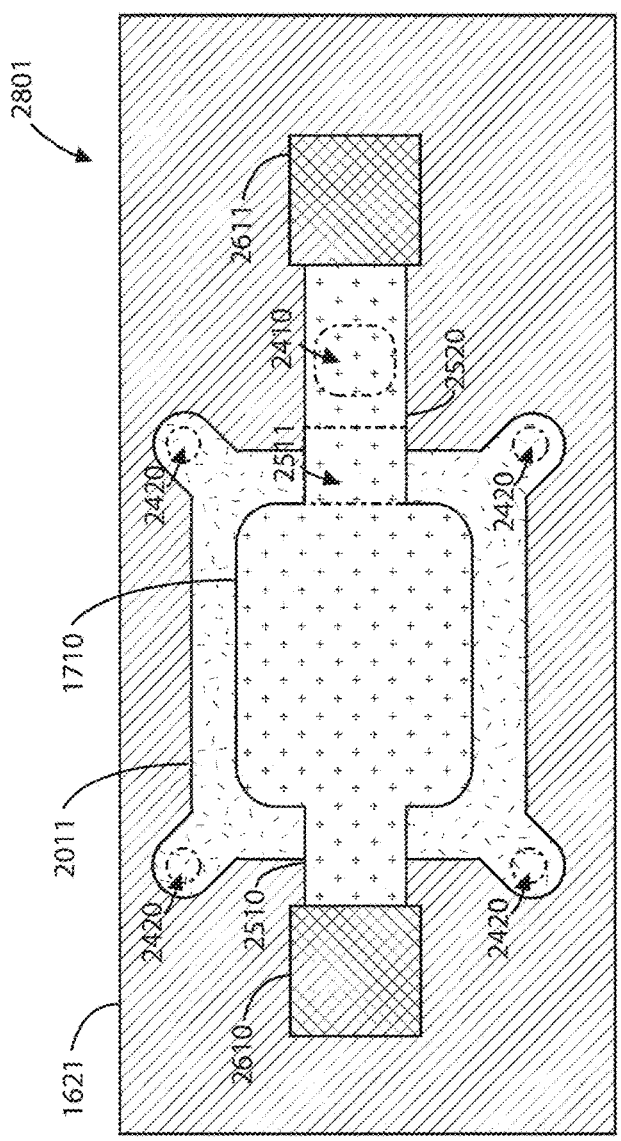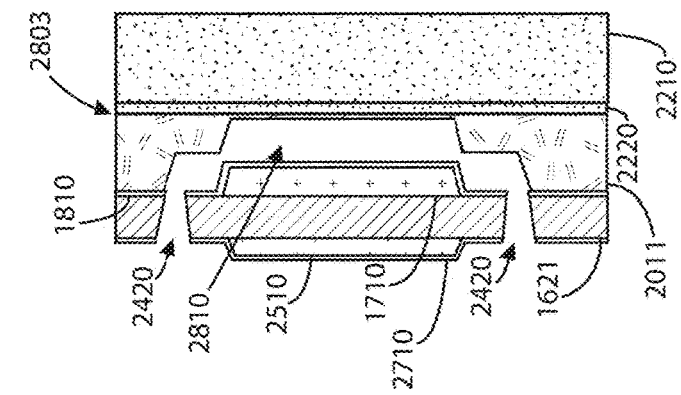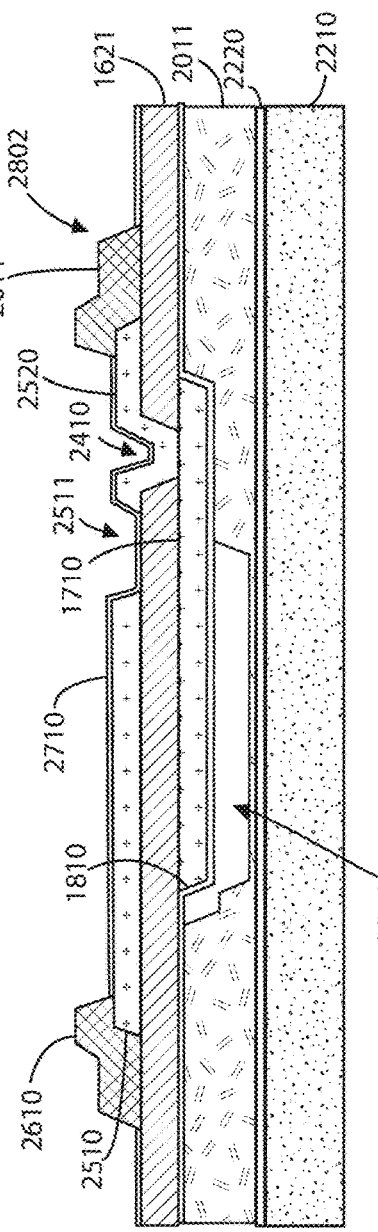
FIG. 28A
FIG. 28B
FIG. 28C

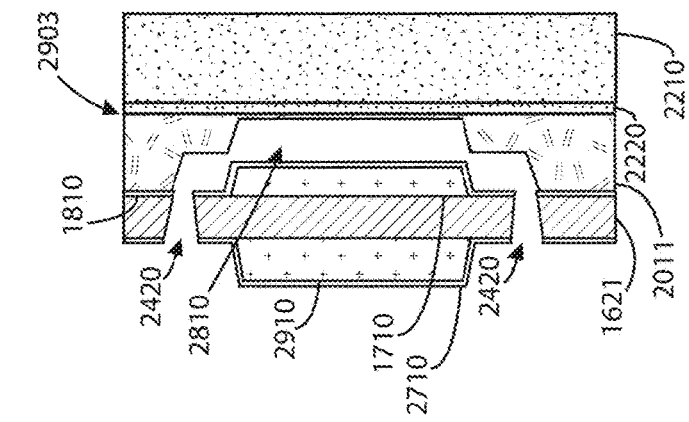
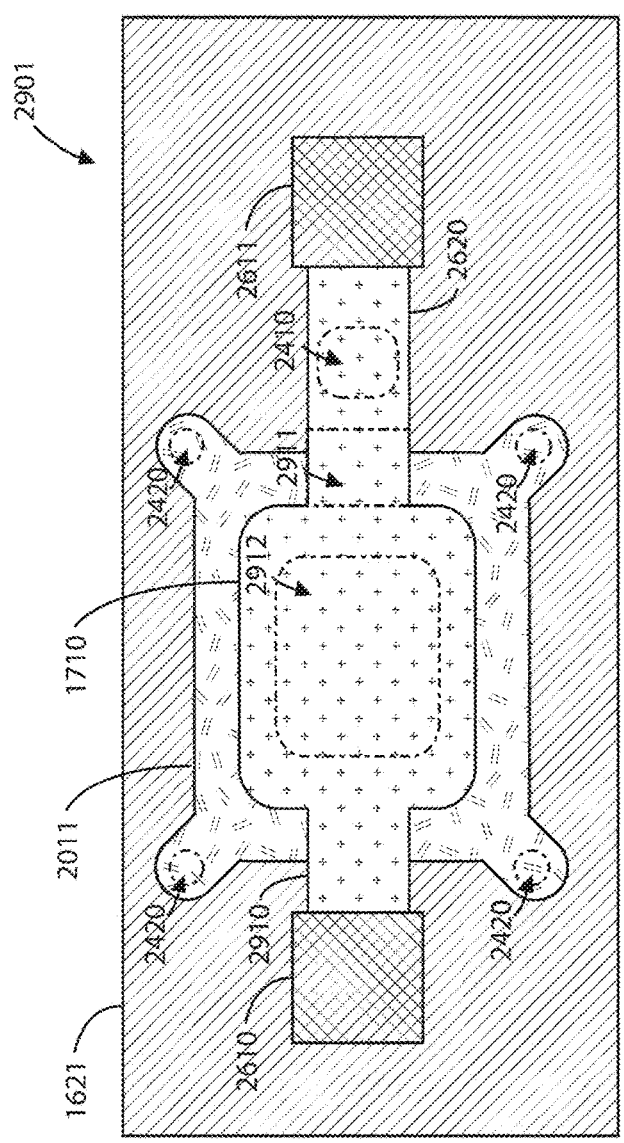
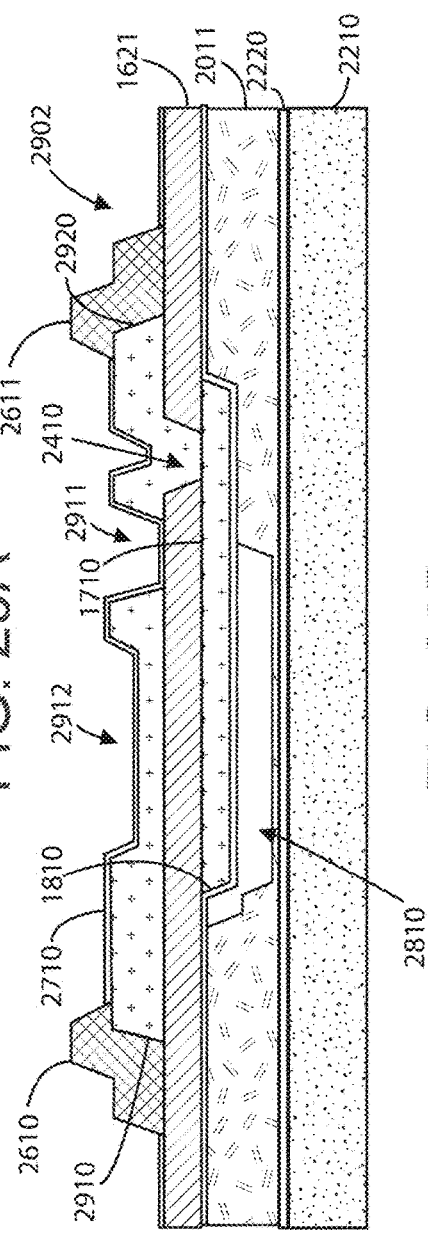
FIG. 29C
FIG. 29A
FIG. 29B

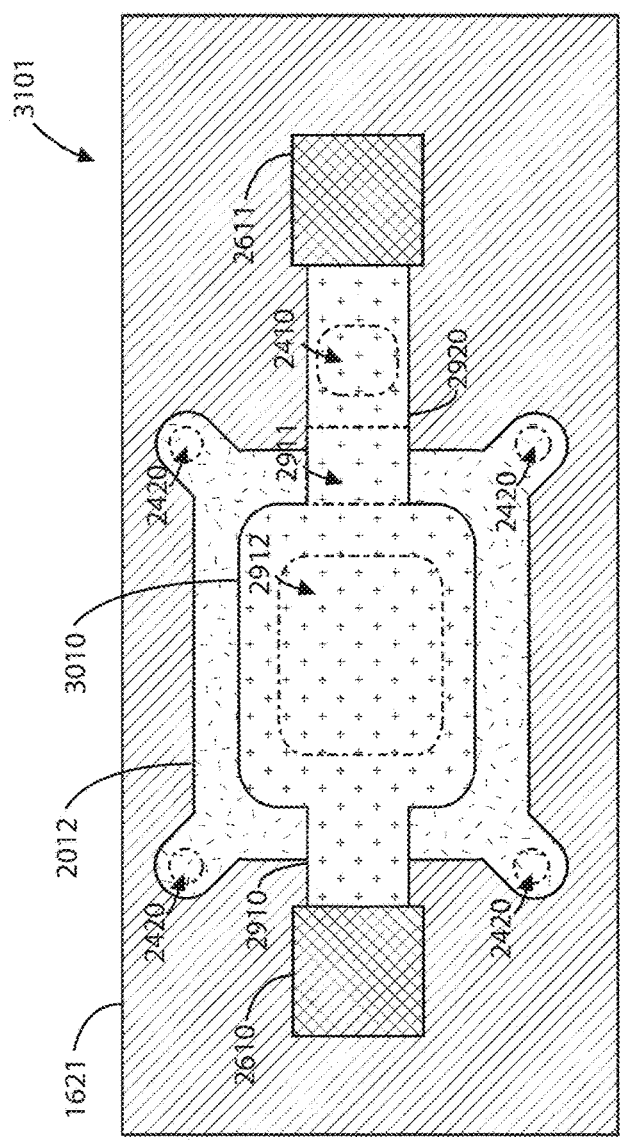
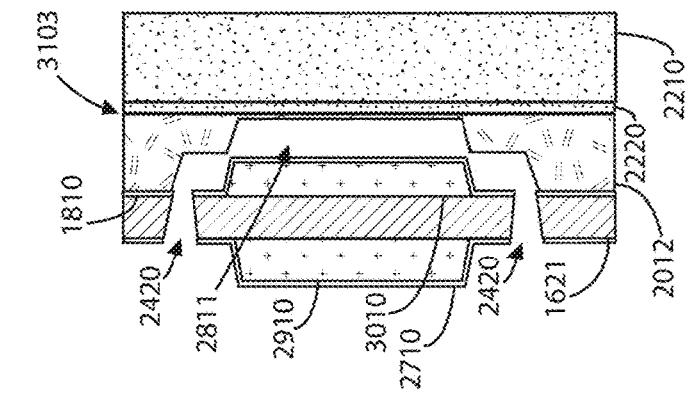
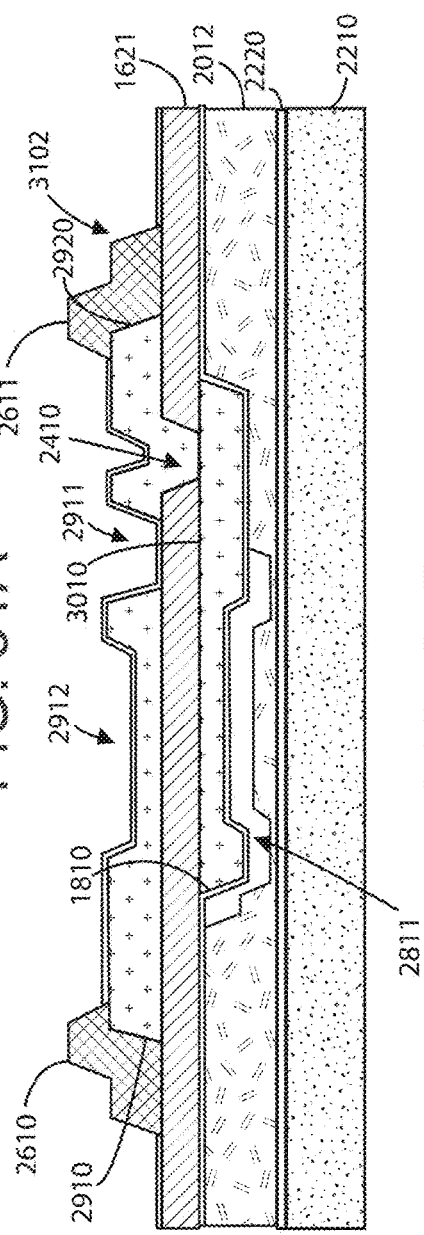
FIG. 31A
FIG. 31B
FIG. 31C

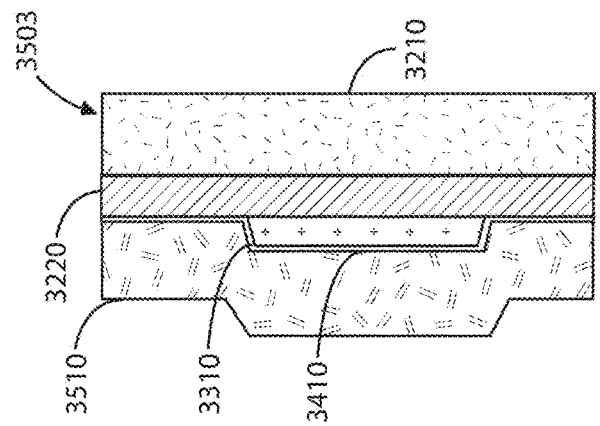
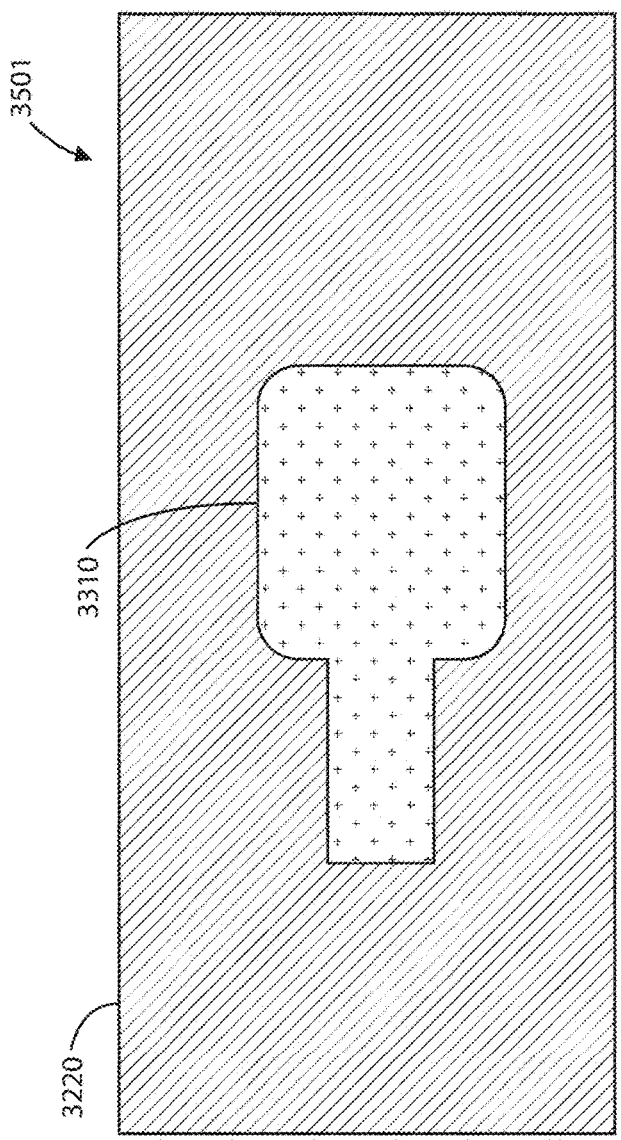
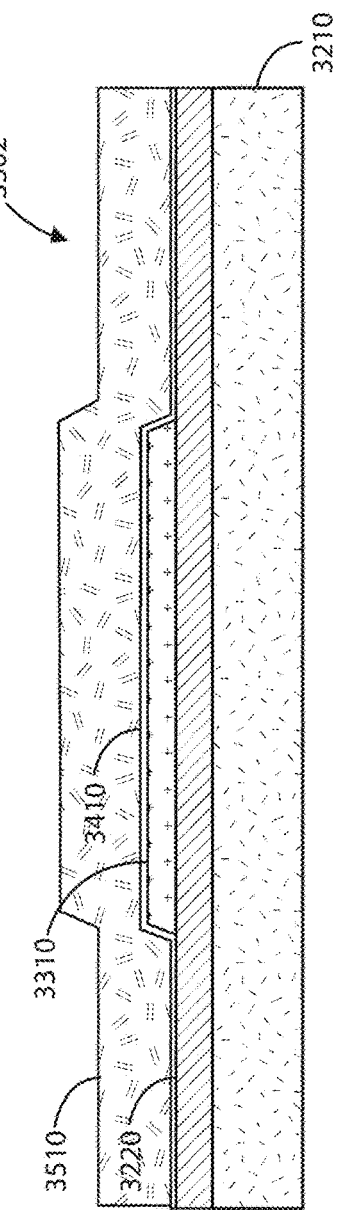
FIG. 35A
FIG. 35B
FIG. 35C

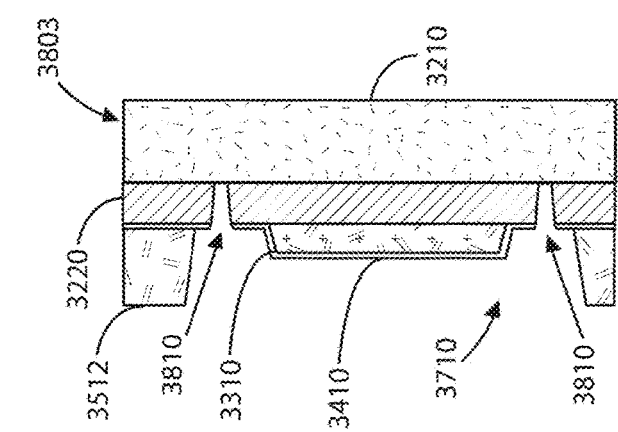
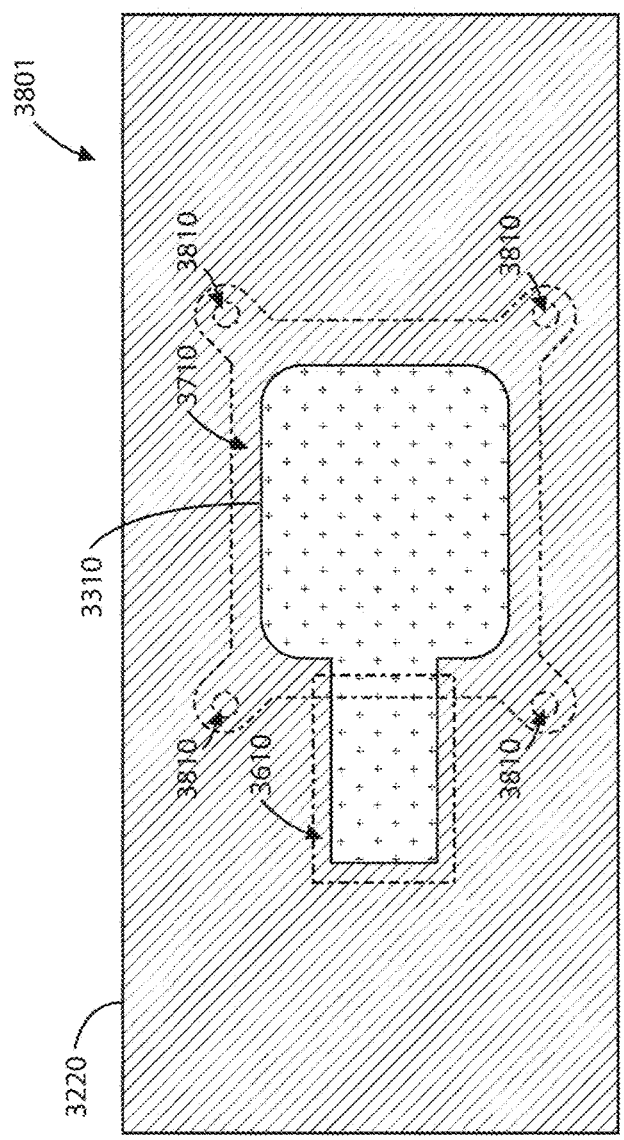
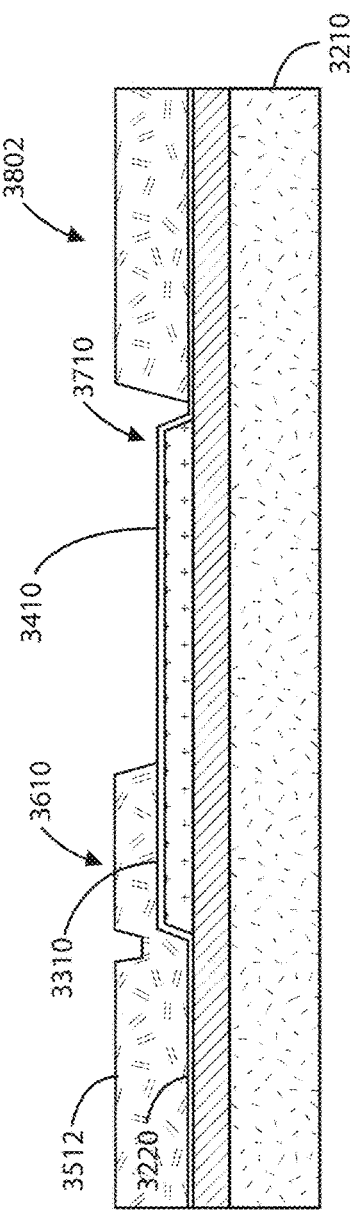
FIG. 38A
FIG. 38B
FIG. 38C

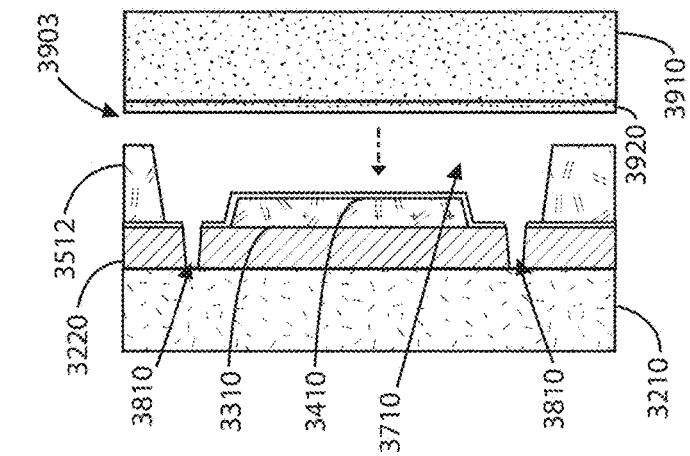
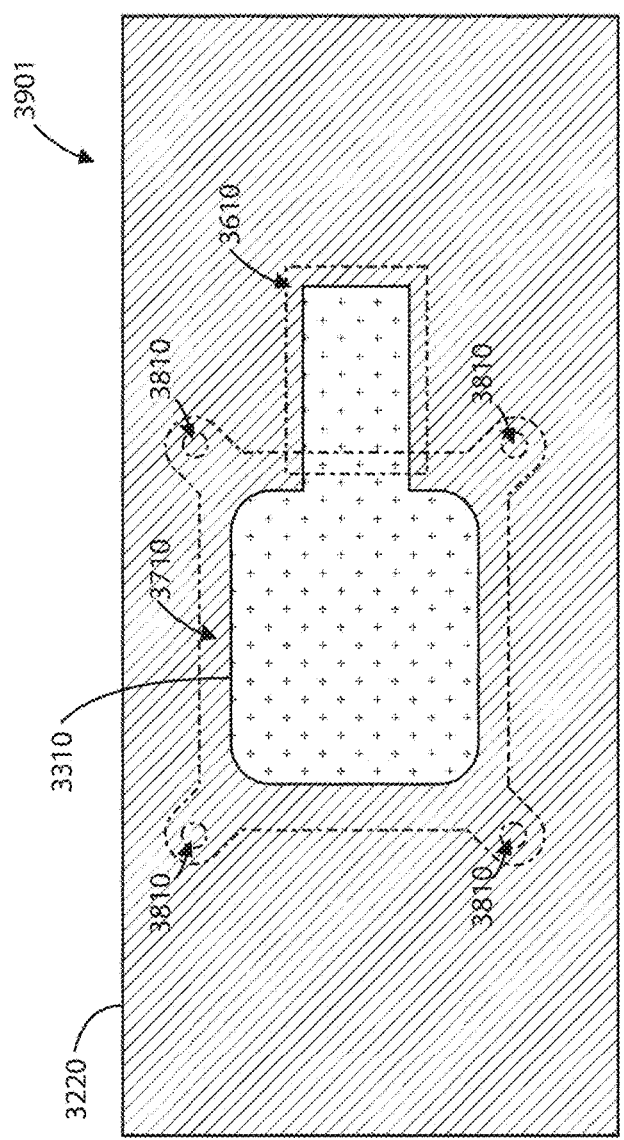
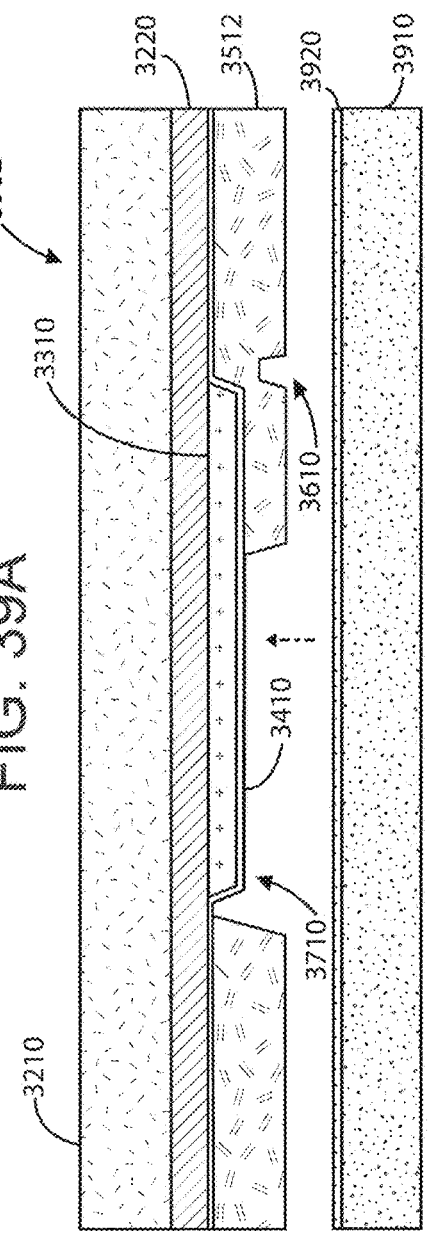
FIG. 39C
FIG. 39A
FIG. 39B

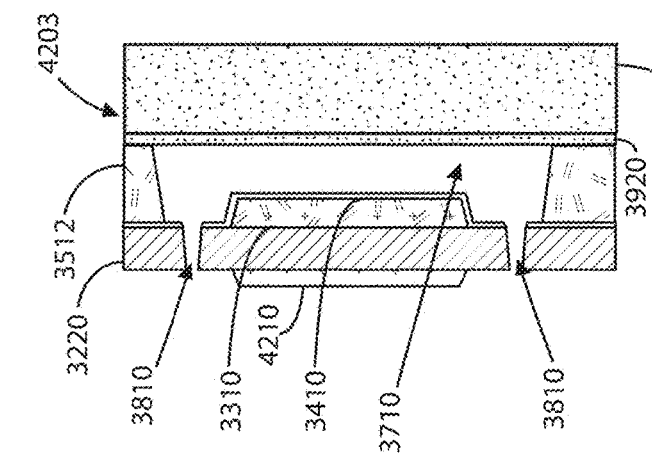
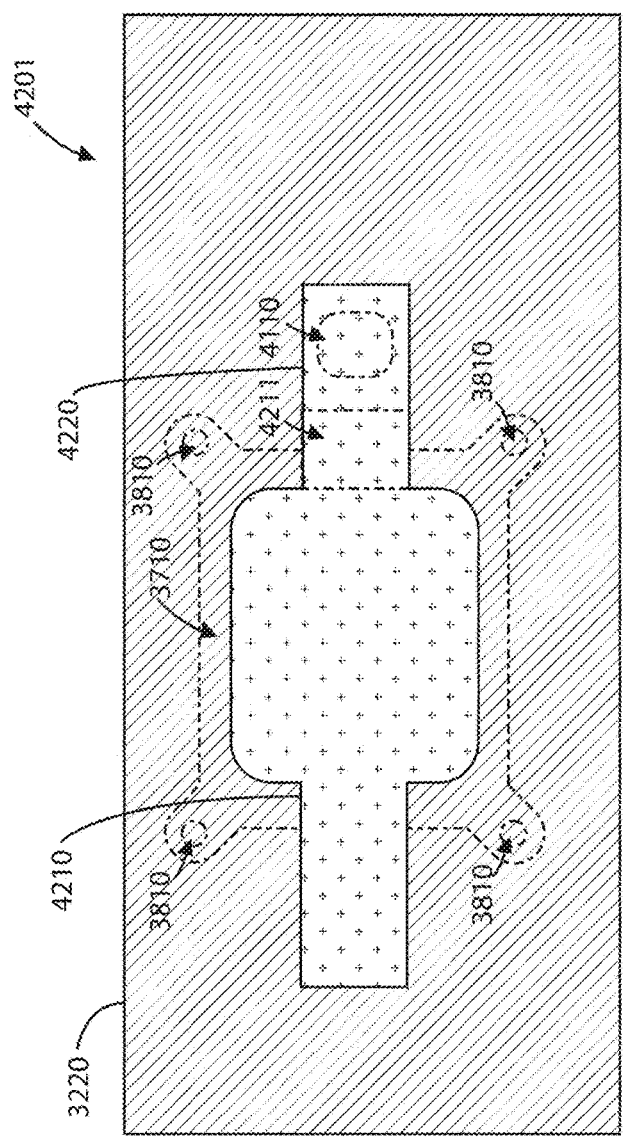
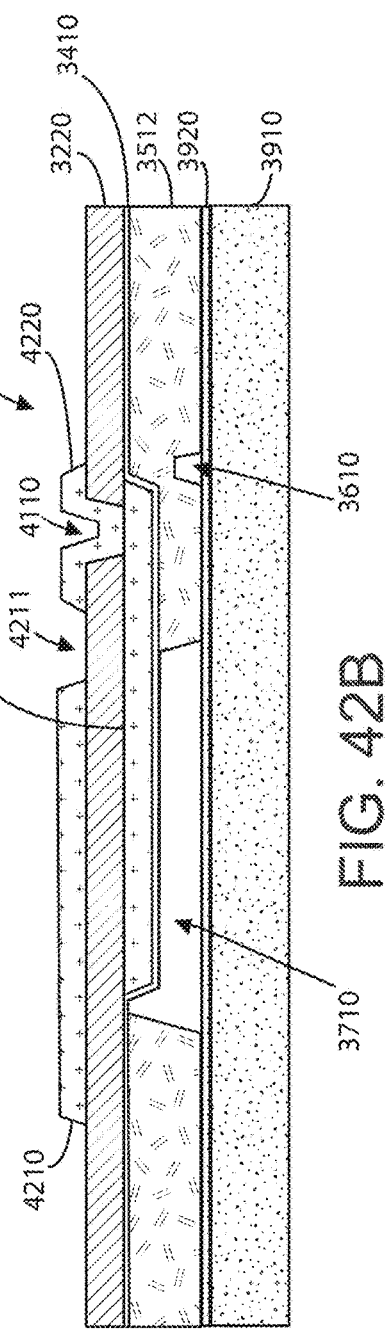

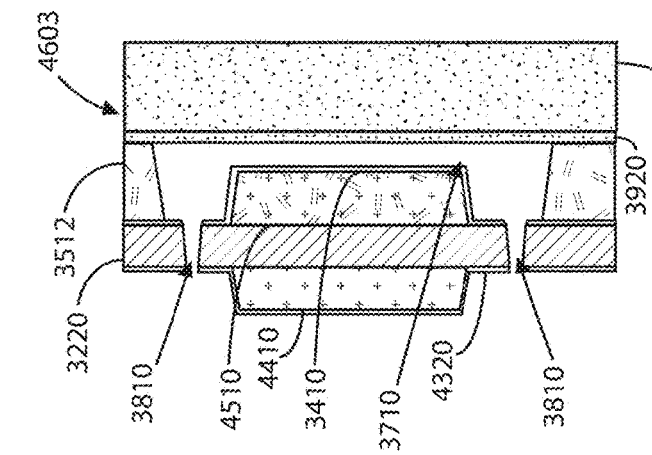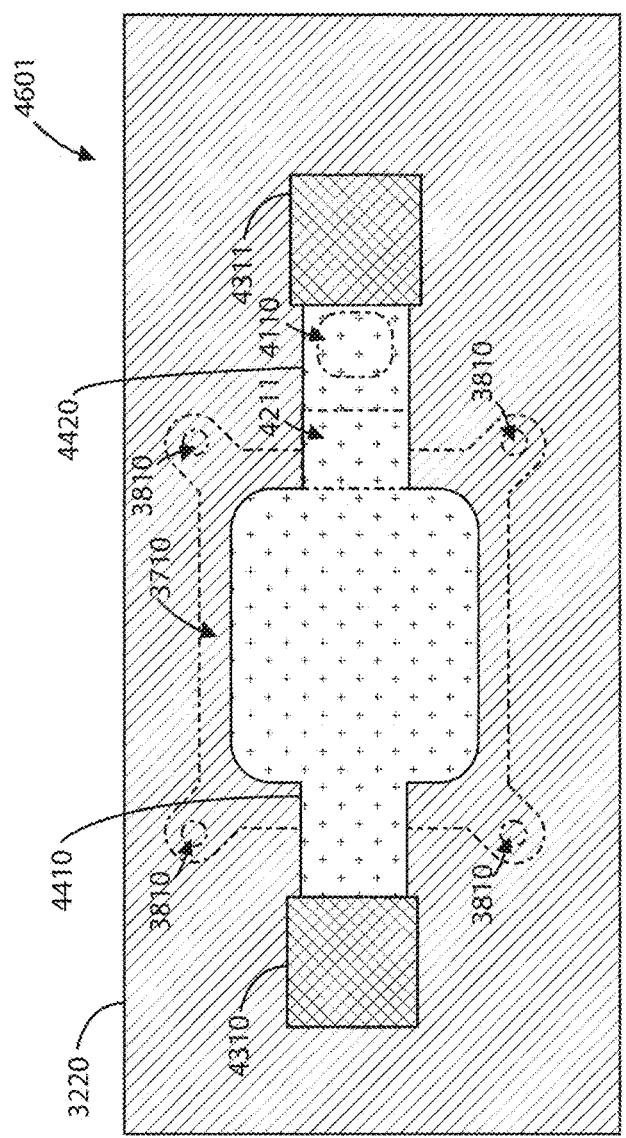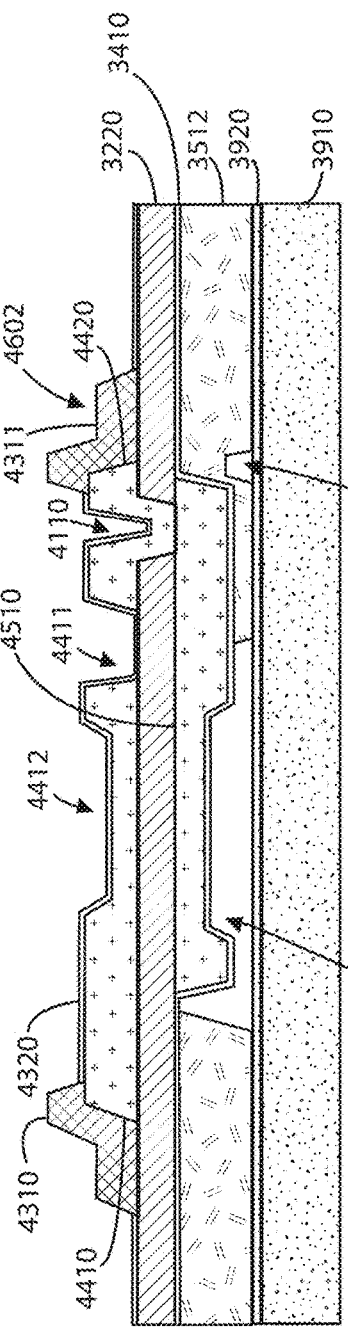

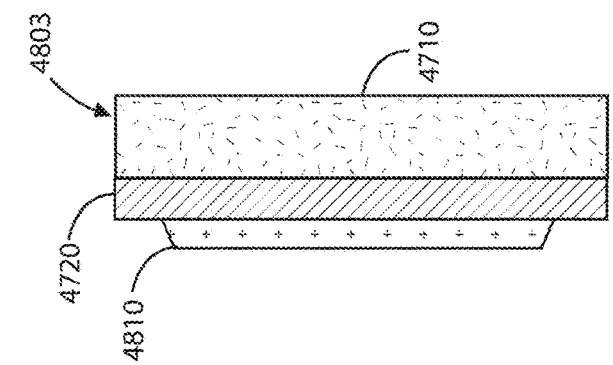
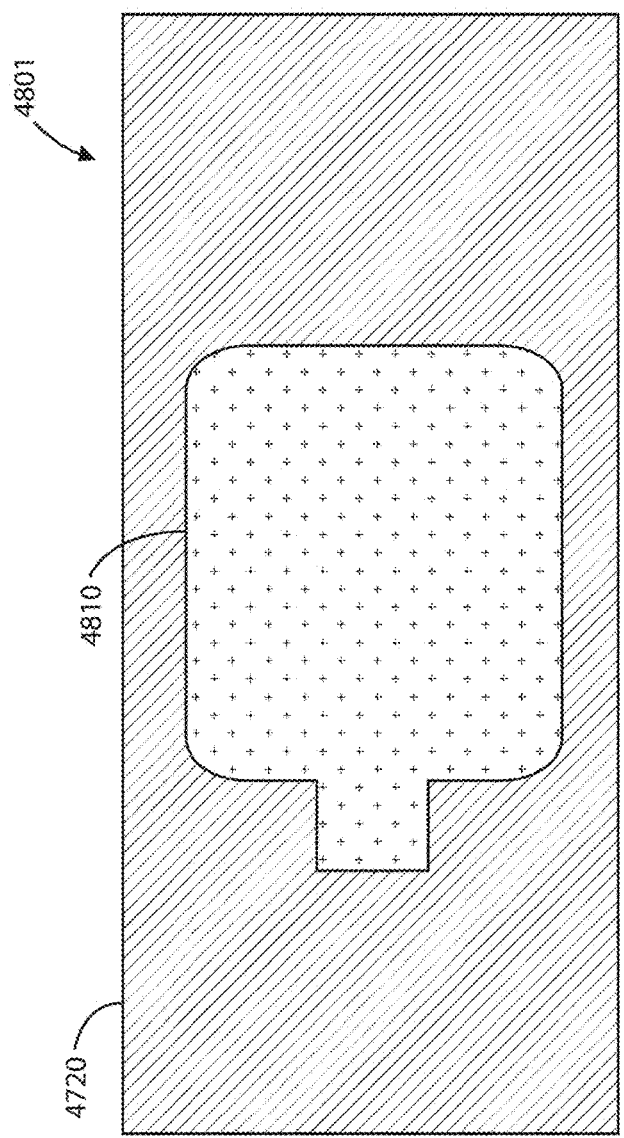
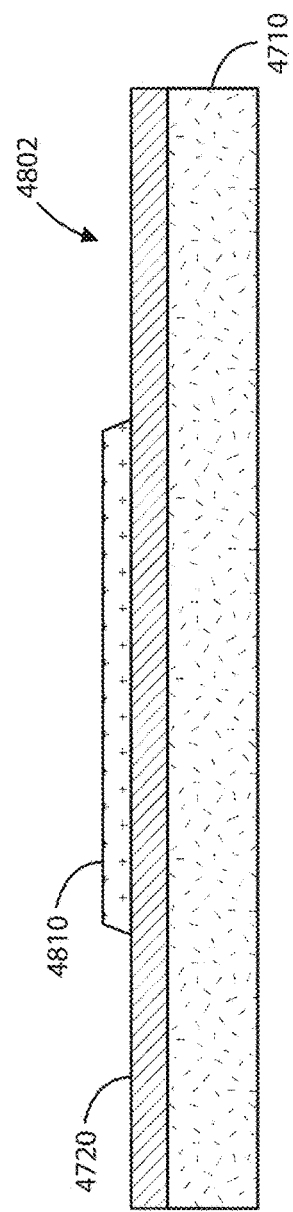
FIG. 48C
FIG. 48A
FIG. 48B

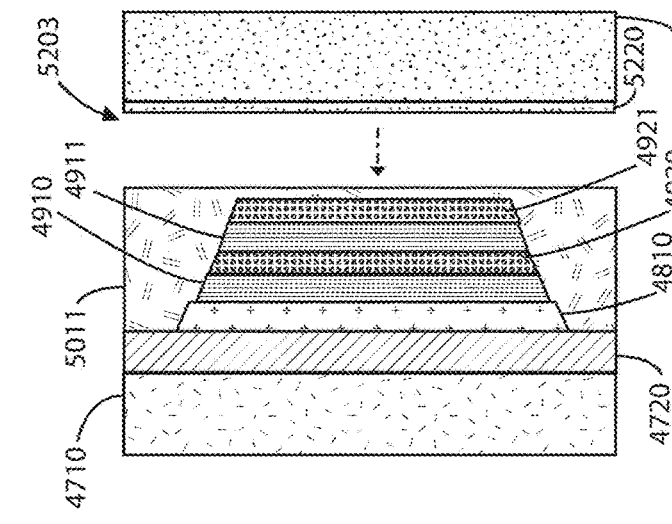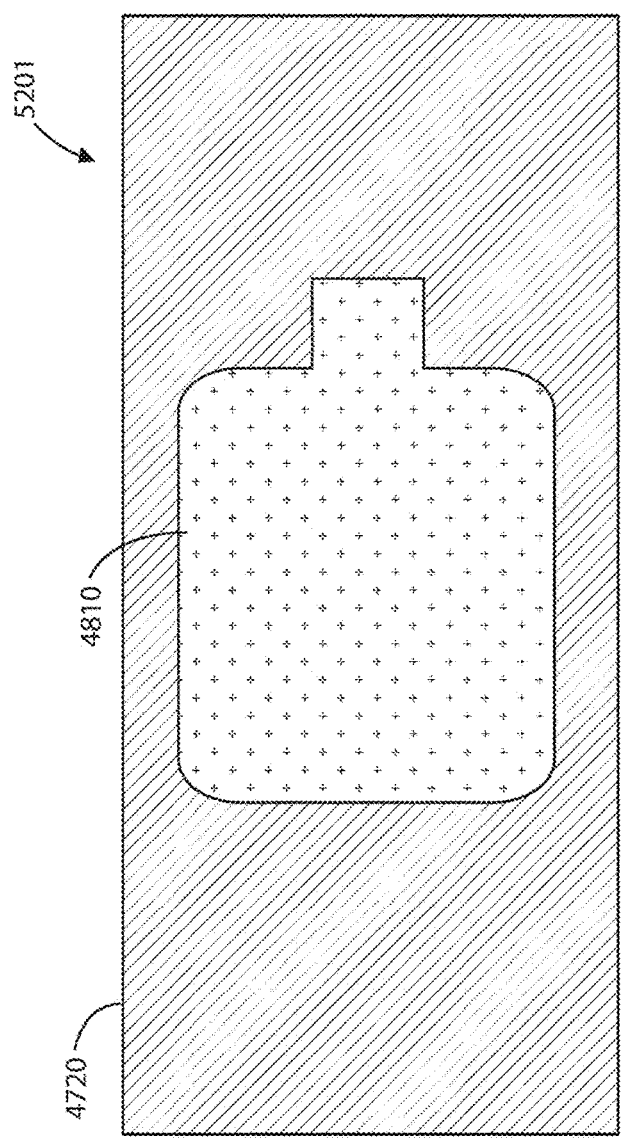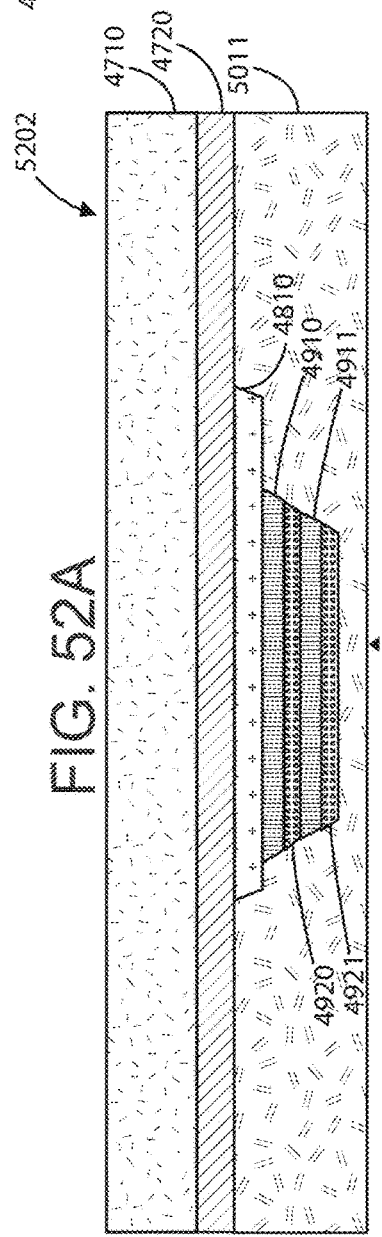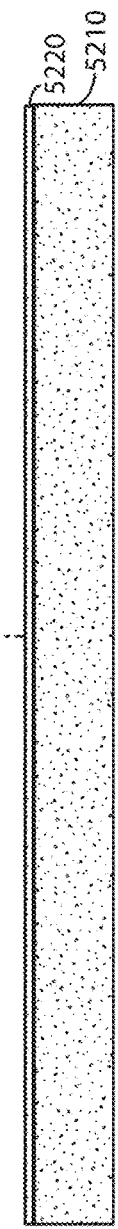

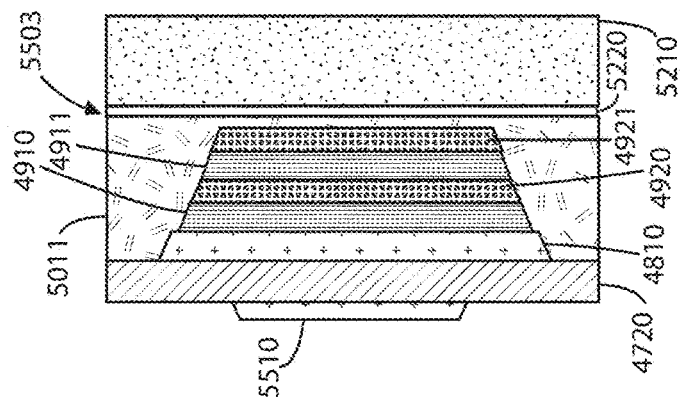
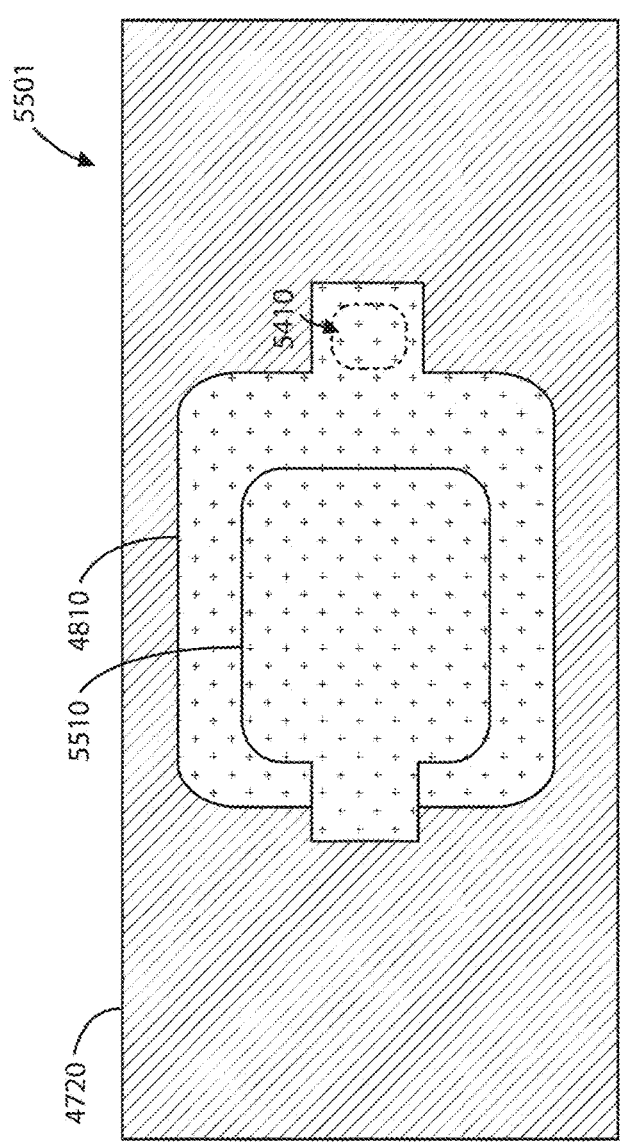
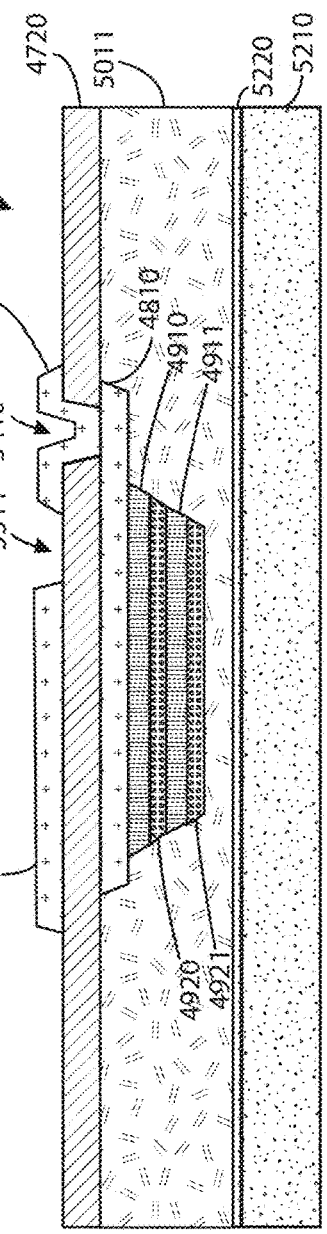

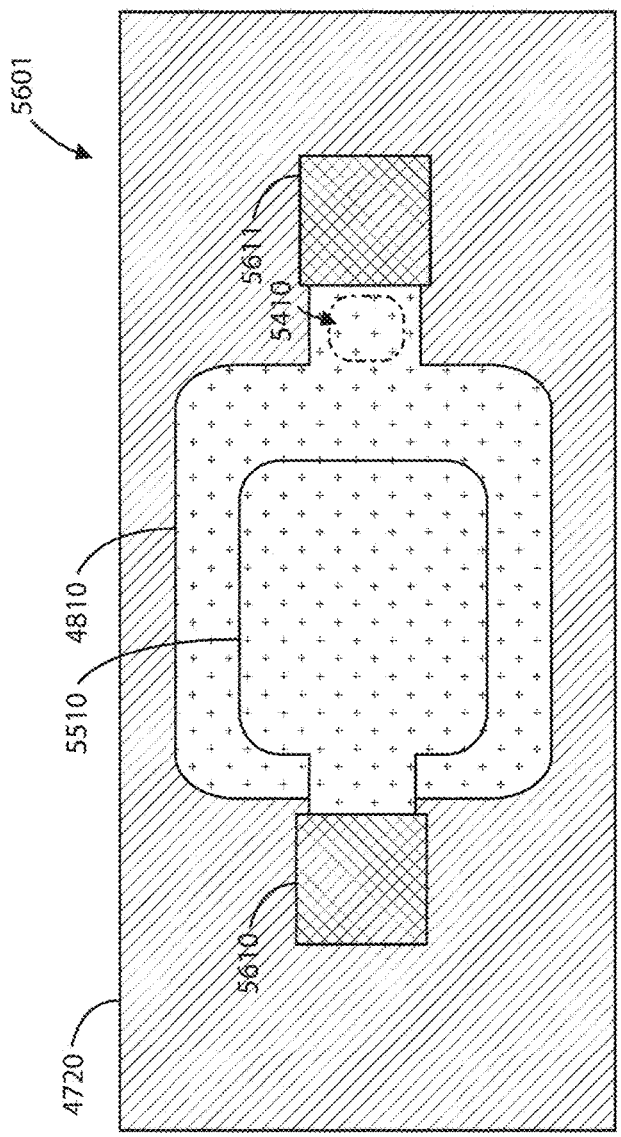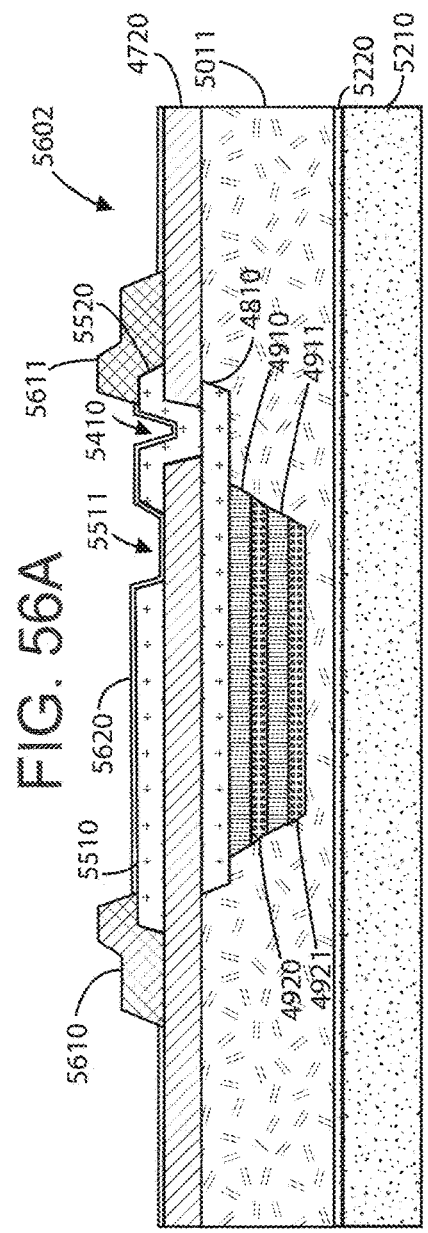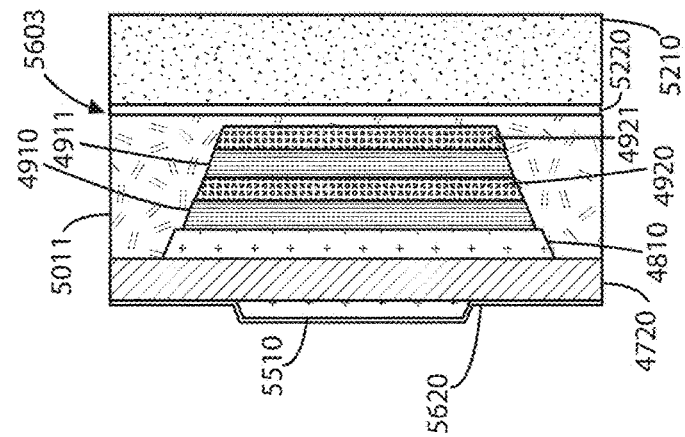

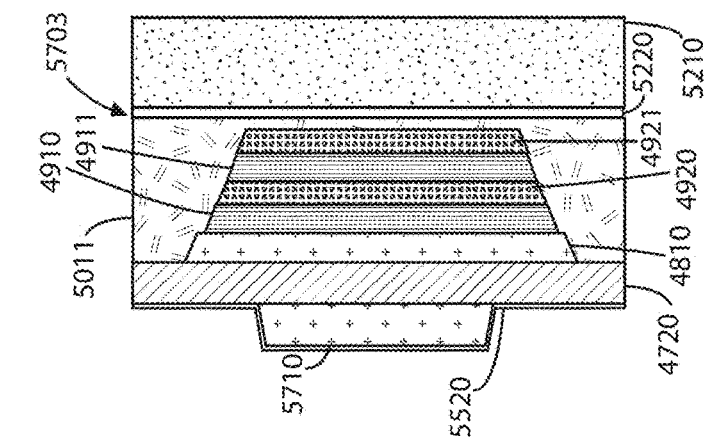
FIG. 57C
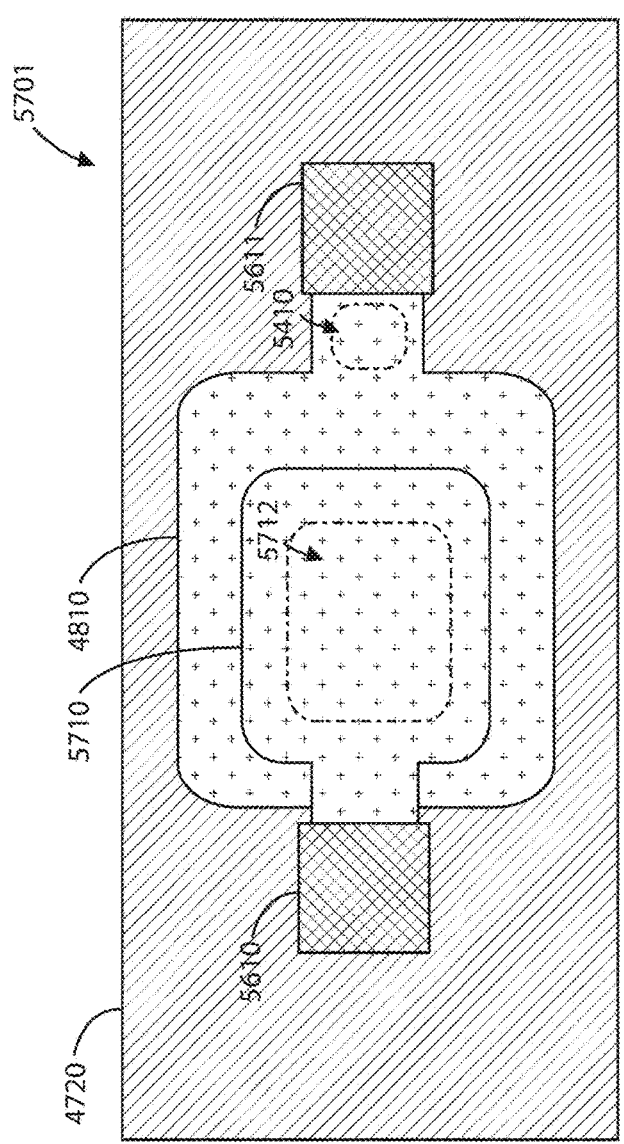
FIG. 57A
FIG. 57B

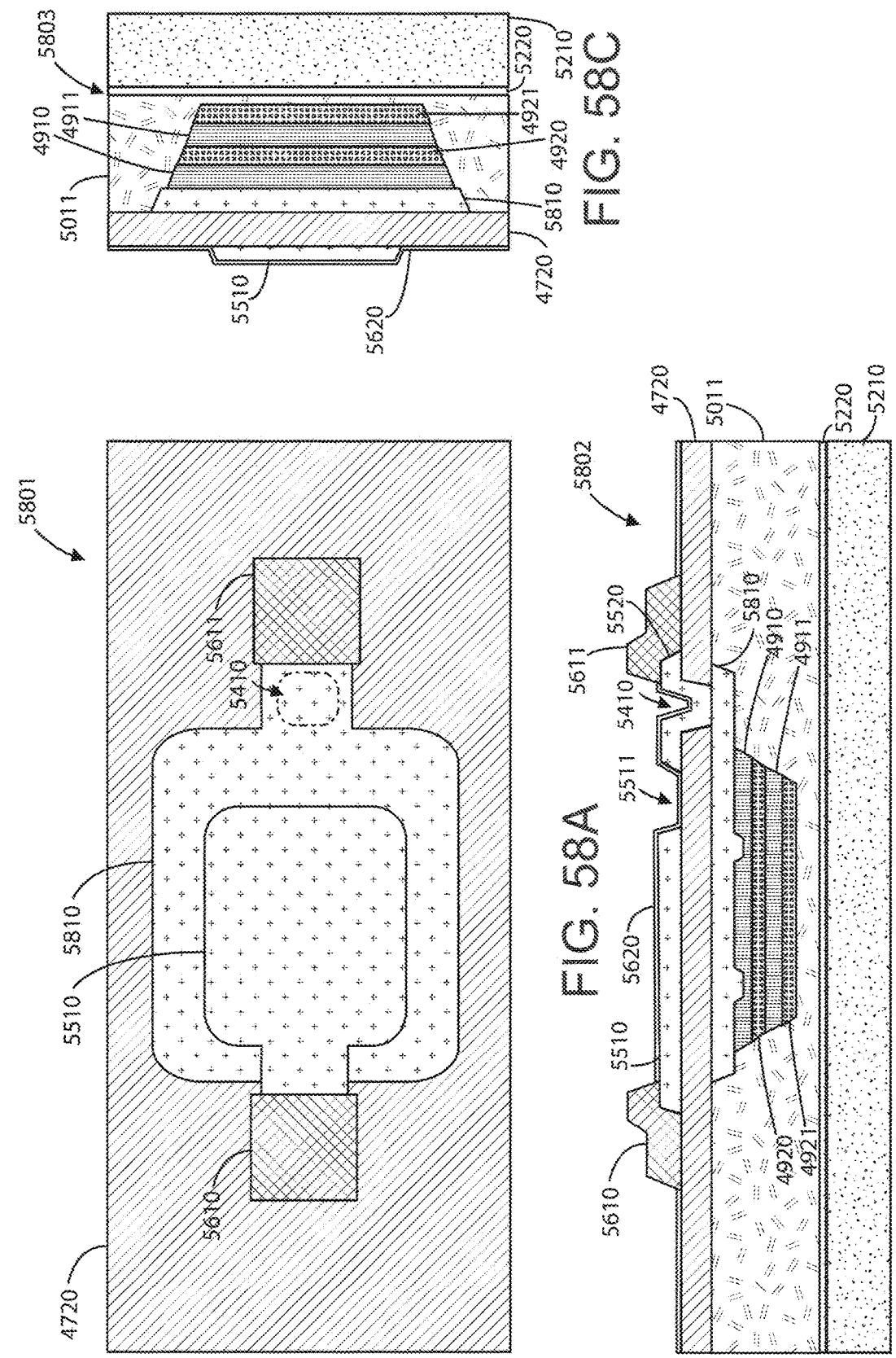

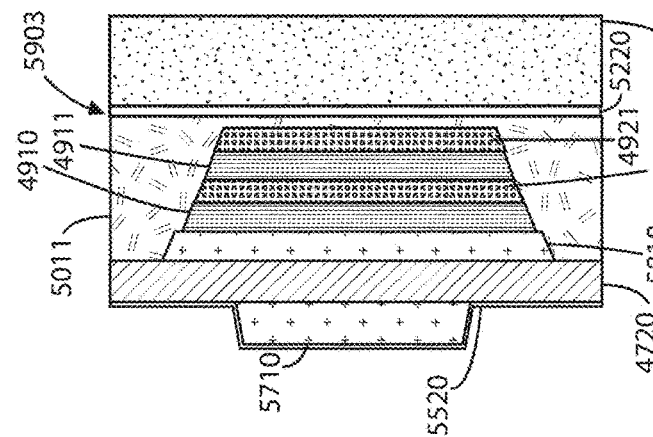
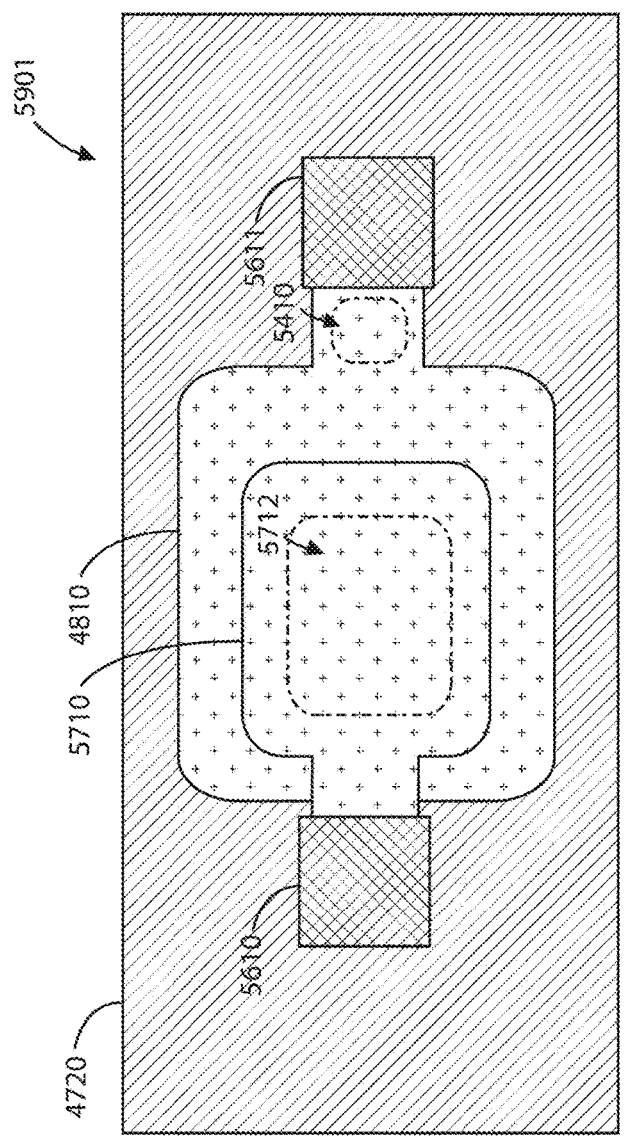
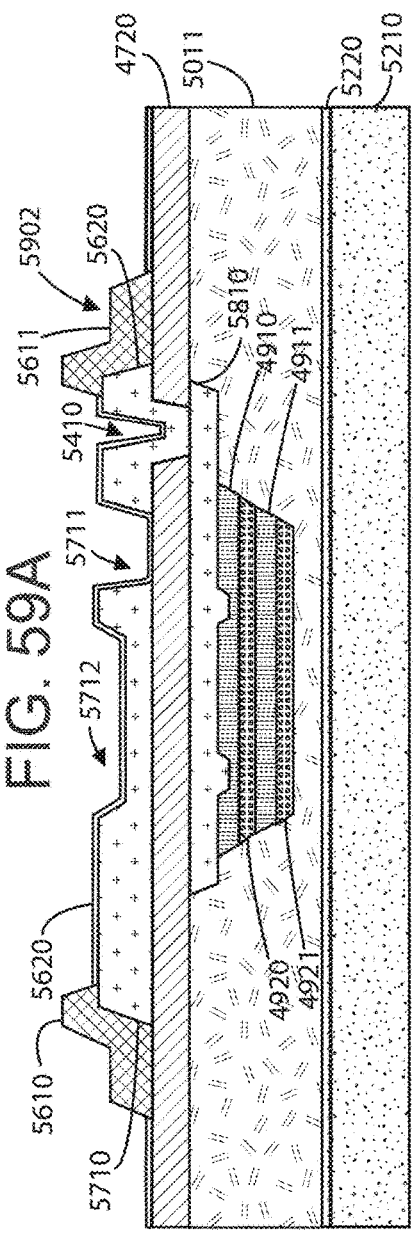
FIG. 59A
FIG. 59B
FIG. 59C

METHODS OF FORMING EPITAXIAL AlScN RESONATORS WITH SUPERLATTICE STRUCTURES INCLUDING AlGaN INTERLAYERS AND VARIED SCANDIUM CONCENTRATIONS FOR STRESS CONTROL AND RELATED STRUCTURES

CROSS-REFERENCED TO COMMONLY OWNED APPLICATIONS AND CLAIM FOR PRIORITY

The present application claims priority to U.S. Provisional Patent Application Ser. No. 63/216,049, titled "METHODS OF FORMING EPITAXIAL AlScN RESONATORS WITH SUPERLATTICE STRUCTURES INCLUDING AlGaN INTERLAYERS AND VARIED SCANDIUM CONCENTRATIONS FOR STRESS CONTROL AND RELATED STRUCTURES," filed in the U.S.P.T.O. on Jun. 29, 2021, the entire disclosure of which is incorporated herein by reference.

The present application also incorporates by reference, for all purposes, the following concurrently filed patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014 (now U.S. Pat. No. 9,673,384 issued Jun. 6, 2017), U.S. patent application Ser. No. 14/298,076, titled "ACOUSTIC RESONATOR DEVICE WITH SINGLE CRYSTAL PIEZO MATERIAL AND CAPACITOR ON A BULK SUBSTRATE", filed Jun. 6, 2014 (now U.S. Pat. No. 9,537,465 issued Jan. 3, 2017), U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 6, 2014 (now U.S. Pat. No. 9,571,061 issued Feb. 14, 2017), U.S. patent application Ser. No. 14/341,314, titled "WAFER SCALE PACKAGING", filed Jul. 25, 2014, U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014 (now U.S. Pat. No. 9,716,581 issued Jul. 25, 2017), and U.S. patent application Ser. No. 14/469,503, titled "MEMBRANE SUBSTRATE STRUCTURE FOR SINGLE CRYSTAL ACOUSTIC RESONATOR DEVICE", filed Aug. 26, 2014.

BACKGROUND

The present invention relates generally to semiconductor devices. More particularly, the present invention provides methods of forming piezoelectric films for use in, for example, acoustic wave resonator devices and RF devices etc.

SUMMARY

Embodiments according to the invention can provide methods of forming epitaxial AlScN resonators with superlattice structures including AlGaN interlayers and varied Scandium concentrations for stress control and related structures. Pursuant to these embodiments, a method of forming a resonator structure can be provided by forming one or more template layers on a substrate, (a) epitaxially forming an AlScN layer on the template layer to a first thickness, (b) epitaxially forming an AlGaN interlayer on the AlScN layer to a second thickness that is substantially less than the first thickness, and repeating operations (a) and (b) until a total thickness of all AlScN layers and AlGaN interlayers provides a target thickness for a single crystal AlScN/AlGaN superlattice resonator structure on the template layer.

BRIEF DESCRIPTION OF THE DRAWINGS

FIGS. 4D and 4E are simplified diagrams illustrating an alternative method for conducting the method step of forming a topside micro-trench as described in FIG. 4A.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIGS. 59A-59C are simplified diagrams illustrating various cross-sectional views of a single crystal acoustic resonator device and of method steps for a solidly mounted transfer process for single crystal acoustic resonator devices according to an example of the present invention.

DETAILED DESCRIPTION OF EMBODIMENTS ACCORDING TO THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

As appreciated by the present inventors, in some embodiments according to the invention, a superlattice of AlScN layers and relatively thin AlGaN interlayers can be formed via epitaxial growth (such as CVD. MOCVD, MBE, etc.) to produce a resonator layer having increased smoothness, which can improve the resonator performance. For example, the AlScN layers and relatively thin AlGaN interlayers can be formed to have relative thicknesses of about 10:1 (i.e., the AlScN/AlGaN ratio). Accordingly, the resonator can be provided by forming the superlattice structure with alternating layers of AlScN and AlGaN, where the thickness of the AlScN layer can be about ten times thicker than the thickness of the AlGaN interlayers.

As further appreciated by the present inventors, in some embodiments according to the invention, the tensile stress exhibited by some epi-grown a resonator layers can be reduced by increasing the Sc composition in the AlScN layer as the growth proceeds thereby reducing the likelihood of such resonator layers developing cracks.

Figure 60:
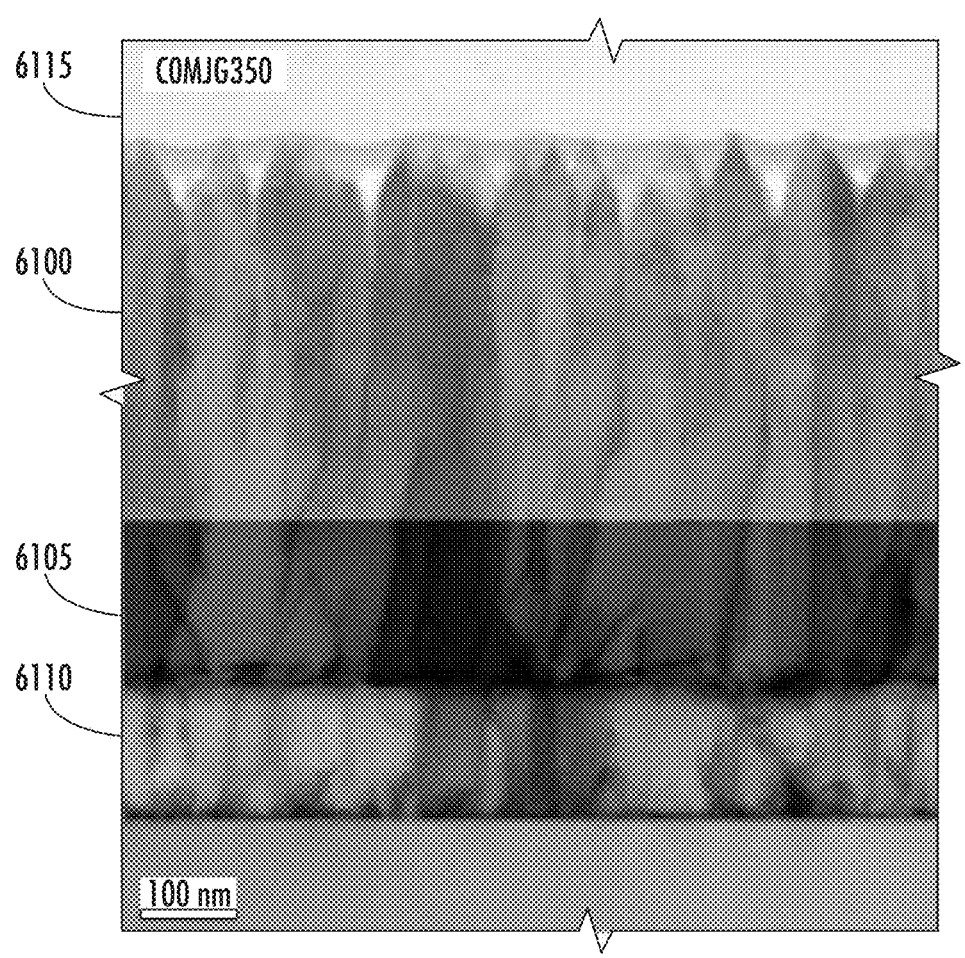
FIG. 60 is a cross-sectional TEM of an AlScN layer formed on an AlGaN template grown on an AlN layer showing the development of 3D morphology.

As appreciated by the present inventors, growing AlScN to some thicknesses (e.g., >40 nm) by MOCVD can result in the roughening of the surface and may eventually evolve into a 3D morphology which may affect the operation of the resulting resonator. For example, FIG. 60 shows a cross-sectional TEM of an AlScN film 6100 formed on an AlGaN template 6105 grown on an AlN layer 6110 showing the development of 3D morphology 6115. As appreciated by the present inventors, this result can stem from excess Sc accumulating on the film's surface as, for example, similar effects have been observed by the present inventors with indium adatoms in the growth of InGaN.

Figure 61:
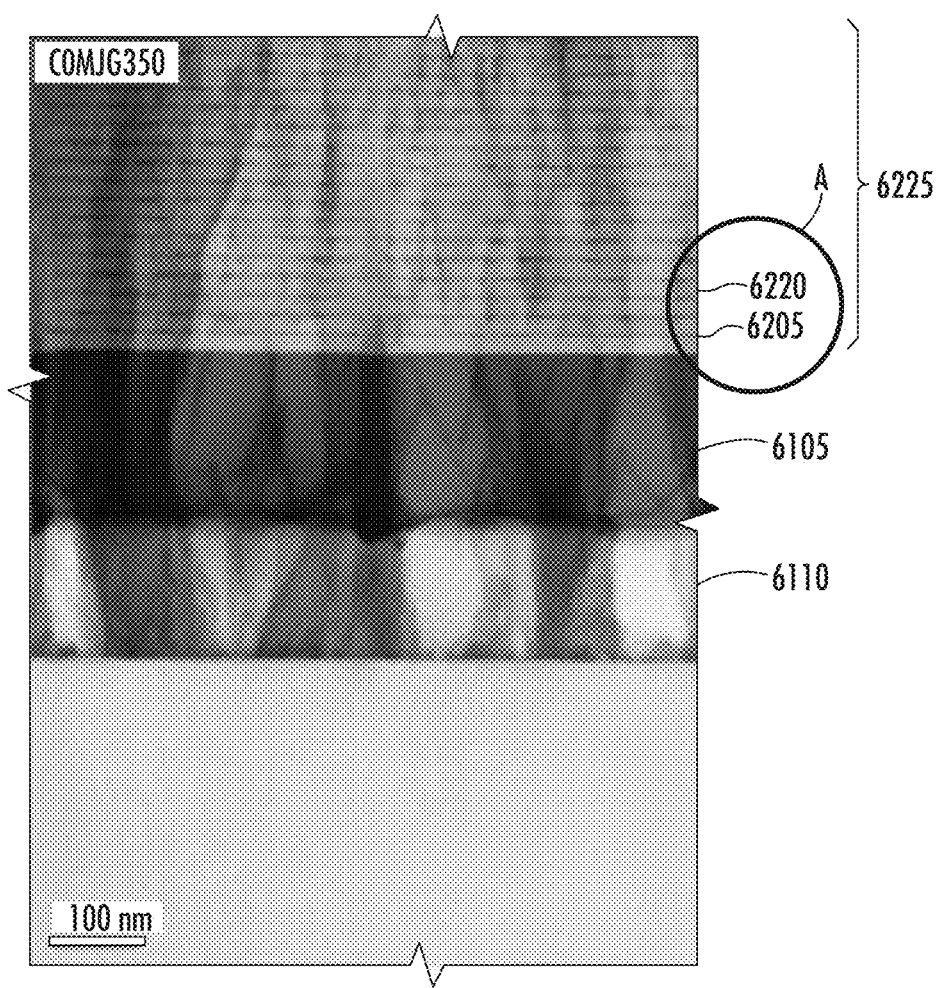
FIG. 61 is a cross-sectional TEM of a AlScN/AlGaN superlattice structure including AlGaN interlayers interspersed between AlScN layers in some embodiments according to the invention.

To mitigate the effect of the accumulation of the Sc described above, the present inventors disclose that in some embodiments according to the invention, thin AlGaN interlayers can be formed between layers (i.e., as interlayers) of the AlScN to form a superlattice (of AlGaN/AlScN) as a single crystal resonator structure, which may consume the excess surface Sc and thereby keep the film surface smooth. For example, in contrast to FIG. 60, FIG. 61 shows a cross-sectional TEM of a AlScN/AlGaN superlattice structure 6225 including AlGaN interlayers 6205 (represented as darker lines) interspersed between the lighter AlScN layers 6220.

In some embodiments according to the invention, the AlScN layers 6220 and the AlGaN interlayers 6205 can be formed via epitaxial growth (such as CVD. MOCVD, MBE, etc.) to have relative thicknesses of about 10:1 (i.e., the AlScN/AlGaN ratio). Accordingly, the resonator can be provided by forming the superlattice structure 6225 with alternating layers of an AlScN layer 6220 and an AlGaN interlayer 6205, where the thickness of the AlScN layers 6220 is about ten times thicker than the thickness of the AlGaN interlayers 6205. For example, in some embodiments according to the invention, the thickness of each of the AlScN layers 6220 can be about 20 nm whereas the AlGaN interlayers 6205 can be about 2 nm thick. Other thicknesses may also be used and the thicknesses of each of the AlScN layers 6220 and the AlGaN interlayers 6205 in a particular superlattice structure 6225 may vary. In some embodiments according to the invention, the ratio of the thicknesses of the AlScN layers 6220 and the AlGaN interlayers 6205 in a particular superlattice structure 6225 can vary depending on the choice of substrate and underlying template, as may the Ga content of the AlGaN. In some embodiments according to the invention, the Sc concentration in the AlScN layers 6220 can be in a range between about 15% and about 35%.

In some embodiments according to the present invention, the Ga content of the AlGaN interlayers 6205 can be matched to the content of the Ga in the underlying AlGaN template 6105 on which the superlattice structure 6225 is formed. In some embodiments according to the invention, the AlGaN template 6105 and the AlGaN interlayers 6205 can each be $Al_{0.2}Ga_{0.8}N$. In some embodiments according to the invention, some of the AlGaN interlayers 6205 can have different concentrations of Ga than the AlGaN template 6105. For example, in some embodiments according to the invention, the AlGaN interlayers 6205 can be $Al_{0.2}Ga_{0.8}N$, whereas the AlGaN template 6105 can be $Al_{0.1}Ga_{0.9}N$ or GaN. In some embodiments according to the invention, the reaction chamber in which the alternating layers of the AlScN and AlGaN are epitaxially grown can be maintained at about 875° C. In some embodiments according to the invention, the reaction chamber in which the alternating layers of the AlScN and AlGaN are epitaxially grown can be maintained in a temperature range between about 800 and about 950° C.

Figure 62:
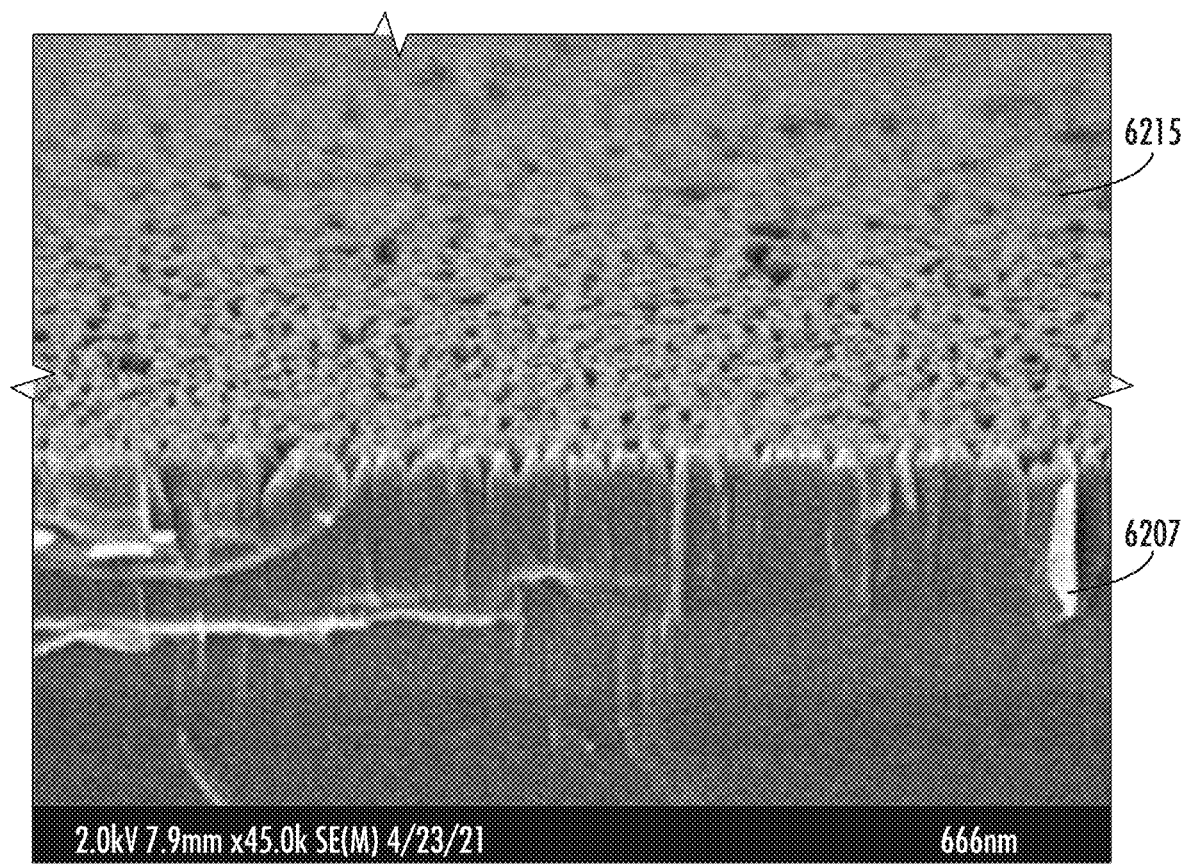
FIG. 62 is an SEM image showing a surface and cleaved cross-section of an AlScN layer grown on an AlGaN template without the interlayers.
Figure 63:
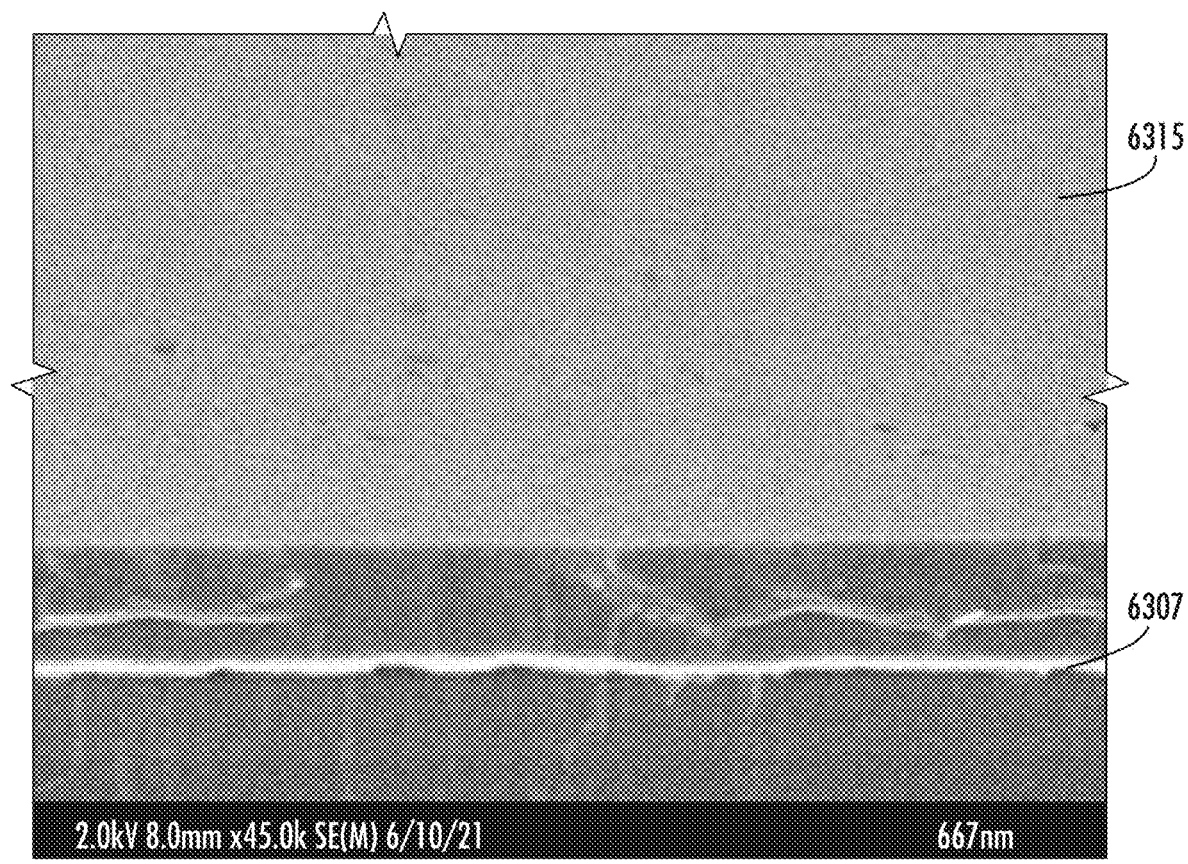
FIG. 63 is an SEM image showing the surface and the cleaved cross-section an AlScN film grown with AlGaN interlayers on an AlGaN template in some embodiments according to the invention.

FIG. 62 is an SEM image showing a surface 6215 and cleaved cross-section 6207 of an AlScN film grown on an AlGaN template without the interlayers described herein, whereas FIG. 63 is an SEM image showing a surface 6315 and a cleaved cross-section. 6307 an AlScN film grown with AlGaN interlayers (i.e., on the AlGaN template in accordance with embodiments of the present invention. As shown by FIG. 63, the roughness of the surface 6315 of the AlGaN superlattice structure is reduced compared to the surface 6215 shown in FIG. 62, which may provide improved resonator operation in some embodiments according to the invention.

As further appreciated by the present inventors, another difficulty with the epitaxial growth of AlScN results from the nature of the stress of the film. In particular, a wurtzite material with a larger α-lattice constant than that of the material it is being deposited on will be under compressive stress. For example, when AlScN is formed on AlGaN, the AlScN will be under compressive stress). However, as the thickness of the AlScN material increases, in-situ curvature measurements have shown that the AlScN film can develop a tensile stress, which can present problems for certain processes, such as that described in commonly owned U.S. Pat. No. 10,355,659, the disclosure of which is incorporated herein by reference.

Figure 64:
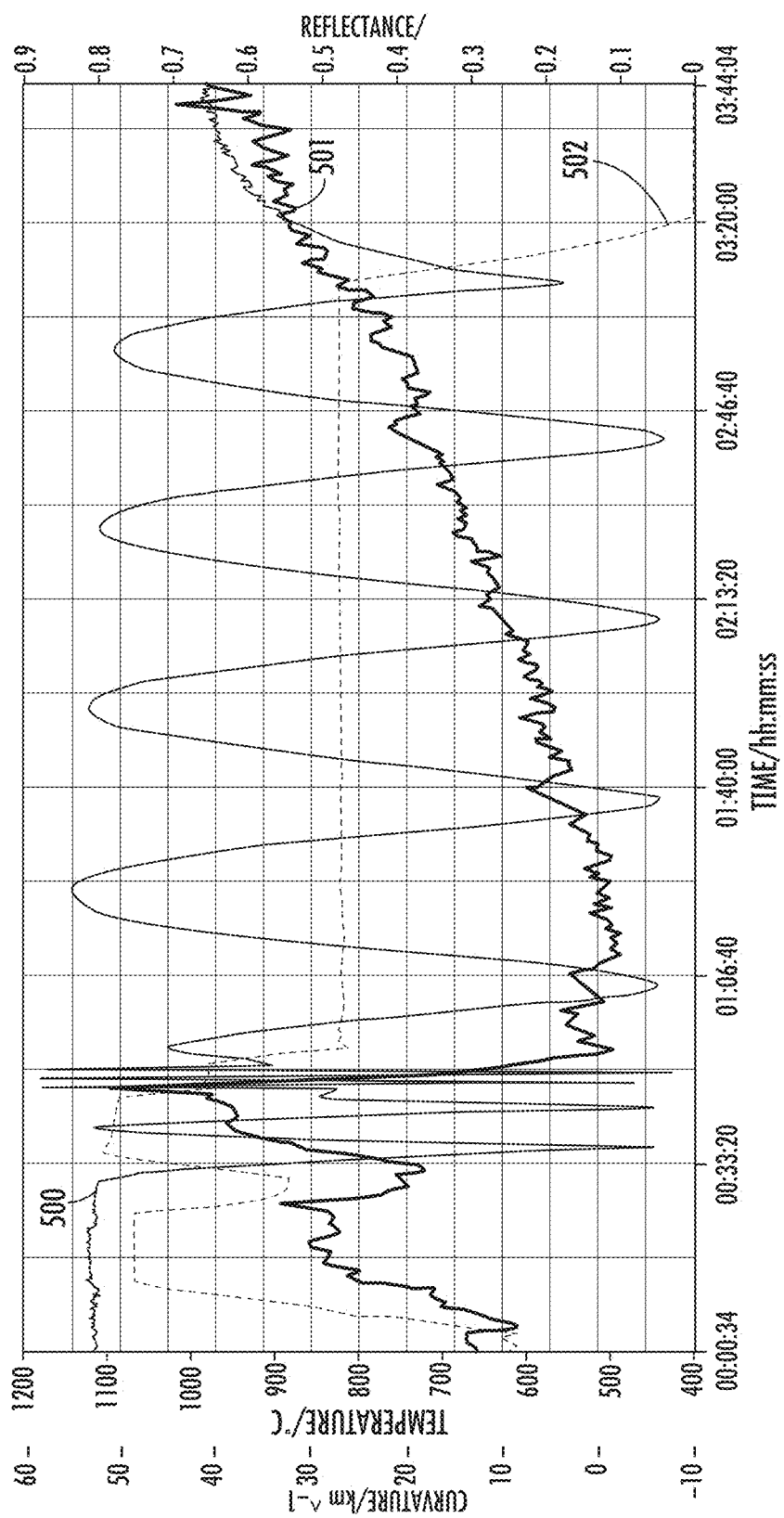
FIG. 64 is a graph showing in-situ reflectance, wafer curvature and temperature of an AlScN growth run with uniform Sc content in AlScN layers and AlGaN interlayers as the superlattice on an AlGaN template.

For example, FIG. 64 is a graph showing in-situ reflectance 6500, wafer curvature 6501 and temperature 6502 of an AlScN growth run with uniform Sc content in the AlScN layers and AlGaN interlayers as the superlattice 6225 on an AlGaN template. FIG. 64 shows a steady rise in wafer curvature beginning at around time 1:20:00 indicating the film stress becomes increasingly tensile as the growth of the superlattice proceeds.

As further appreciated by the present inventors, however, the increase in tensile stress described above can be reduced by increasing the Sc composition in the AlScN layers of the superlattice 6225 as the growth proceeds in some embodiments according to the invention. For example, in some embodiments according to the invention, the growth of the superlattice 6225 can be partitioned into three discrete stages. In the first stage, the AlScN layers are formed as $Al_{0.8}Sc_{0.15}N$. In the second stage, the AlScN layers are formed (on the first stage layers) as $Al_{0.82}Sc_{0.18}N$. In the last stage (e.g., the top AlScN layers) the AlScN layers are formed (on the second stage layers) as $Al_{0.79}Sc_{0.21}N$. Accordingly, each stage can include AlScN layers with increasing concentrations of Sc whereas the AlGaN interlayers included in each of the stages can have a concentration of Ga of about 20%. It will be understood that fewer or more stages of the AlScN layers may be used in some embodiments according to the invention. In some embodiments according to the invention, the final stage (either in addition to the stages described above or an alternative stage) can be formed as $Al_{0.65}Sc_{0.35}N$.

In some embodiments according to the invention, the Sc concentration can be increased by decreasing the flow of the Al precursor (such as TMA1). In some embodiments according to the invention, the Sc concentration can be increased by increasing the flow of the Sc precursor. In some embodiments according to the invention, the flow of the Sc precursor and the Al precursor may both be adjusted.

Figure 65:
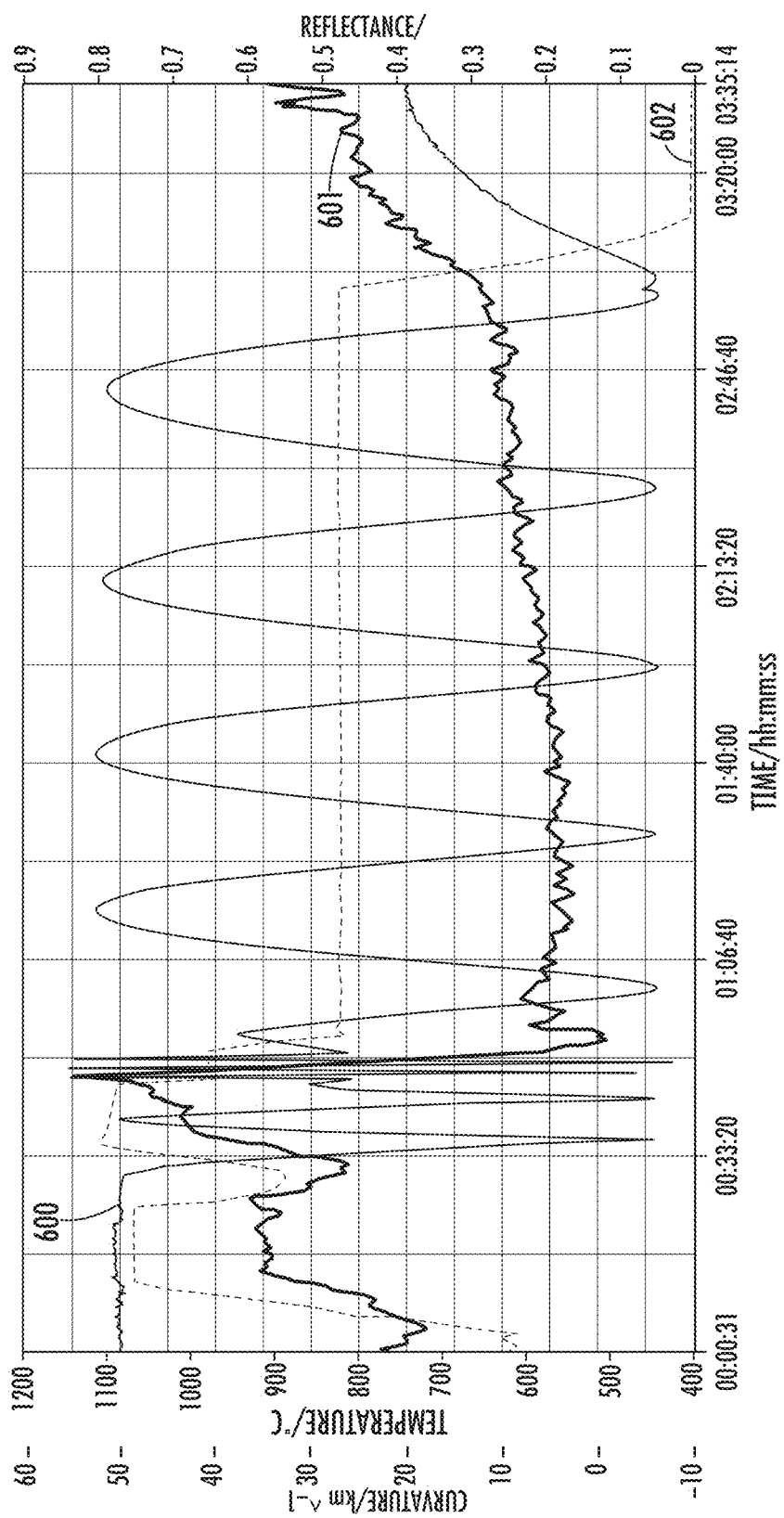
FIG. 65 is a graph showing in-situ reflectance, wafer curvature and temperature of an AlScN growth run at 875 degrees Centigrade with progressively increasing the Sc composition in 3 stages of AlScN layers on an AlGaN template in some embodiments according to the invention.

FIG. 65 is a graph showing in-situ reflectance 6505, wafer curvature 6503 and temperature 6504 of an AlScN growth run at 875 degrees Centigrade with progressively increasing the Sc composition in the AlScN layers using the 3 stages of layers as described above. As shown in FIG. 65, the curvature 6505 has a reduced slope (relative to the slope of curvature 6501) indicating significantly less tensile stress in the superlattice 6225. As further shown in FIG. 65, the stress can increase when the temperature is reduced after epitaxial growth is complete, which is related to the different thermal expansion coefficients of the Si substrate and the III-nitride films and is typical across all growths of this type.

In some embodiments according to the invention, the flow of one or both of the group-III precursors can be continuously ramped when forming the AlScN layer, which may also delay the onset of the film stress shifting towards tensile. In some embodiments according to the invention, the Sc concentration can be adjusted by decreasing the flow of the Al precursor (such as TMA1). In some embodiments according to the invention, the Sc concentration can be adjusted by increasing the flow of the Sc precursor. In some embodiments these increases or decreases in metalorganic flow can be linear. In other embodiments such changes can take the form of a nonlinear function, with a larger rate of changes closer to the start of AlScN growth.

In other embodiments, the tensile stress described above can be reduced by forming an AlScN layer by increasing the Sc composition as the growth on the template proceeds. For example, in some embodiments according to the invention, the growth of the AlScN layer begin as $Al_{0.85}Sc_{0.15}N$, which can be increased as the growth proceeds to a final concentration, such as $Al_{0.79}Sc_{0.21}N$ or $Al_{0.65}Sc_{0.35}N$.

Figure 66:
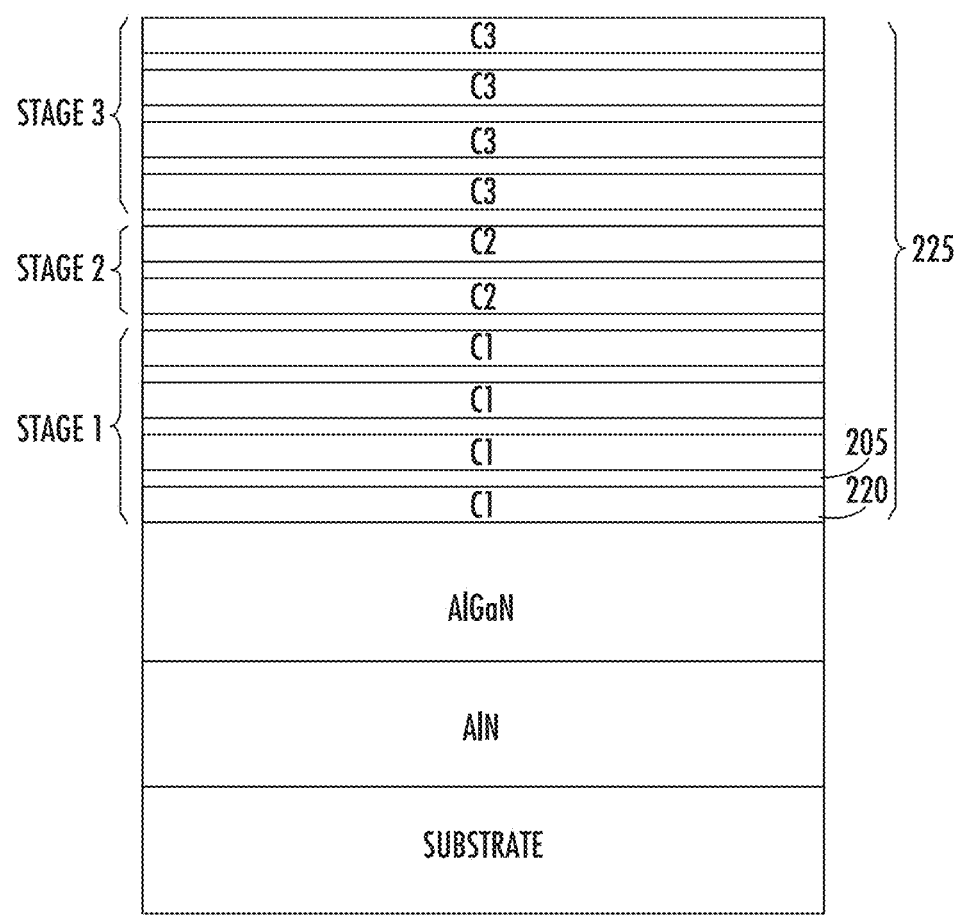
FIG. 66 is a schematic illustration of an AlScN/AlGaN superlattice structure including three stages with AlScN layers having increasing concentrations of Sc in some embodiments according to the invention.

FIG. 66 is a schematic illustration of an AlScN/AlGaN superlattice structure including three stages 1-3 with AlScN layers having increasing concentrations of Sc in some embodiments according to the invention. According to FIG. 66, the AlScN/AlGaN superlattice structure 6225 includes three stages 1-3 each including a plurality of alternating AlScN layers 6220 and AlGaN interlayers 6205. In particular, stage 1 includes AlScN layers 6220 having a Sc concentration C1, stage 2 includes AlScN layers 6220 having a Sc concentration C2, and stage 3 includes AlScN layers 6220 having a Sc concentration C3, where C1<C2<C3 in some embodiments according to the invention.

Figure 67:
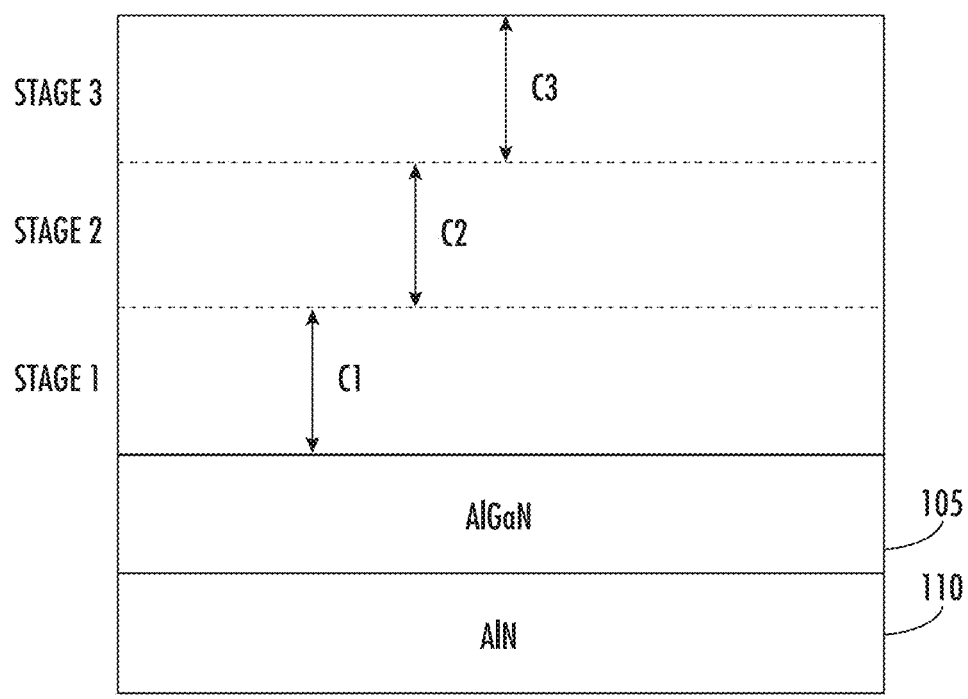
FIG. 67 is a schematic illustration of an AlScN layer including three stages having increasing concentrations of Sc in some embodiments according to the invention.

FIG. 67 is a schematic illustration of an AlScN layer including three stages 1-3 having increasing concentrations of Sc in some embodiments according to the invention. According to FIG. 67, stage 1 of the AlScN layer includes a Sc concentration C1, stage 2 of the AlScN layer includes a Sc concentration C2, and stage 3 of the AlScN layer includes a Sc concentration C3, where C1<C2<C3 in some embodiments according to the invention.

Figure 68:
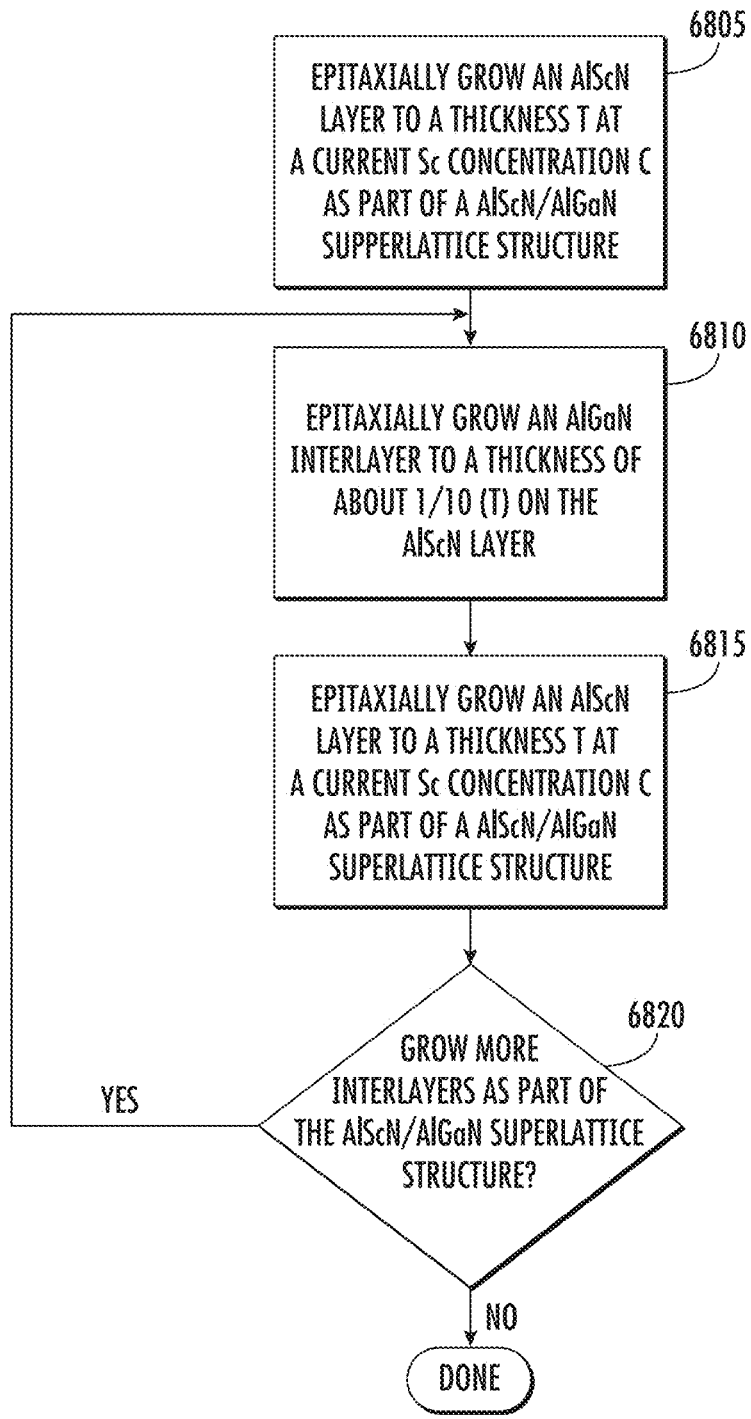
FIG. 68 is a flowchart illustrating methods of forming an AlScN/AlGaN superlattice structure, as illustrated for example in FIG. 61, in some embodiments according to the invention.

FIG. 68 is a flowchart illustrating methods of forming an AlScN/AlGaN superlattice structure 225, as illustrated for example in FIG. 61, in some embodiments according to the invention. According to FIG. 68, an AlScN layer is epi-grown to a thickness T to have a Sc concentration of C as part of the AlScN/AlGaN superlattice structure 6225 (Block 6805). An AlGaN interlayer layer is epi-grown to a thickness of about $\frac{1}{10}$(T) on the AlScN layer as part of the AlScN/AlGaN superlattice structure 225 (Block 6810). Another AlScN layer is epi-grown to a thickness T to have a Sc concentration of C on the previously formed AlGaN interlayer layer as part of the AlScN/AlGaN superlattice structure 225 (Block 6815). If additional AlGaN interlayers are to be grown as part of the AlScN/AlGaN superlattice structure 225 (Block 6820) operations continue at Block 6810 until all AlGaN interlayers have been formed.

It will be understood that the epi-growth in FIG. 68 can be carried out in a temperature range between about 800 degrees Centigrade and about 950 degrees Centigrade. The epi-growth can be carried out using a metalorganic Sc precursor at a flow rate range between about 500 sccm and about 3000 sccm.

Figure 69:
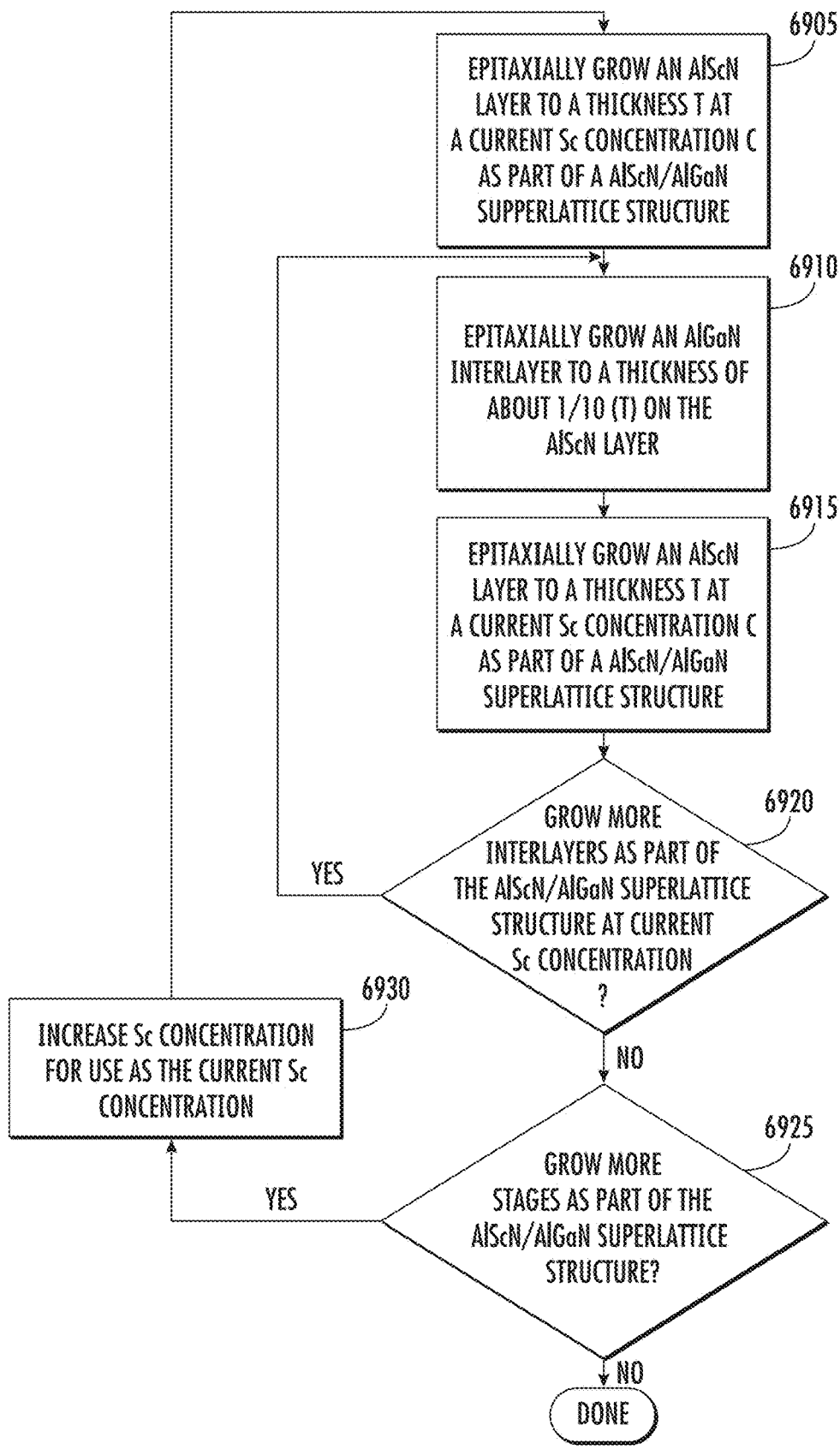
FIG. 69 is a flowchart illustrating methods of forming an AlScN/AlGaN superlattice structure including stages with AlScN layers having increasing concentrations of Sc, as illustrated for example in FIG. 66, in some embodiments according to the invention.

FIG. 69 is a flowchart illustrating methods of forming an AlScN/AlGaN superlattice structure including stages with AlScN layers having increasing concentrations of Sc, as illustrated for example in FIG. 66, in some embodiments according to the invention. According to FIG. 69, an AlScN layer is epi-grown to a thickness T to have a Sc concentration of C as part of the AlScN/AlGaN superlattice structure 6225 (Block 6905). An AlGaN interlayer layer is epi-grown to a thickness of about $\frac{1}{10}$(T) on the AlScN layer as part of the AlScN/AlGaN superlattice structure 6225 (Block 6910). Another AlScN layer is epi-grown to a thickness T to have a Sc concentration of C on the previously formed AlGaN interlayer layer as part of the AlScN/AlGaN superlattice structure 6225 (Block 6915). If additional AlGaN interlayers are to be grown as part of the current stage of the AlScN/AlGaN superlattice structure 6225 (Block 6920) operations continue at Block 6910 until all AlGaN interlayers for the current stage have been formed (block 6920).

If no additional AlGaN interlayers are to be grown as part of the current stage of the AlScN/AlGaN superlattice structure 6225 (Block 6920) the current stage of the AlScN/AlGaN superlattice structure 6225 is complete and operations continue at Block 6925. If more stages of the AlScN/AlGaN superlattice structure 6225 are to be formed (block 6925), the Sc concentration for the AlGaN layers in the next stage is increased (block 6930) and operations continue at Block 6905 until all AlGaN interlayers of all stages of the AlScN/AlGaN superlattice structure 6225 have been formed.

It will be understood that the epi-growth in FIG. 69 can be carried out in a temperature range between about 800 degrees Centigrade and about 950 degrees Centigrade. The epi-growth can be carried out using a metalorganic Sc precursor at a flow rate range between about 500 sccm and about 3000 sccm. In some embodiments according to the invention. the Sc concentrations can be in a range between about 15% and about 35% (i.e., in a range between $Al_{0.85}Sc_{0.15}N$, and $Al_{0.79}Sc_{0.35}N$).

Figure 70:
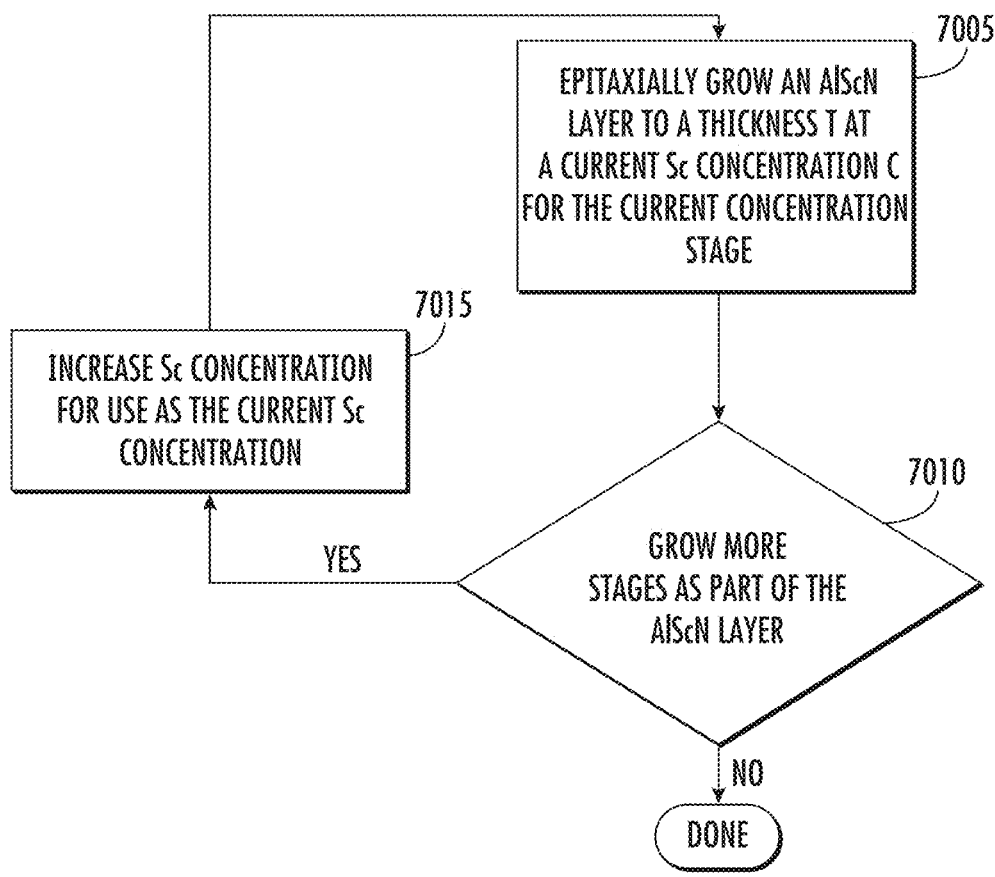
FIG. 70 is a flowchart illustrating methods of forming an AlScN layer including three stages having increasing concentrations of Sc, as illustrated for example in FIG. 67, in some embodiments according to the invention.

FIG. 70 is a flowchart illustrating methods of forming an AlScN layer including three stages having increasing concentrations of Sc, as illustrated for example in FIG. 67, in some embodiments according to the invention, According to FIG. 70, an AlScN layer is epi-grown to a thickness T to have a Sc concentration of C as part of AlScN layer (Block 7005). If no additional AlScN layers are to be grown as part of the current stage of the AlScN layer (Block 7010) the current stage of the AlScN layer is complete. If more stages of the AlScN layer are to be formed (block 7010), the Sc concentration for the AlScN layers in the next stage is increased (block 7115) and operations continue at Block 7005 until all AlScN layers of all stages of the have been formed. It will be understood that the epi-growth in FIG. 70 can be carried out in a temperature range between about 800 degrees Centigrade and about 950 degrees Centigrade. The epi-growth can be carried out using a metalorganic Sc precursor at a flow rate range between about 500 sccm and about 3000 sccm. The Sc concentrations can be in a range between about 15% and about 35%.

It will be understood that embodiments according to the invention can include both the aspect the AlScN/AlGaN superlattice structure to improve the surface smoothness and the aspect of the variation in the concentration of Sc and about to manage the stress developed in the resonator structure.

In still other embodiments according to the invention, the aspects described above may be used separately. For example, the AlScN/AlGaN superlattice structure can be formed without substantially changing the concentration of Sc. In some embodiments according to the invention, an AlScN resonator layer can be formed to have a increasing concentration of Sc but without the AlGaN interlayers. For example, in such embodiments the AlScN resonator layer can include the three stages with the respective increasing Sc concentrations, but the stages may not include the AlGaN interlayers. In still further embodiments, some of the stages included in the AlScN resonator layer can include the AlGaN interlayers whereas other stages may not include the AlGaN interlayers. In still further embodiments according to the invention, the inclusion of the AlGaN interlayers may alternate within the AlScN/AlGaN superlattice structure such that every other one of the stages is free of AlGaN interlayers.

It will be understood that the resonator layers or films described hereinafter and shown in FIGS. 1-59C can be provided by the AlScN/AlGaN superlattice structure or the AlScN layer with increasing Sc concentration in some embodiments according to the invention as shown or described, for example, in FIGS. 61, 63, 65, and 66-70.

Figure 1A:
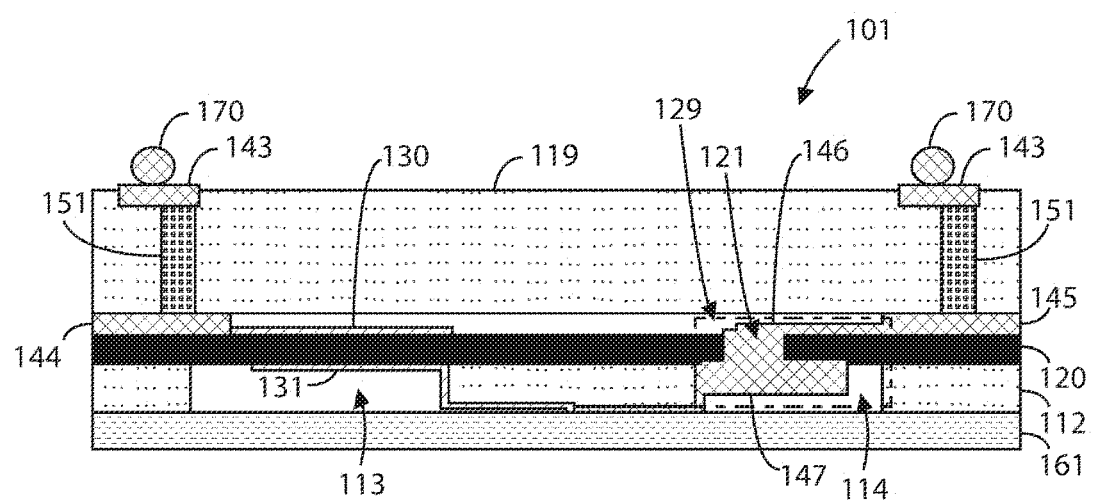
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
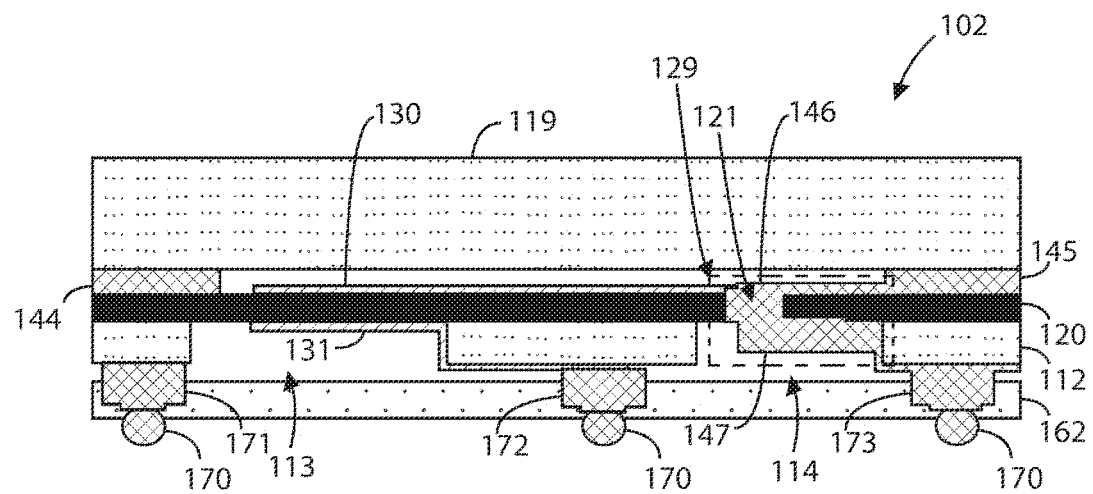
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
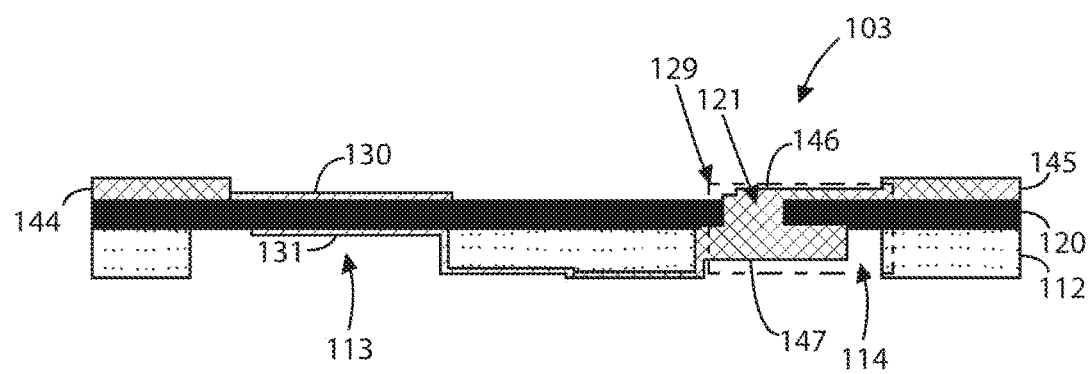
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
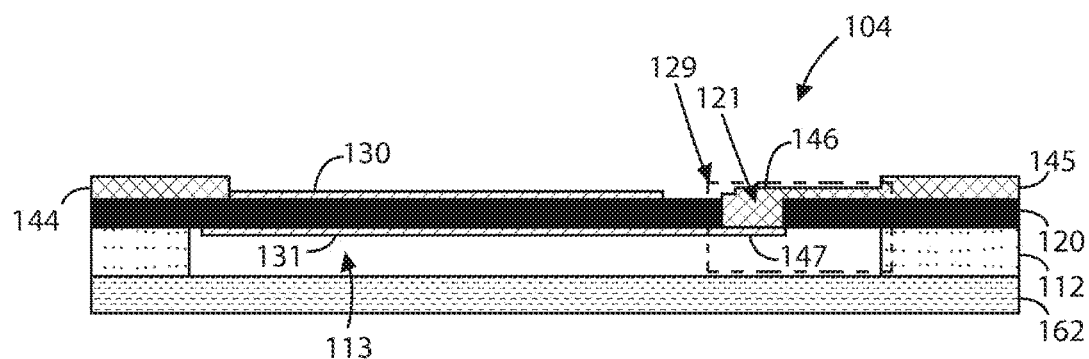
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
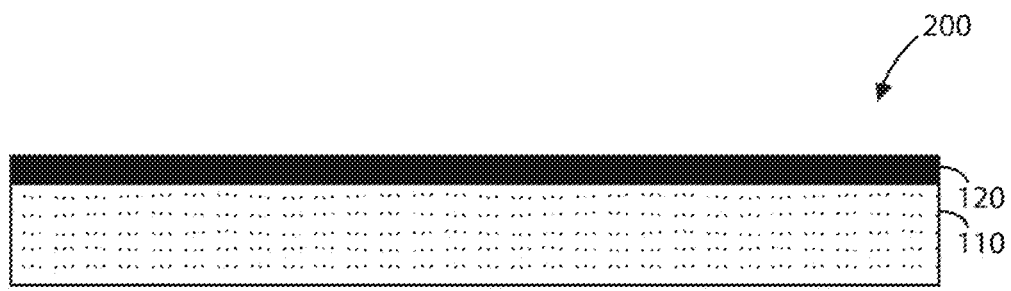
FIGS. 2 and 3 are simplified diagrams illustrating steps for a method of manufacture for an acoustic resonator device according to an example of the present invention.
Figure 3:
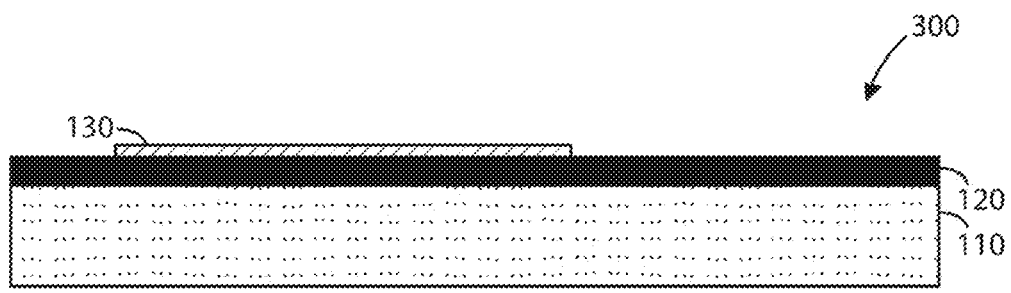

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
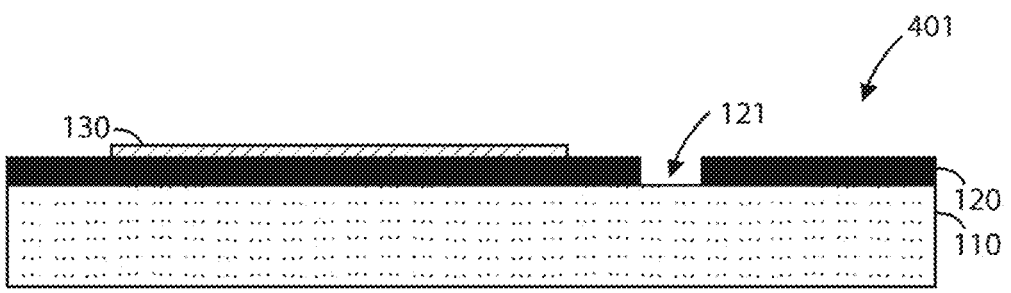
FIG. 4A is a simplified diagram illustrating a step for a method creating a topside micro-trench according to an example of the present invention.
Figure 4B:
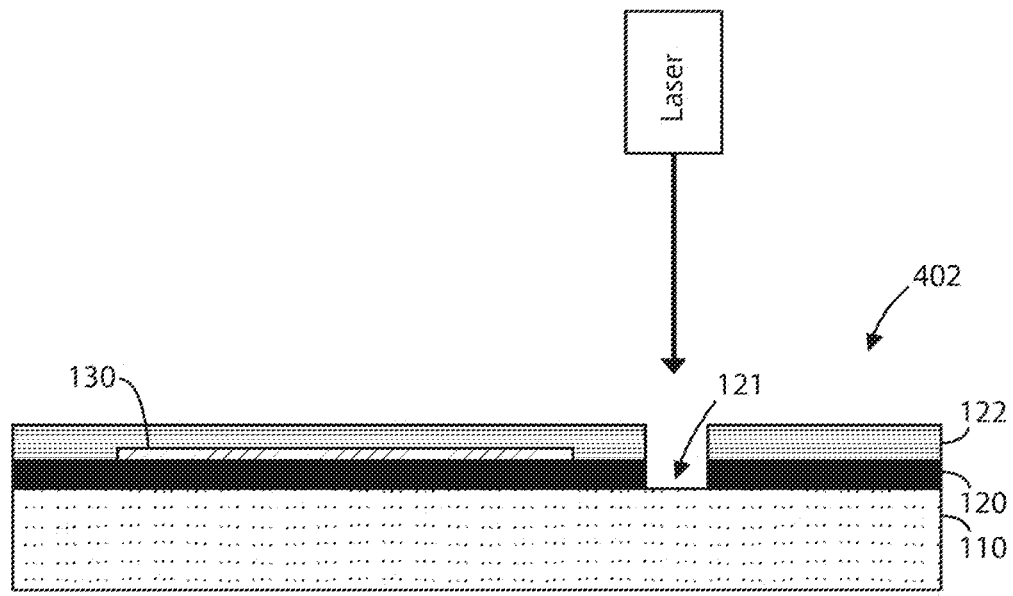
FIGS. 4B and 4C are simplified diagrams illustrating alternative methods for conducting the method step of forming a topside micro-trench as described in FIG. 4A.
Figure 4C:
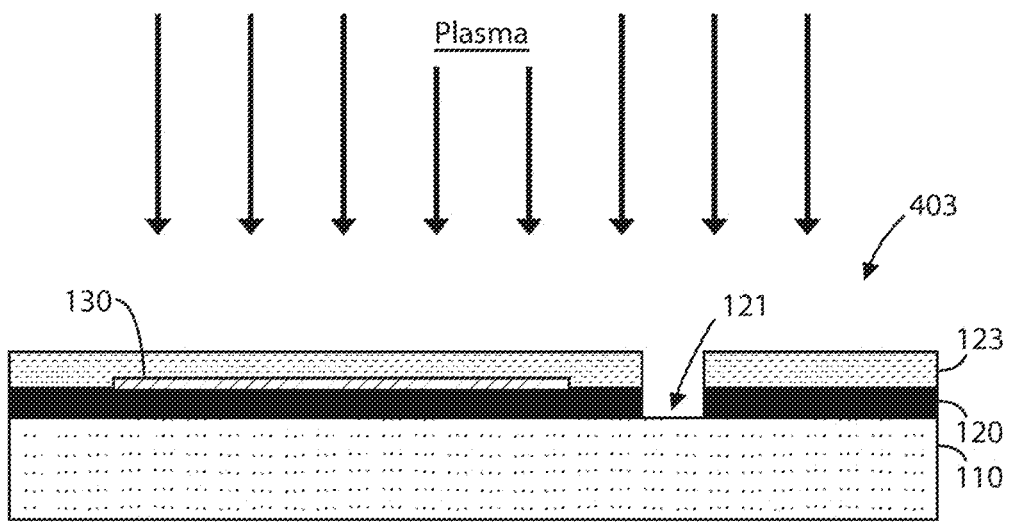

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
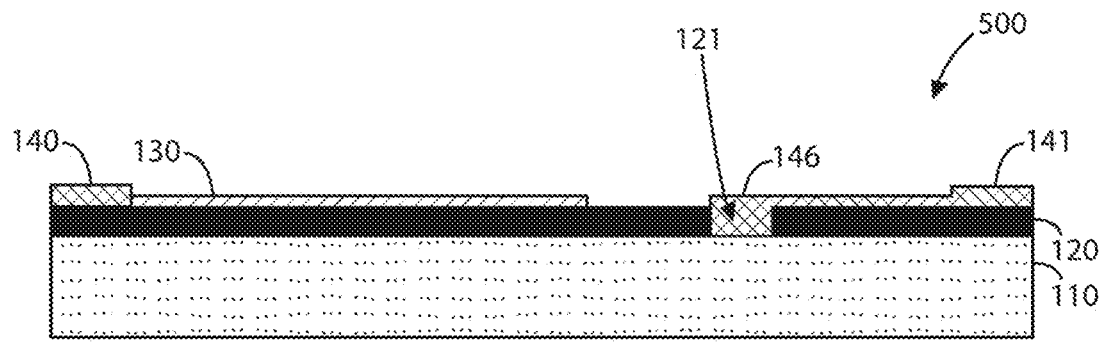
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
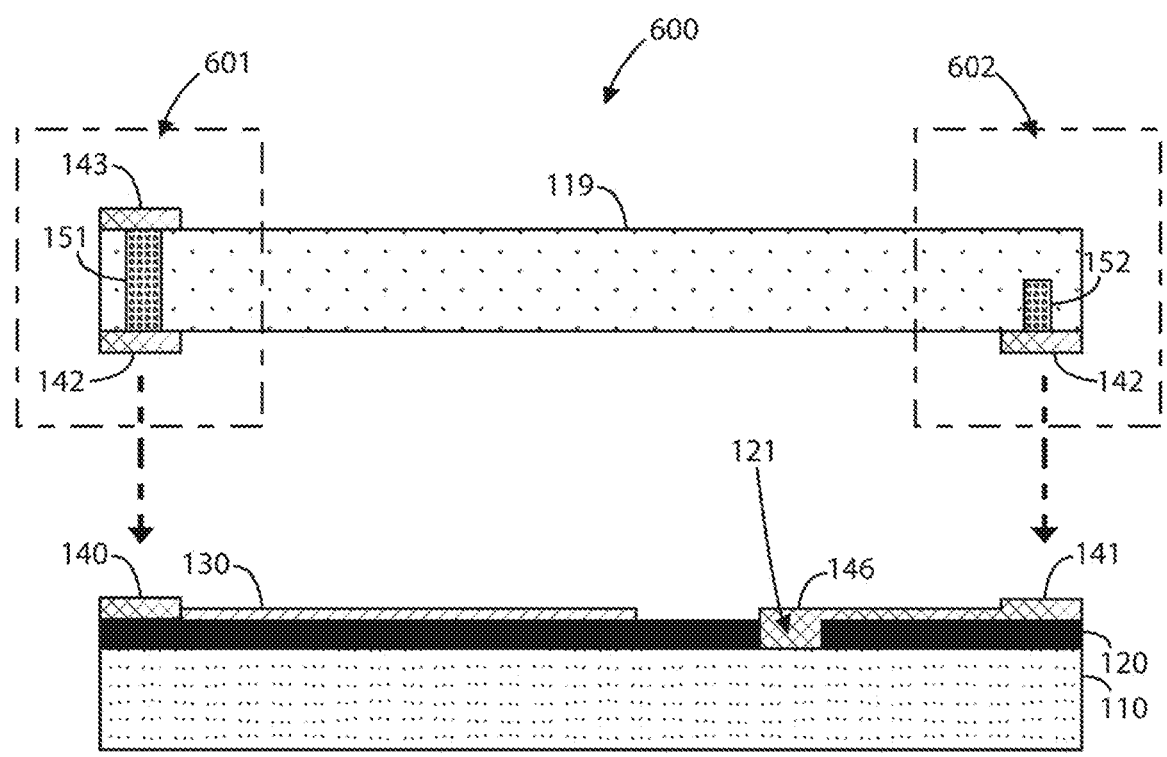

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
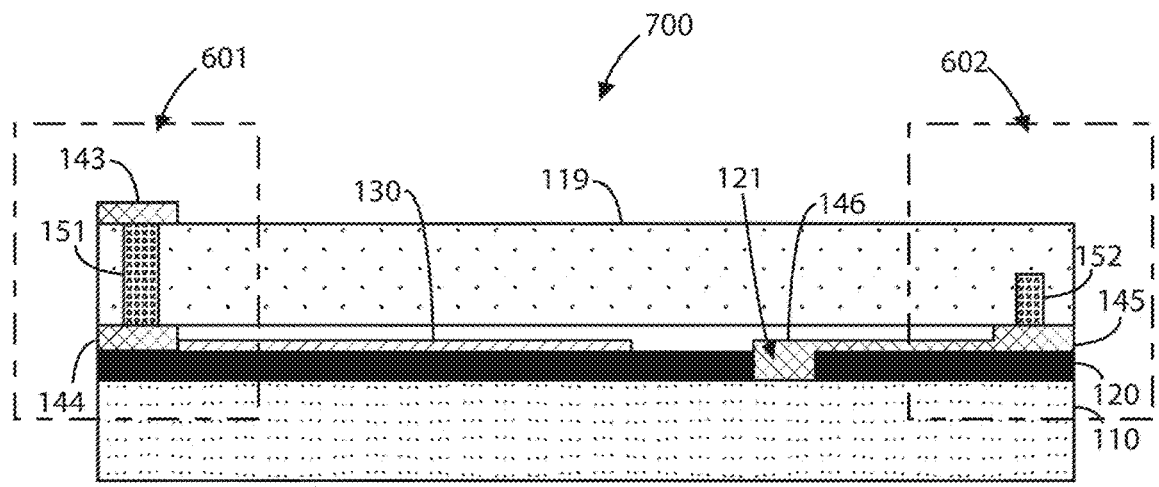
Figure 8:
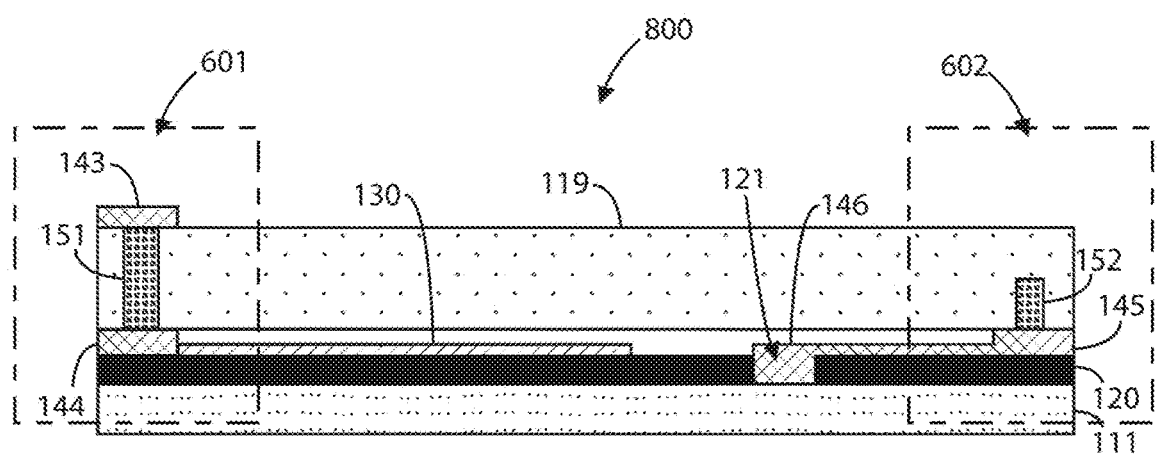

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
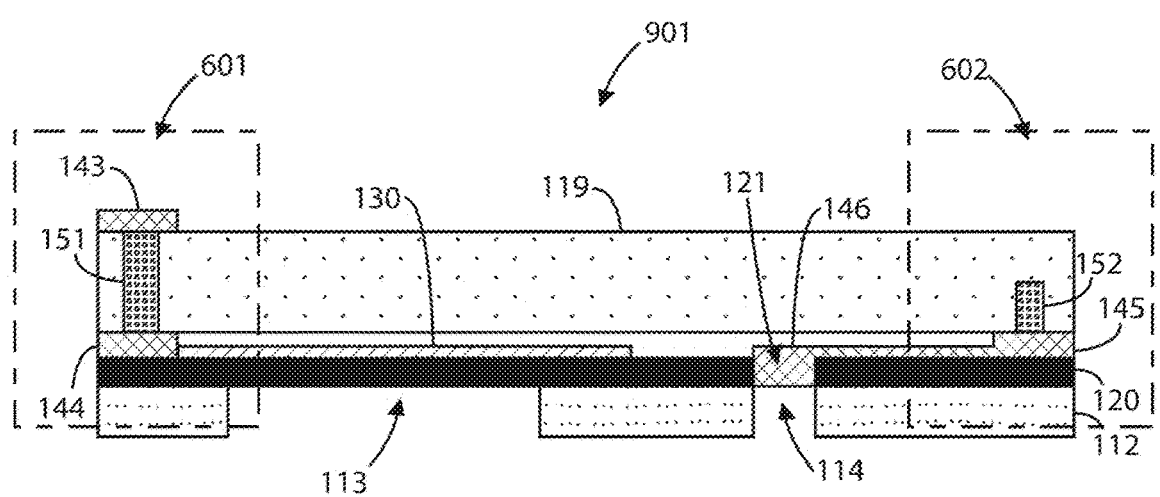
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
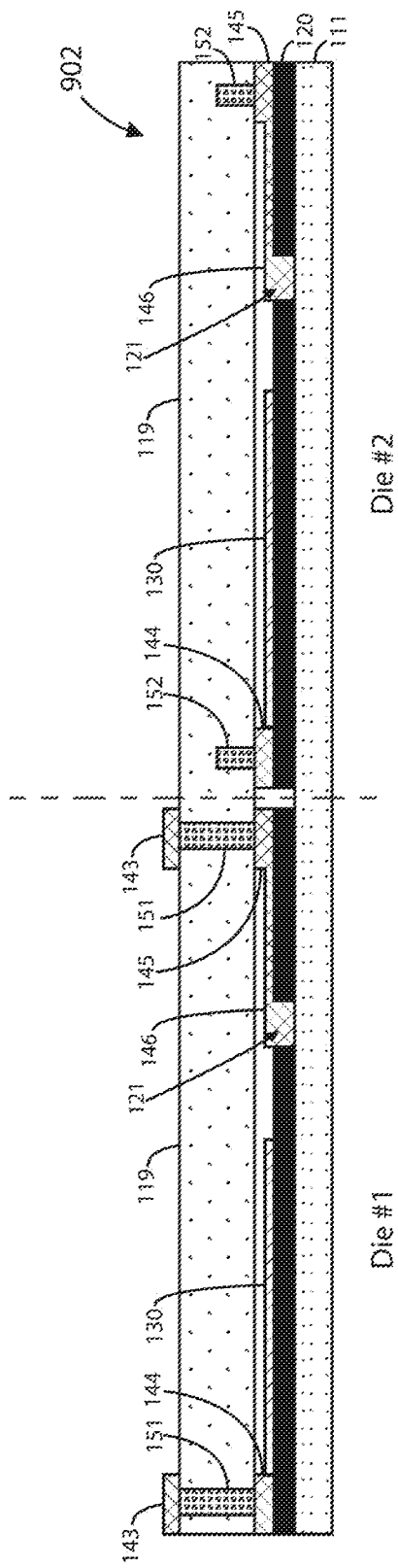
FIGS. 9B and 9C are simplified diagrams illustrating an alternative method for conducting the method step of forming backside trenches, as described in FIG. 9A, and simultaneously singulating a seed substrate according to an embodiment of the present invention.
Figure 9C:
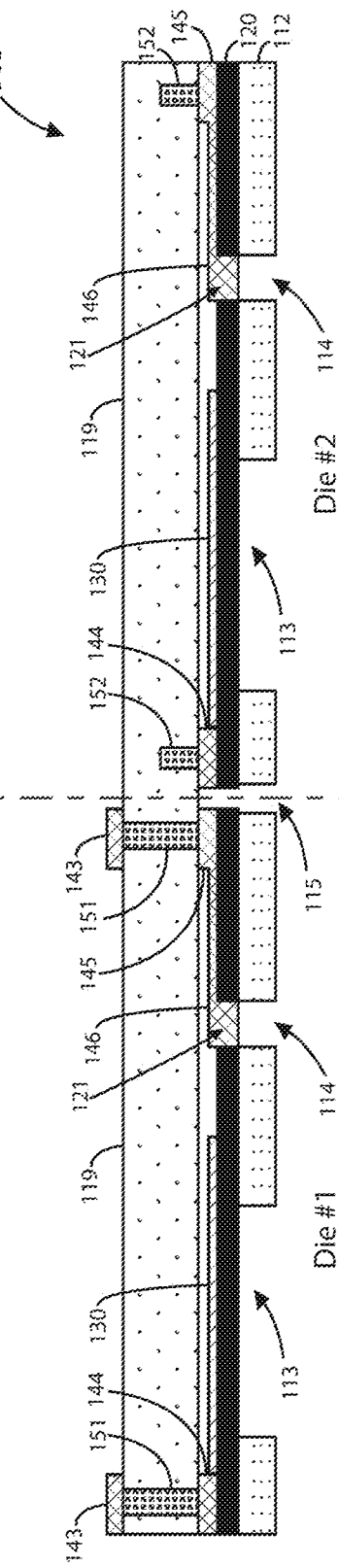

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
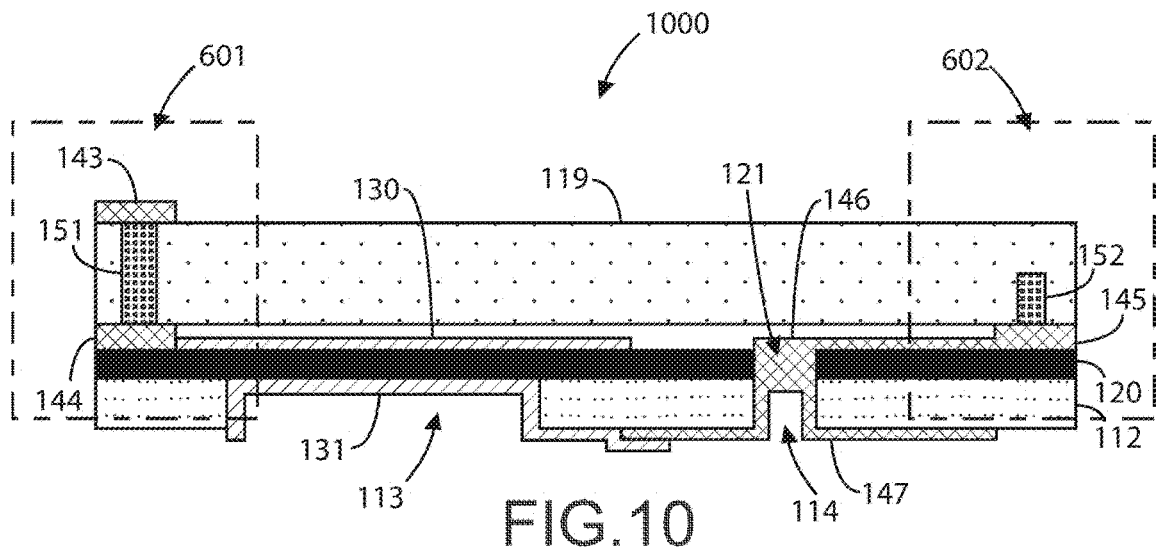
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
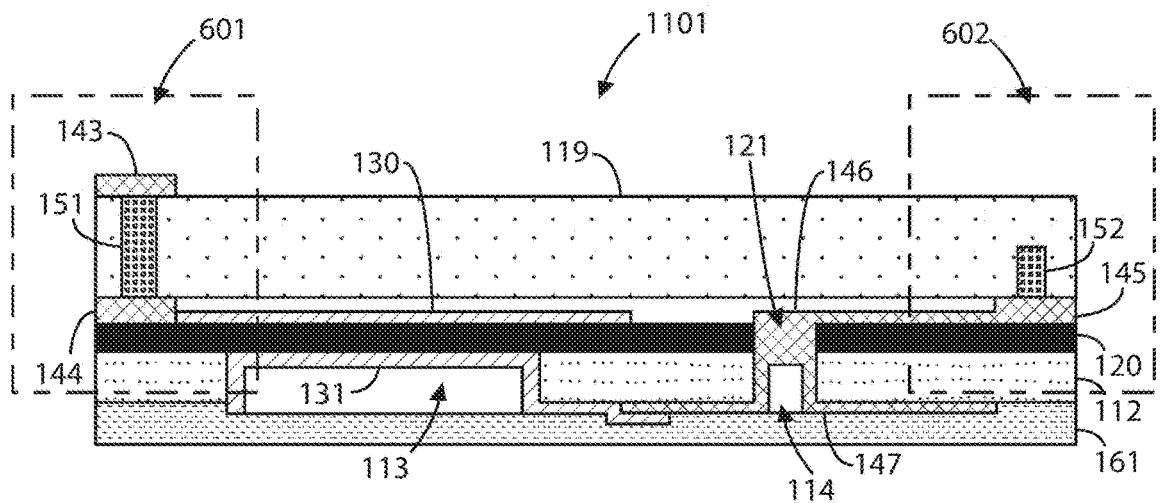
FIGS. 11A and 11B are simplified diagrams illustrating alternative steps for a method of manufacture for an acoustic resonator device according to an example of the present invention.
Figure 11B:
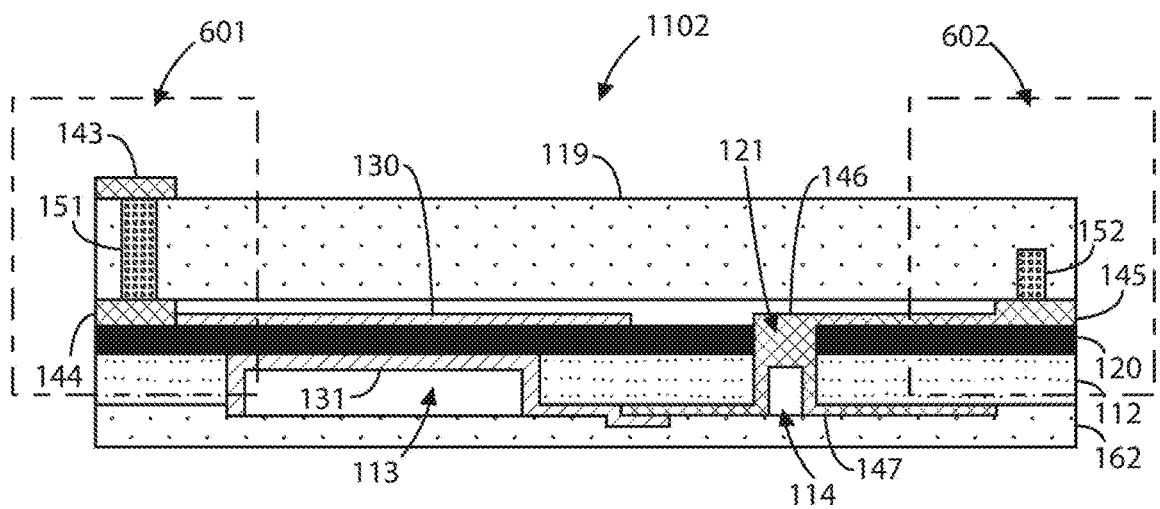

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
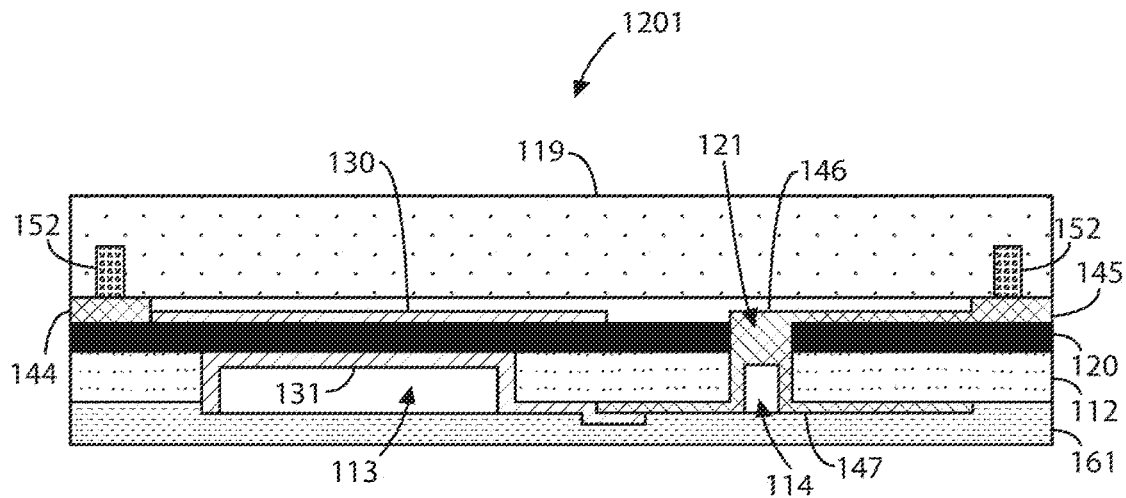
FIGS. 12A to 12E are simplified diagrams illustrating steps for a method of manufacture for an acoustic resonator device using a blind via interposer according to an example of the present invention.
Figure 12B:
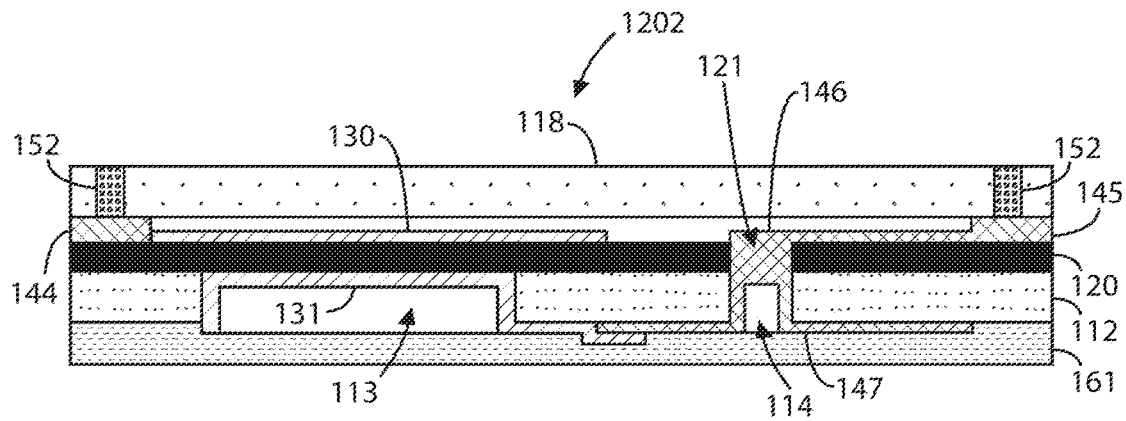
Figure 12C:
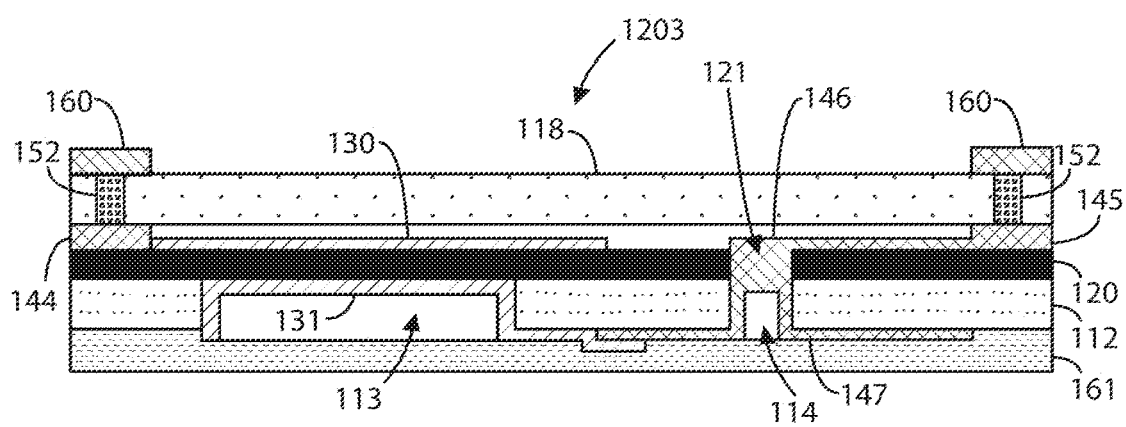
Figure 12D:
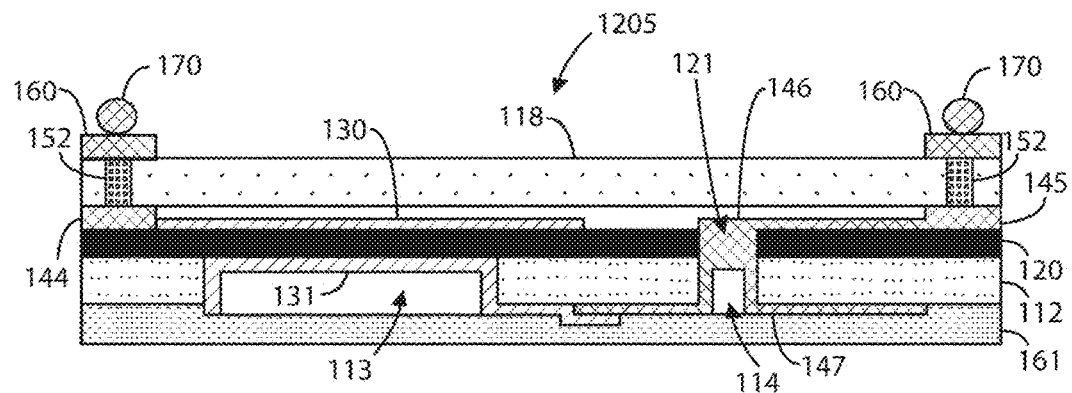
Figure 12E:
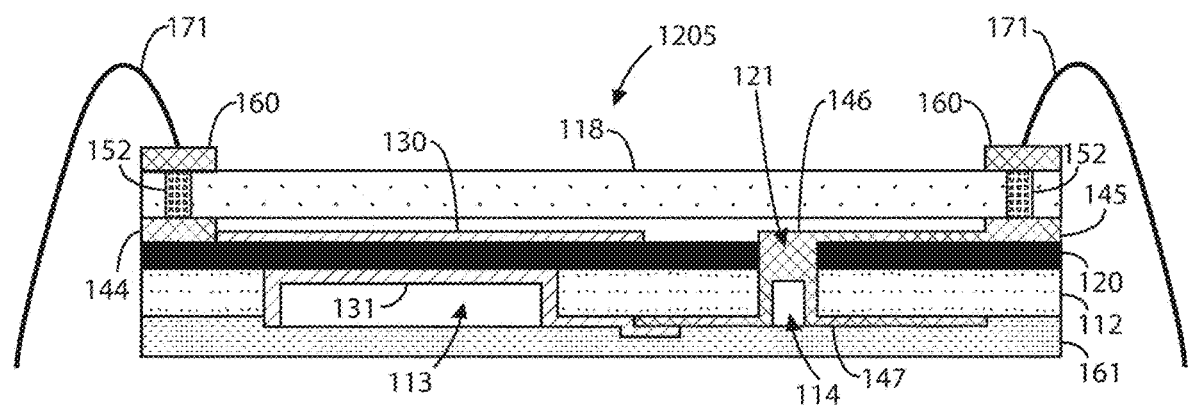

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
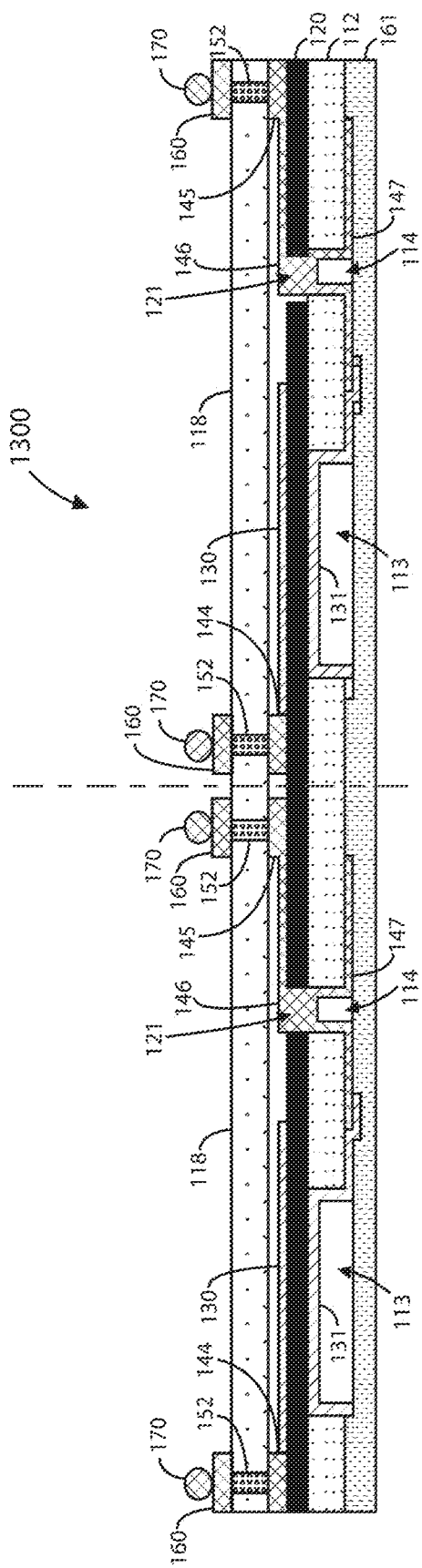
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
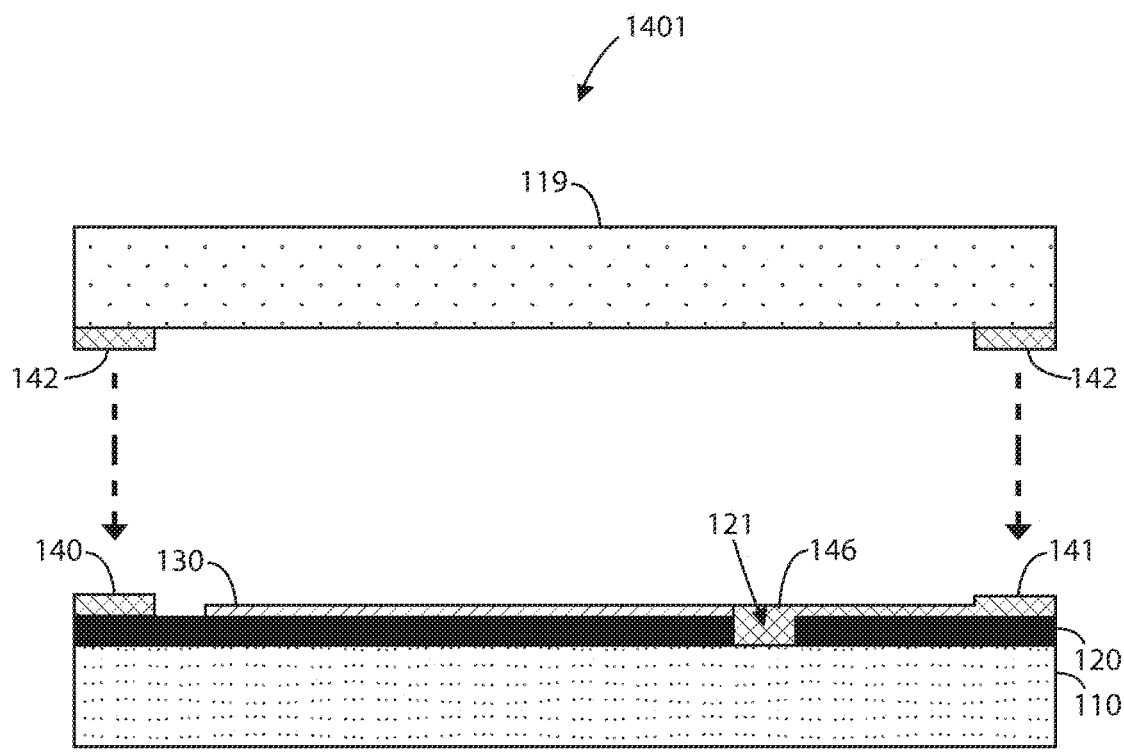
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
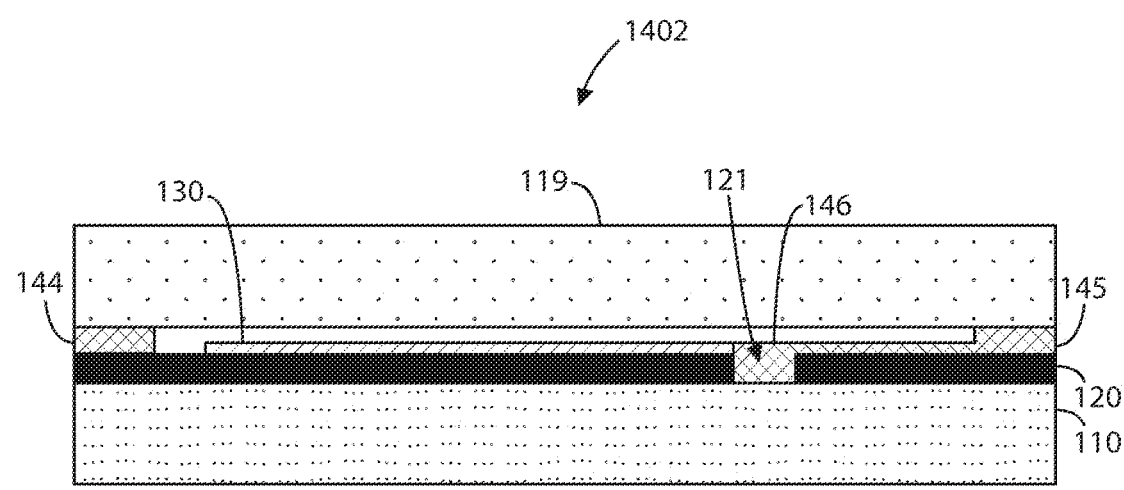
Figure 14C:
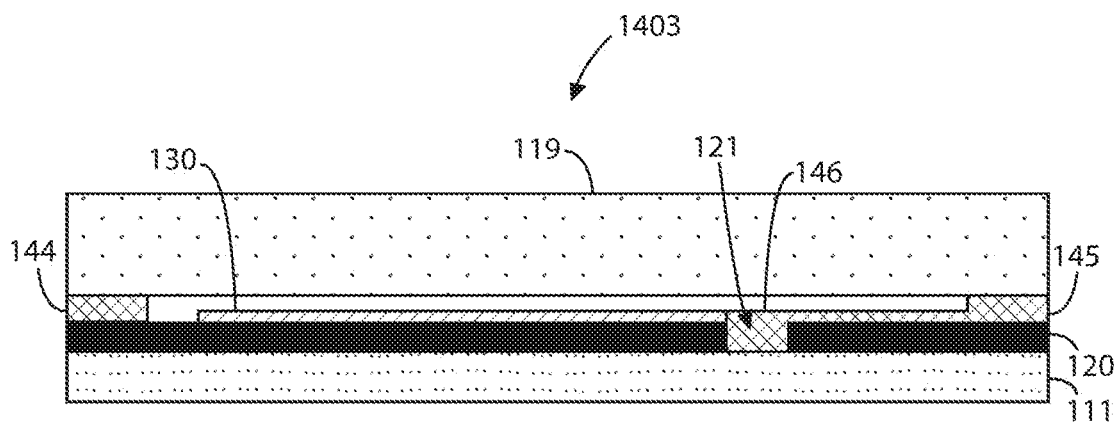
Figure 14D:
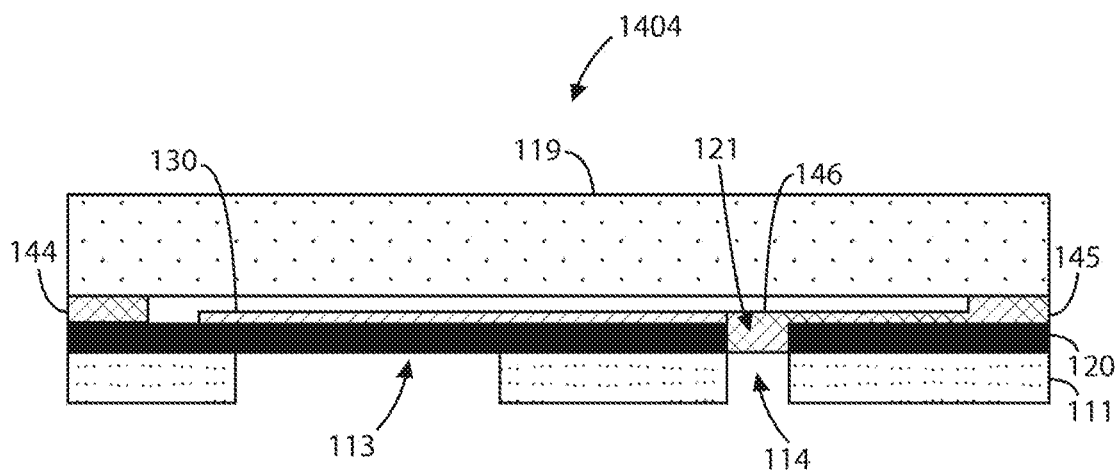
Figure 14E:
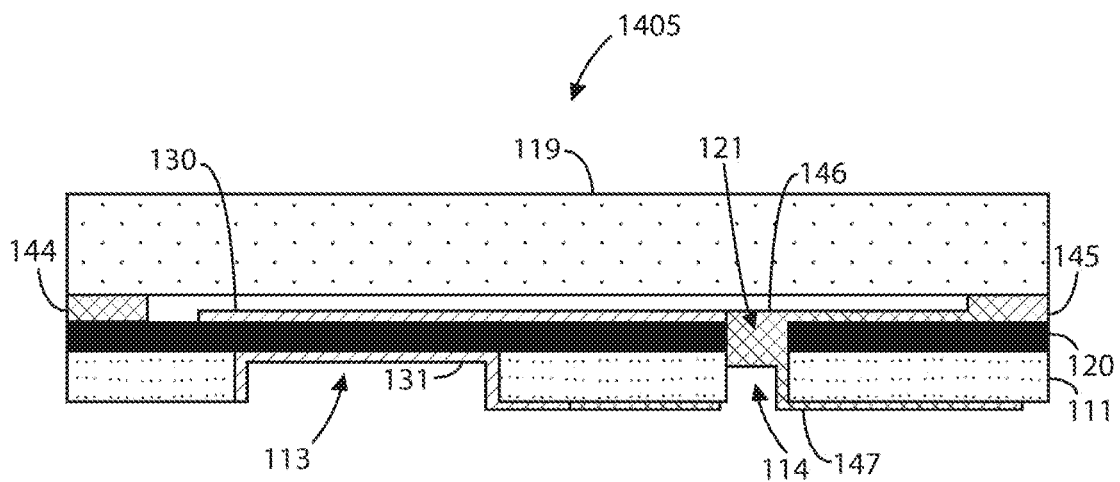
Figure 14F:
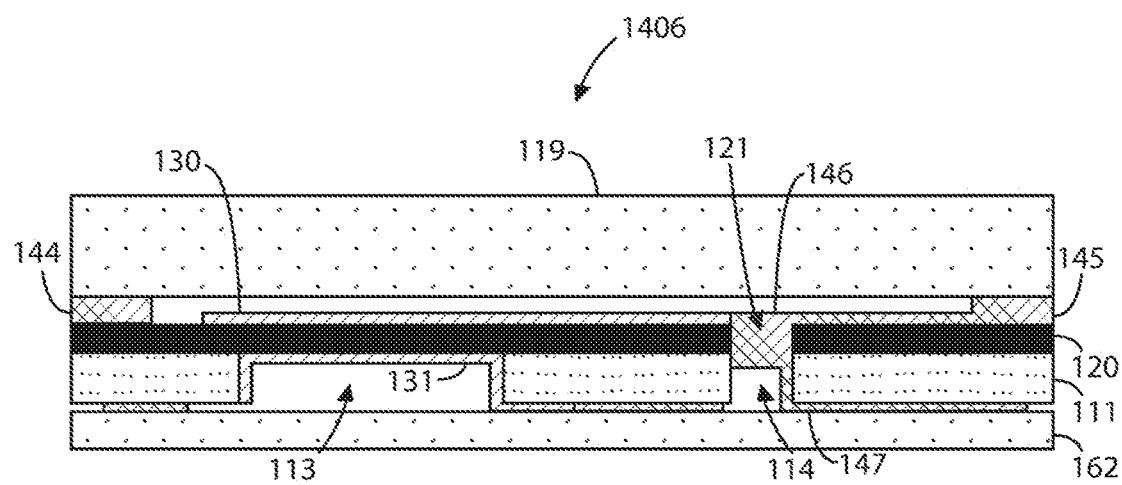

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
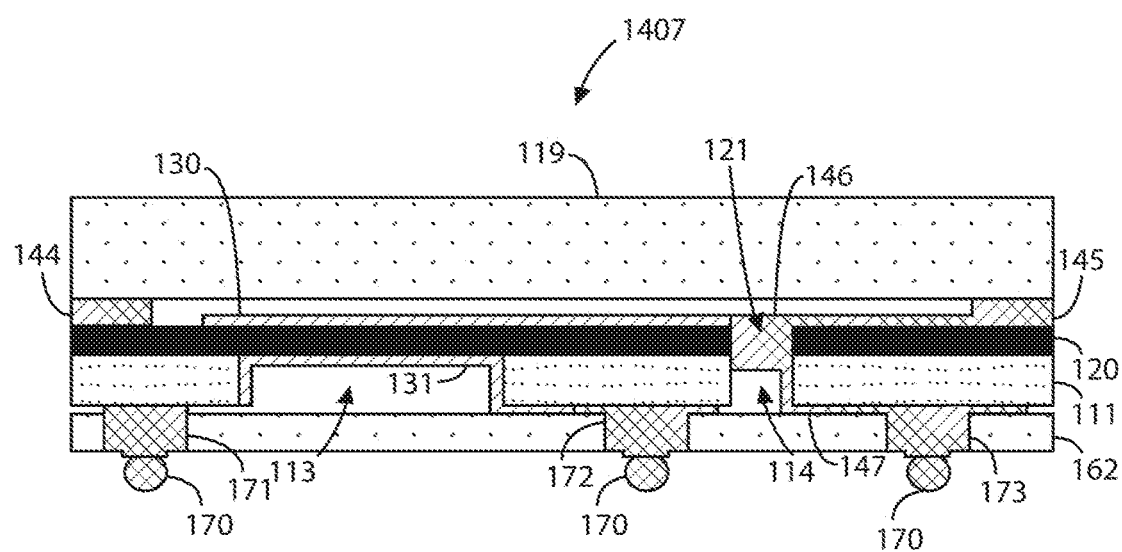

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
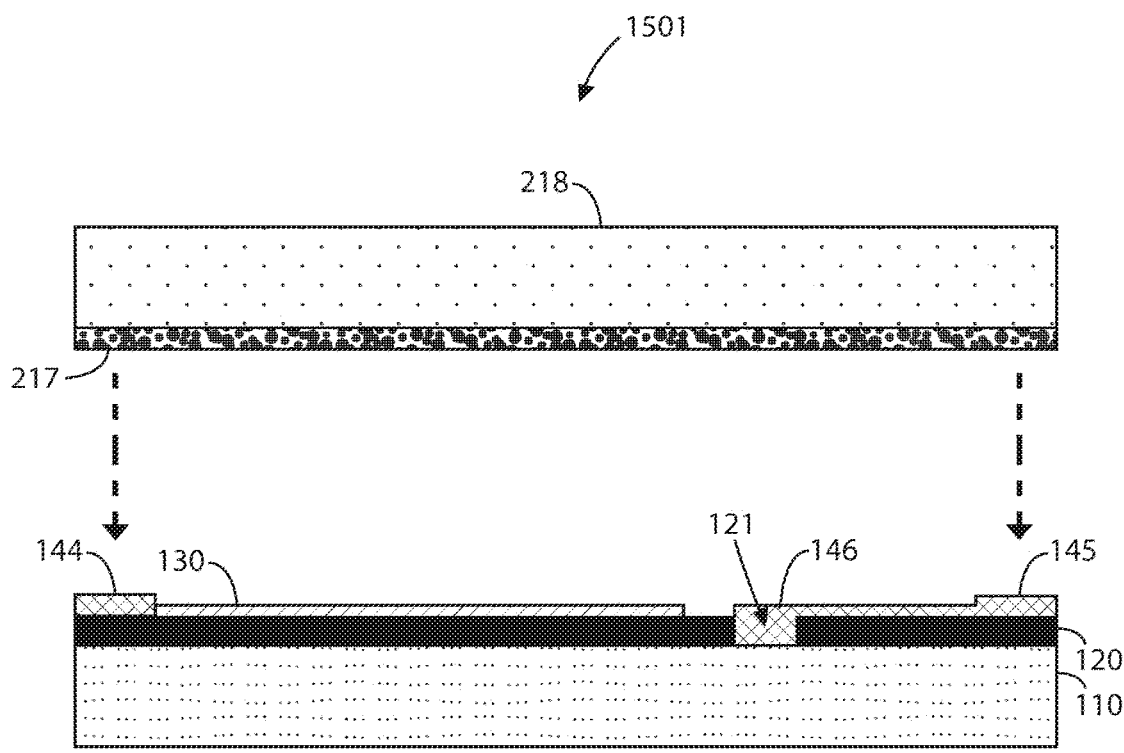
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
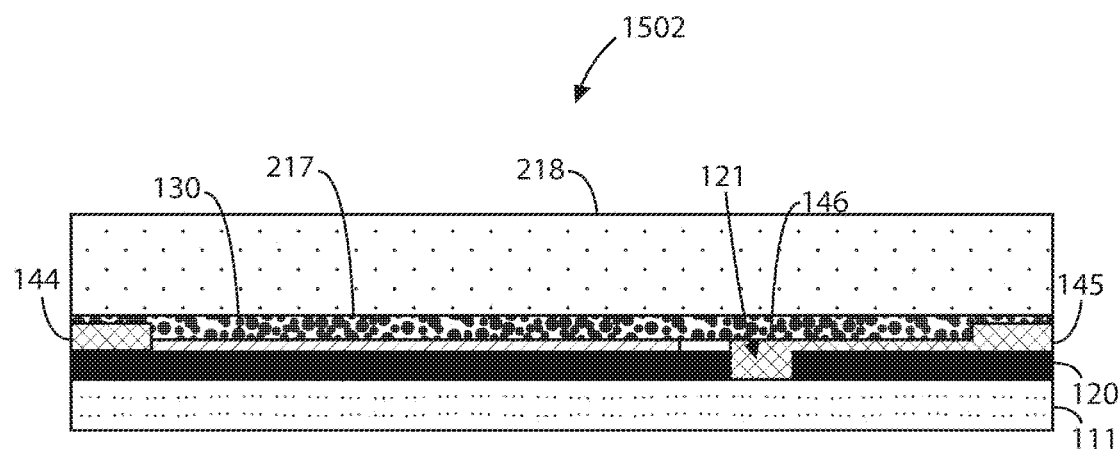

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
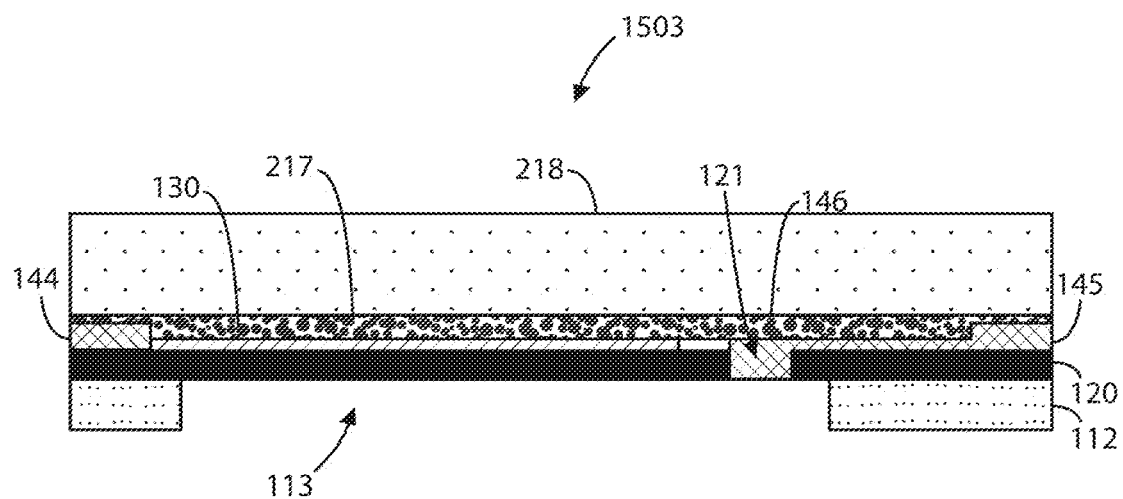

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
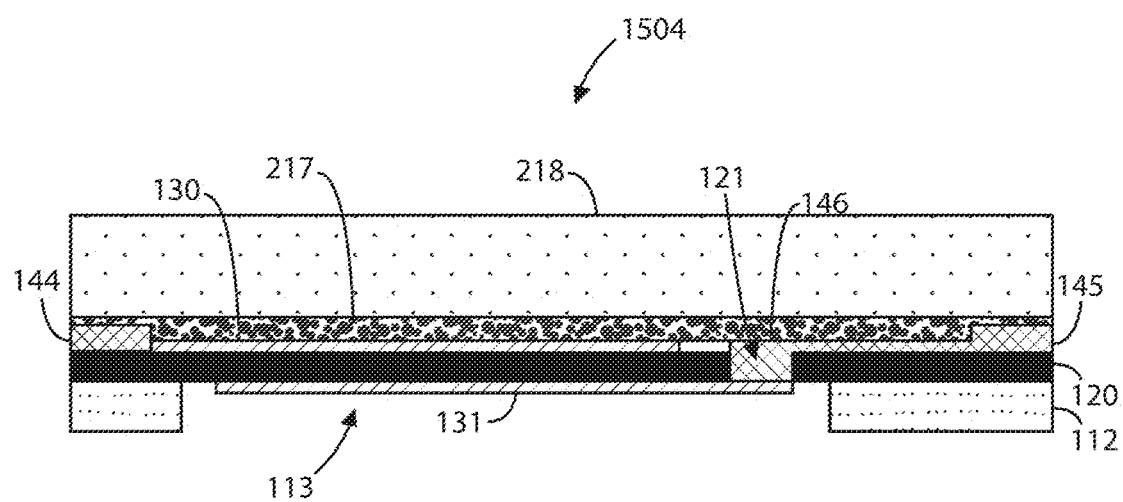

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
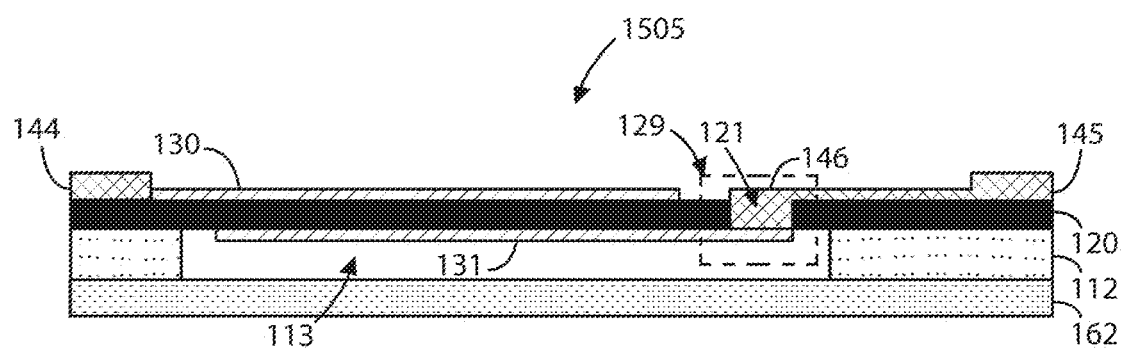

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

Embodiments according to the present invention can be used to form an AlScN/AlGaN superlattice structure and/or an AlScN layer with increasing Sc concentration for inclusion in a BAW resonator or filter device that can be manufactured in a relatively simple and cost effective manner. Using the present method, one can create a reliable single crystal based acoustic resonator using multiple ways of three-dimensional stacking through a wafer level process. Such filters or resonators can be implemented in an RF filter device, an RF filter system, or the like.

Single crystalline or epitaxial piezoelectric layers grown on compatible crystalline substrates can exhibit good crystalline quality and high piezoelectric performance even down to very thin thicknesses, e.g., 0.4 um. Accordingly, embodiments according to the present invention can provide manufacturing processes and structures for high quality bulk acoustic wave resonators with single crystalline or epitaxial piezoelectric AlScN/AlGaN superlattice structures and/or an AlScN layer with increasing Sc concentrations for high frequency BAW resonator and/or filter applications.

In some embodiments according to the present invention, epitaxial piezoelectric AlScN/AlGaN superlattice structures and/or an AlScN layer with increasing Sc concentrations ccasn be fabricated as described herein and incorporated into a transfer process for acoustic resonator devices, which provides a flat, high-quality, single-crystal piezoelectric film for superior acoustic wave control and high Q in high frequency.

Thus, embodiments according to the present invention can use single crystalline piezoelectric films and layer transfer processes to produce a BAWR with enhanced ultimate quality factor and electro-mechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 16C:
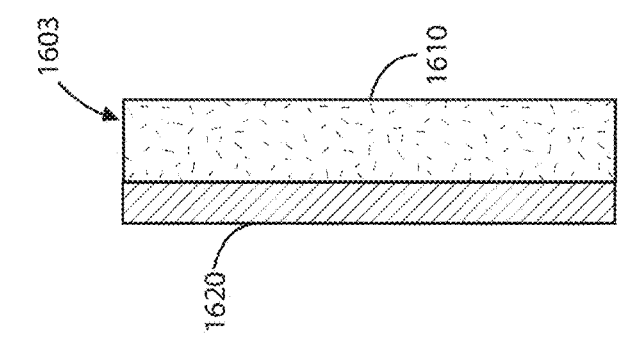
Figure 16A:
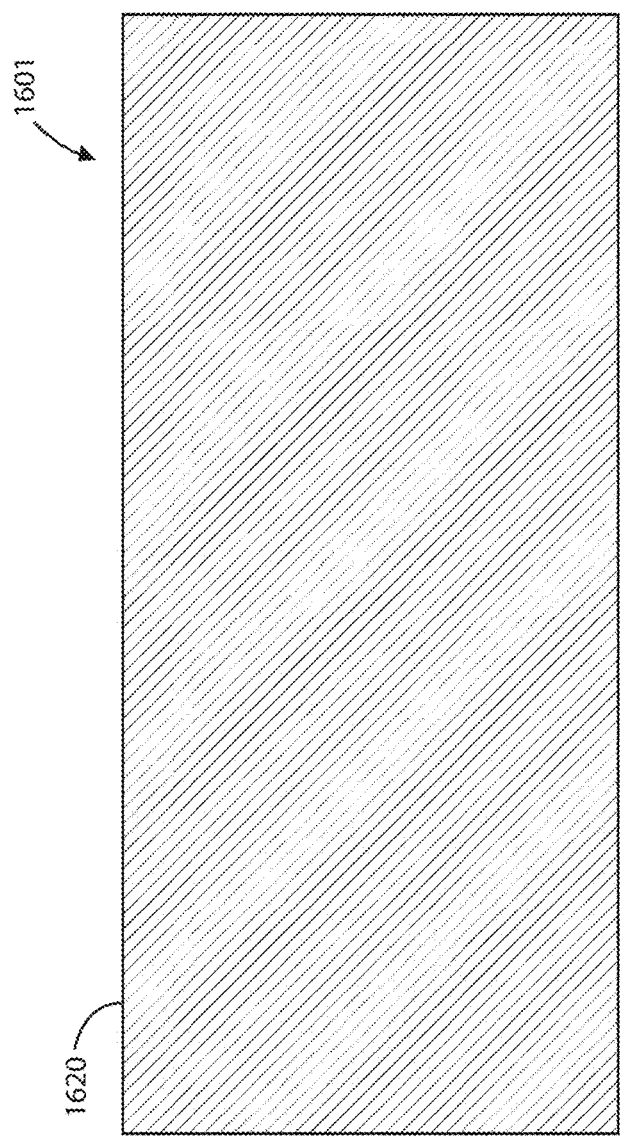
Figure 16B:
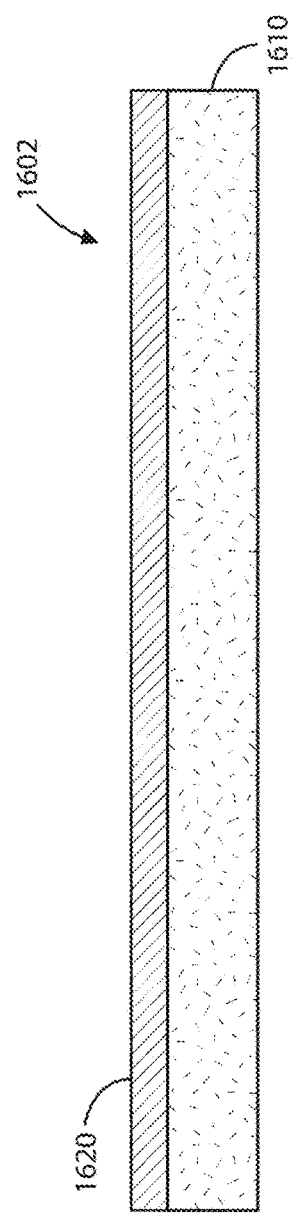

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials.

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

Figure 18C:
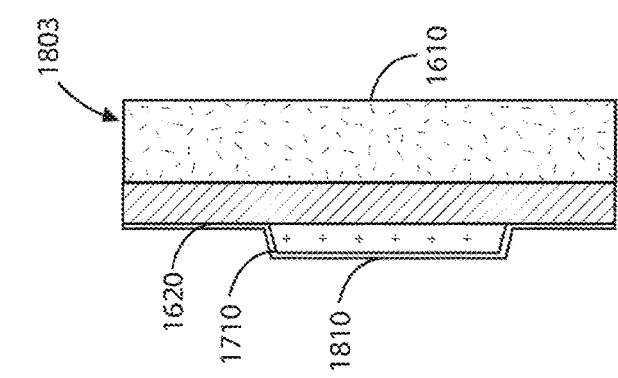
Figure 18A:
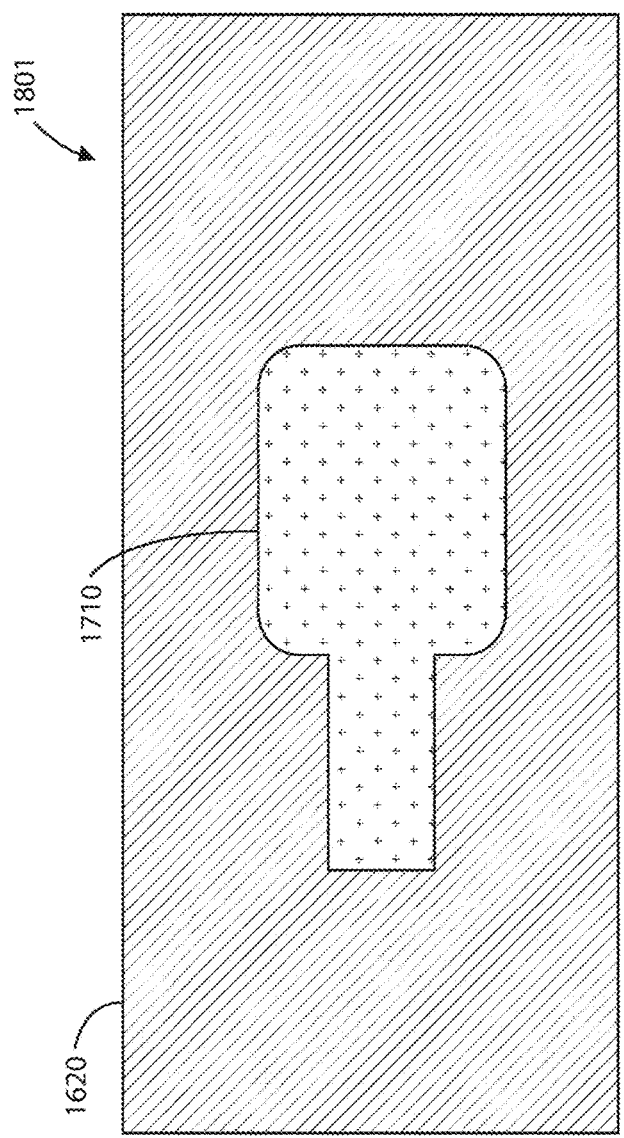
Figure 18B:
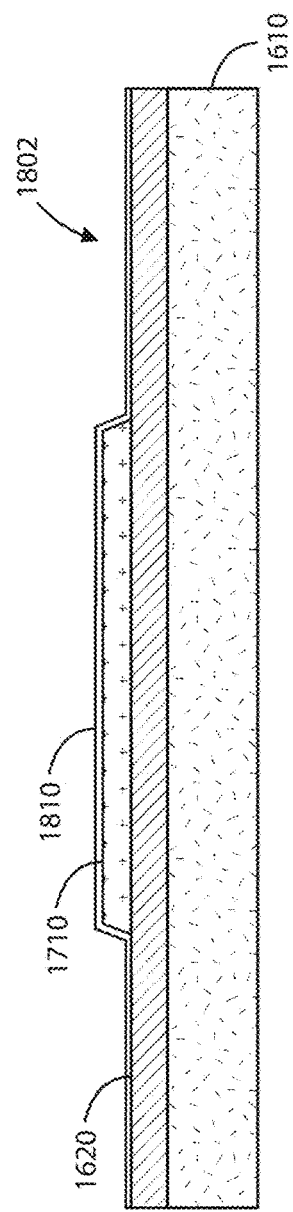

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide (SiOx), or other like materials. In a specific example, the first passivation layer 1810 can have a thickness ranging from about 50 nm to about 100 nm.

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped SiO.sub.2 (PSG) can be used as the sacrificial layer with different combinations of support layer (e.g., SiNx).

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide (SiO.sub.2), silicon nitride (SiN), or other like materials. In a specific example, this support layer 2010 can be deposited with a thickness of about 2-3 um. As described above, other support layers (e.g., SiNx) can be used in the case of a PSG sacrificial layer.

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

Figure 22C:
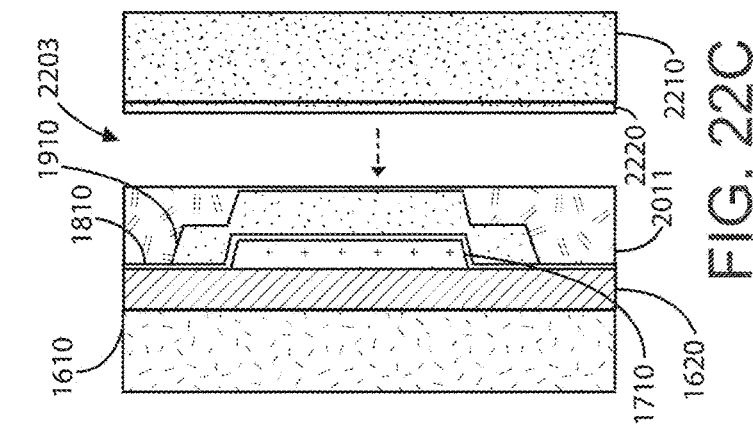
Figure 22A:
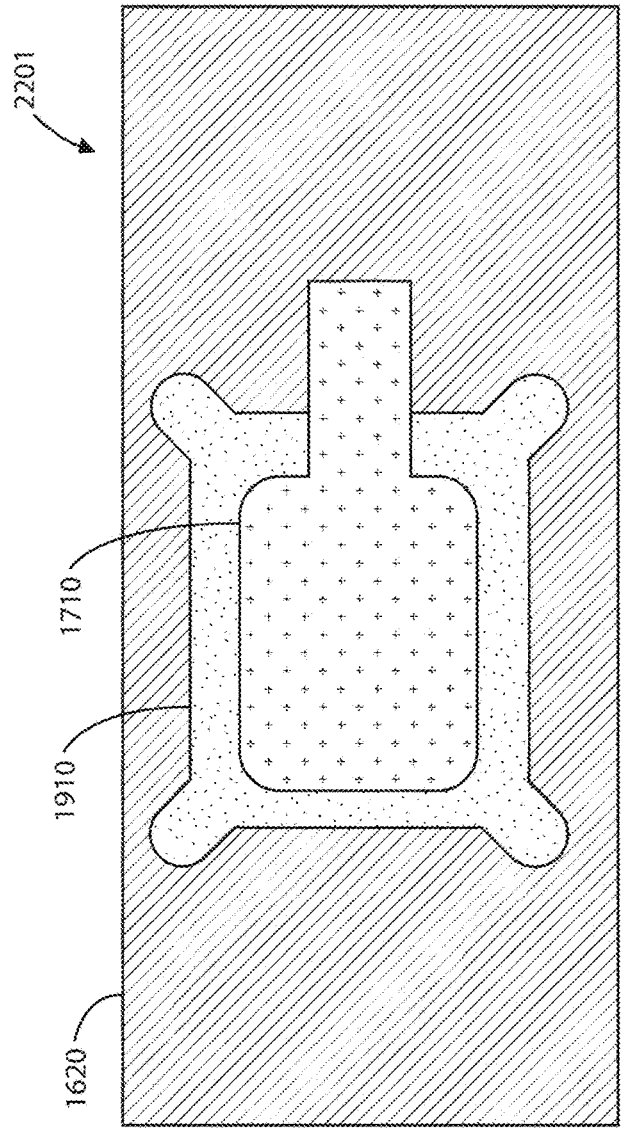
Figure 22B:
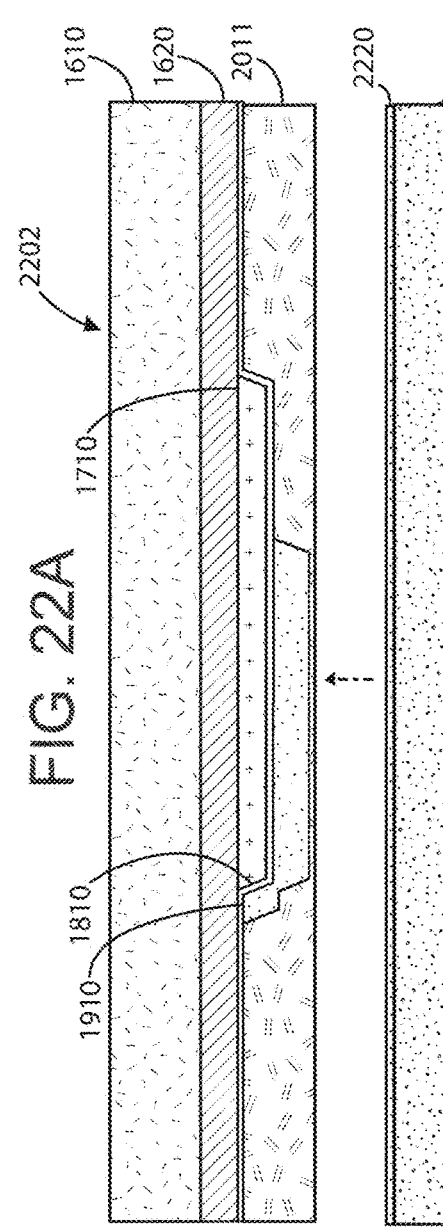

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 (SiO2 or like material) overlying a substrate having silicon (Si), sapphire (Al2O3), silicon dioxide (SiO2), silicon carbide (SiC), or other like materials. In a specific embodiment, the bonding support layer 2220 of the bond substrate 2210 is physically coupled to the polished support layer 2011. Further, the physical coupling process can include a room temperature bonding process following by a 300 degree Celsius annealing process.

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

Figure 26C:
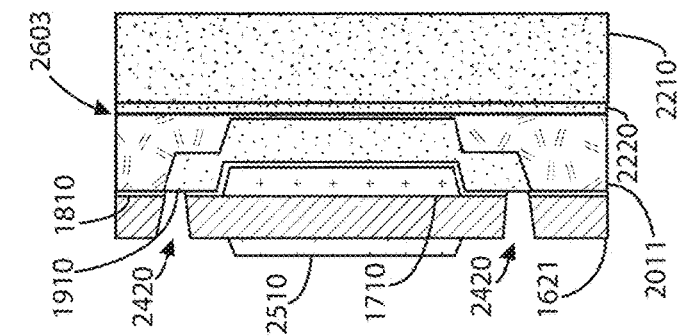
Figure 26A:
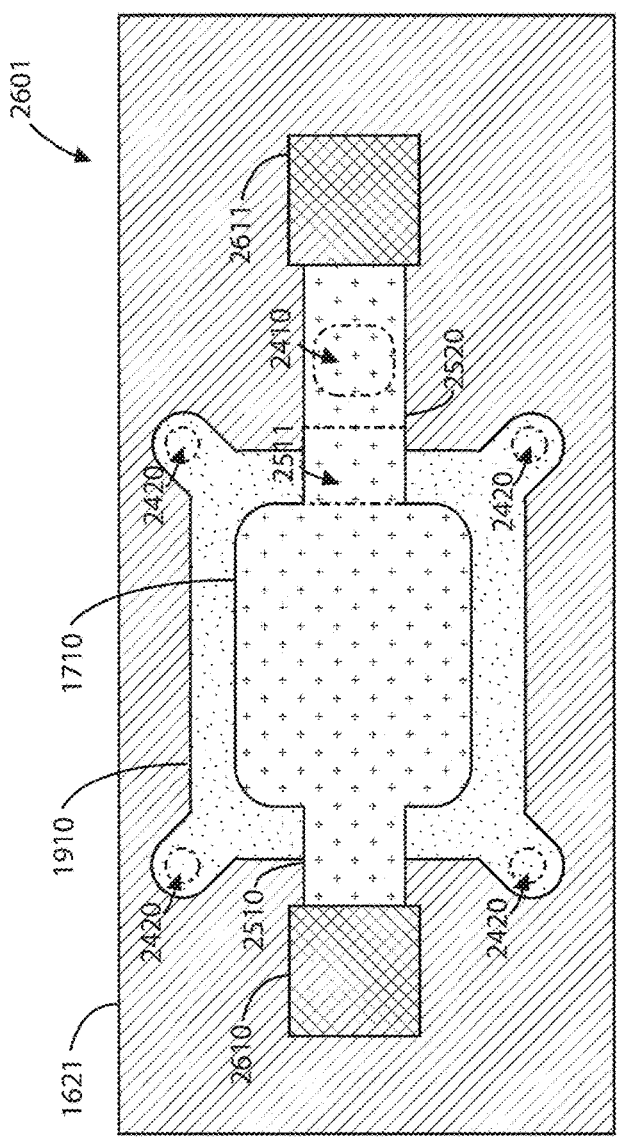
Figure 26B:
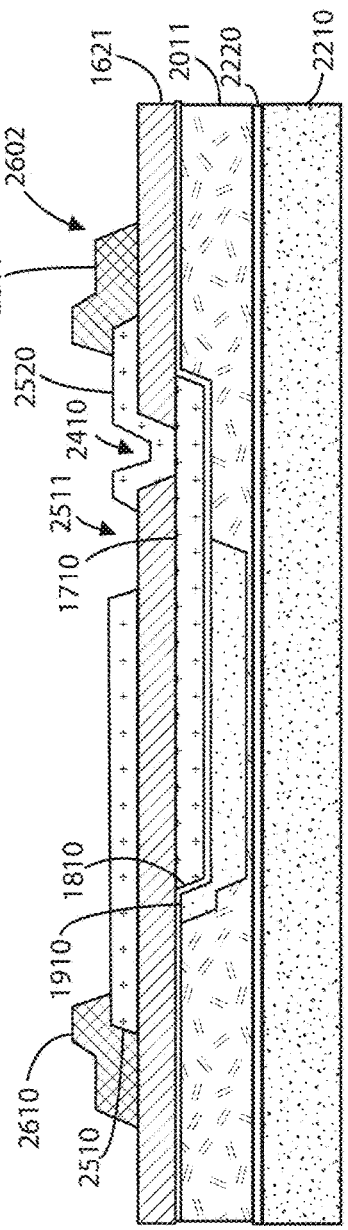

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide (SiOx), or other like materials. In a specific example, the second passivation layer 2710 can have a thickness ranging from about 50 nm to about 100 nm.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like)

this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

Figure 30C:
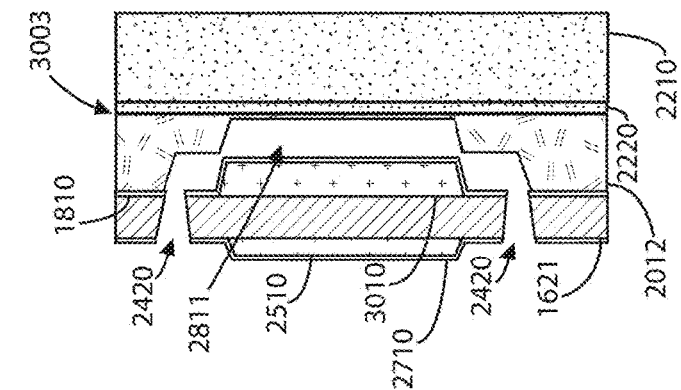
Figure 30A:
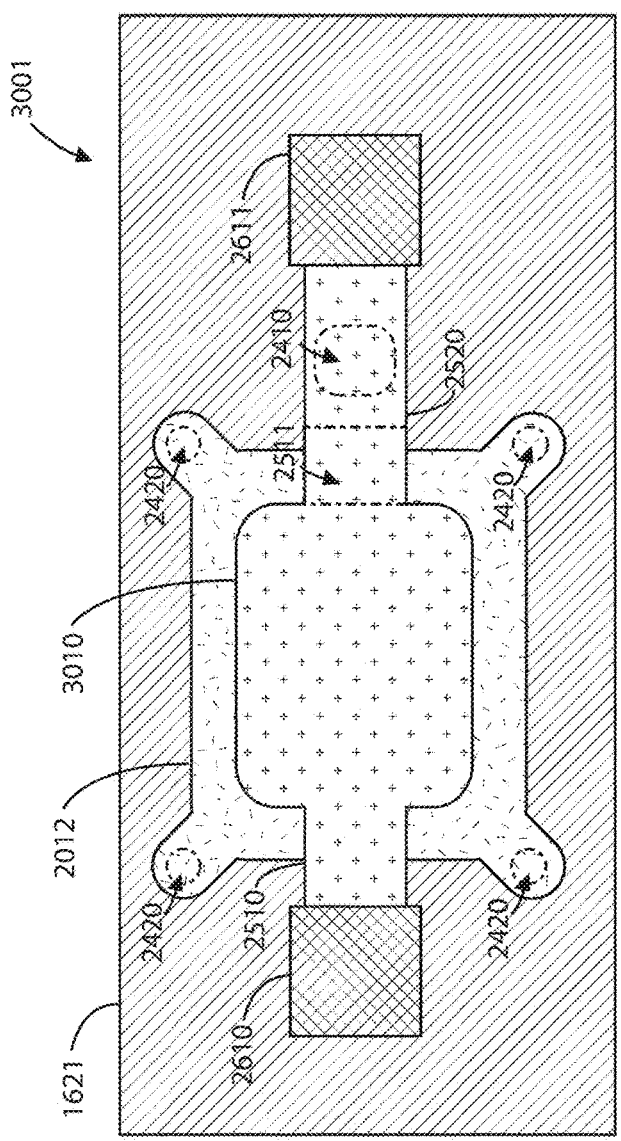
Figure 30B:
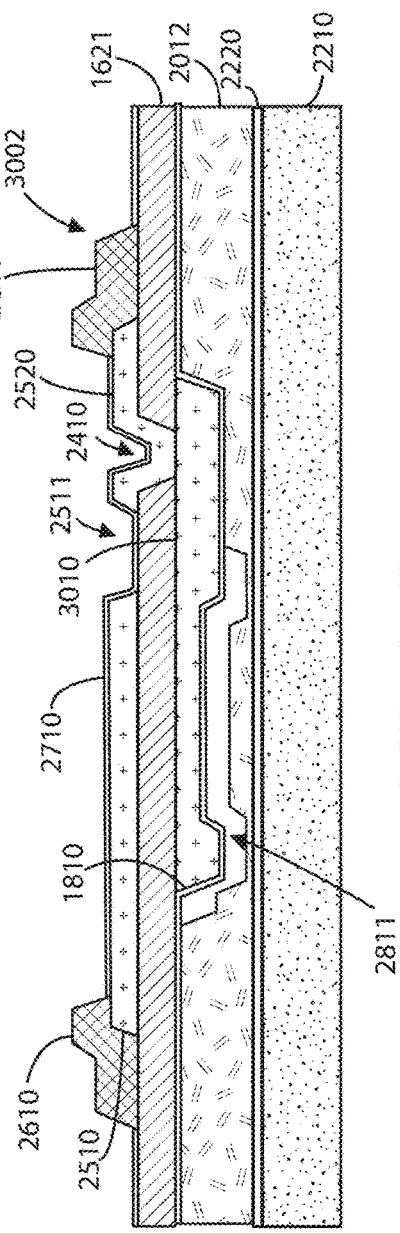

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
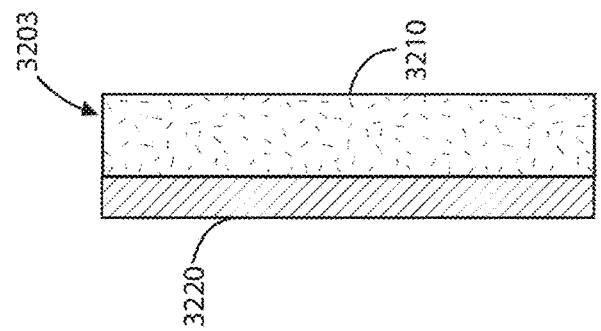
Figure 32A:
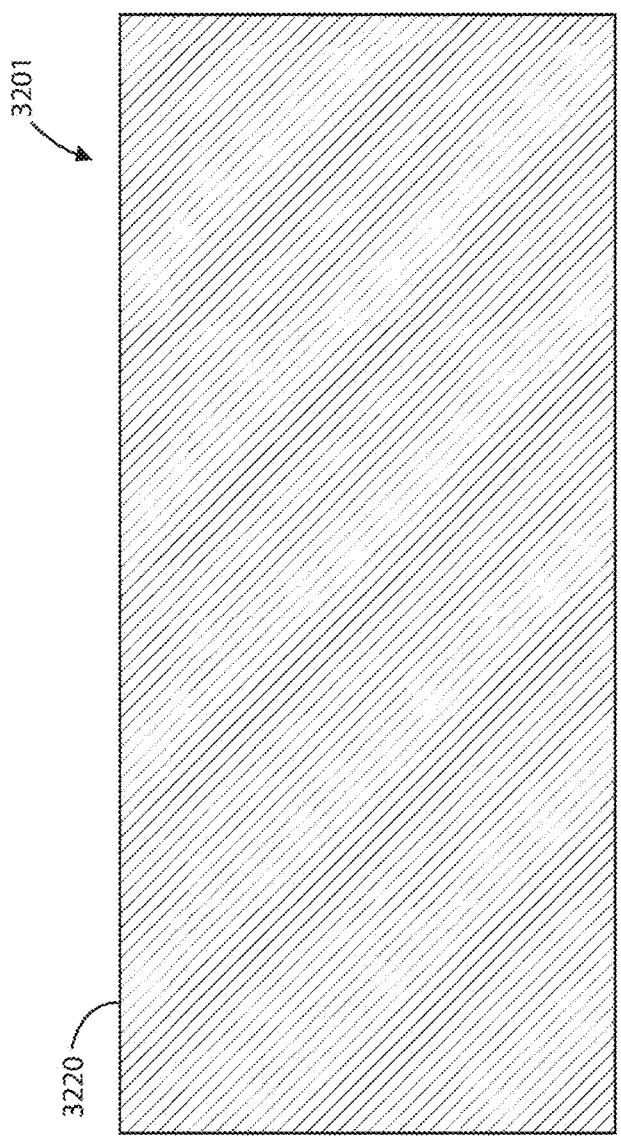
Figure 32B:
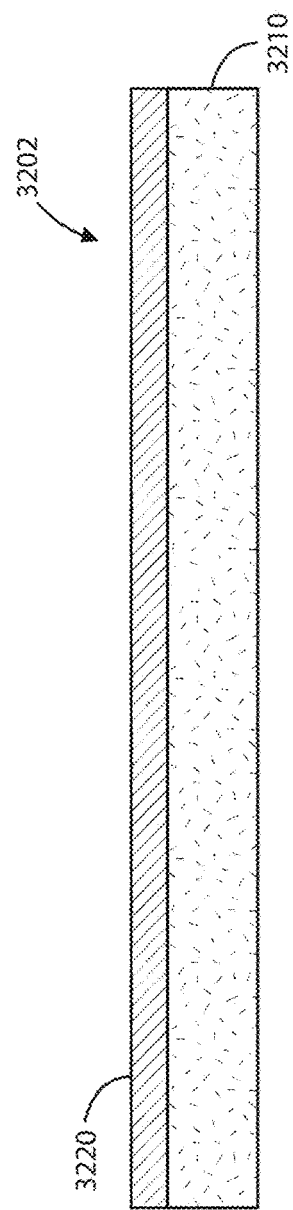

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials.

Figure 33C:
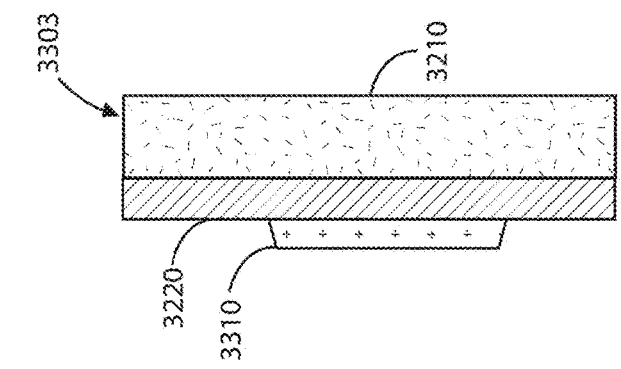
Figure 33A:
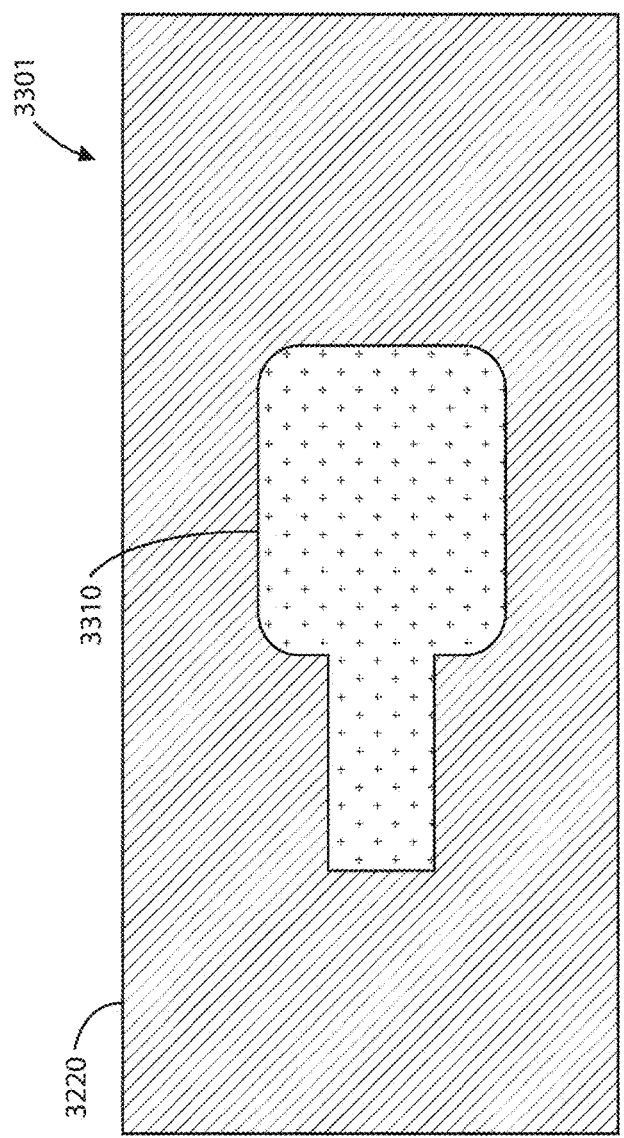
Figure 33B:
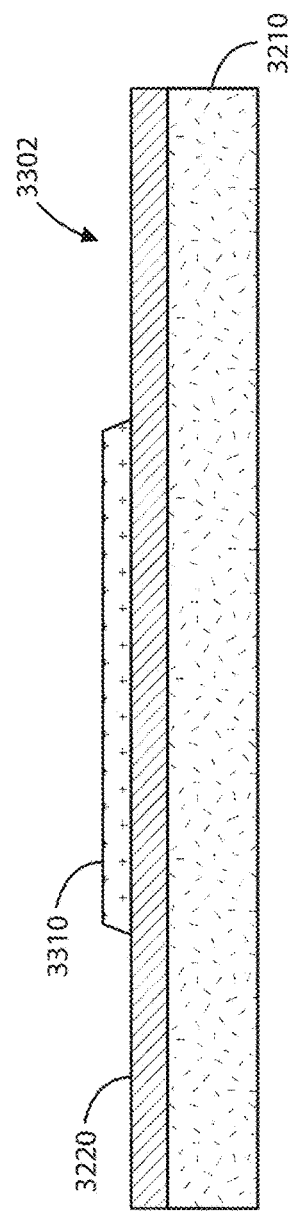

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

Figure 34C:
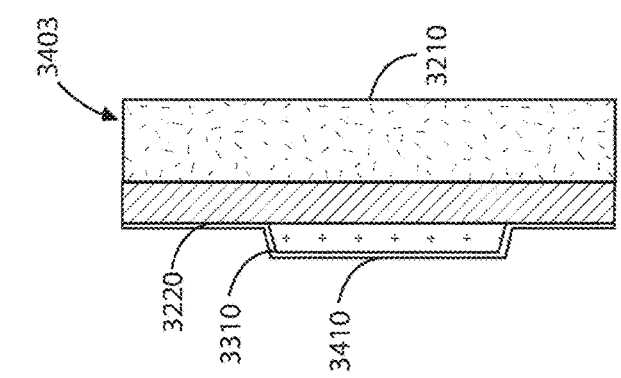
Figure 34A:
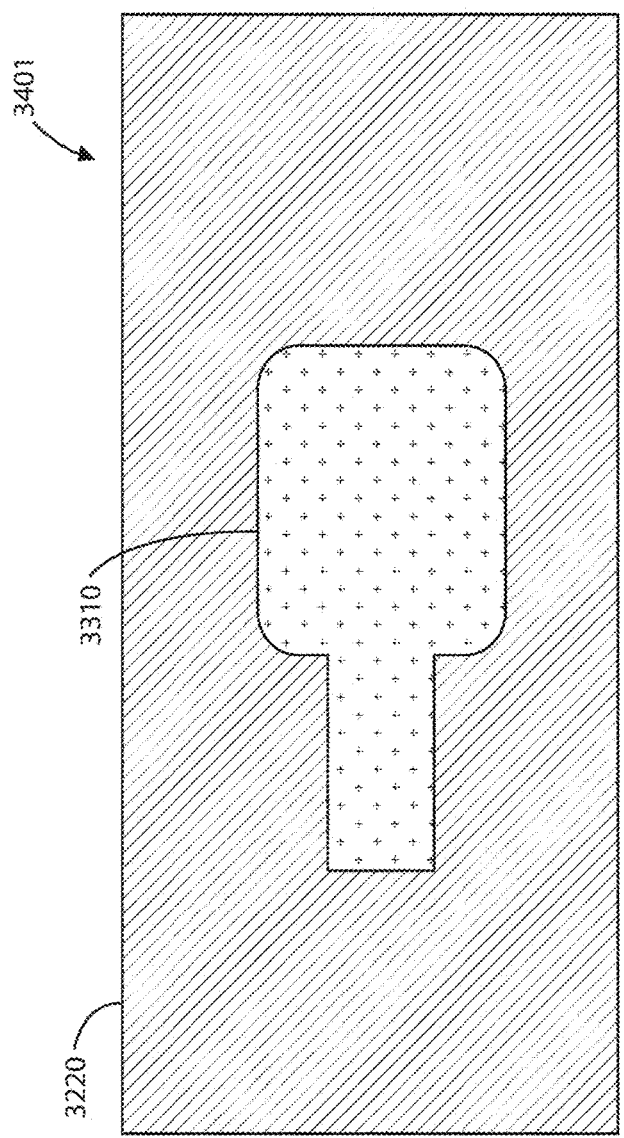
Figure 34B:
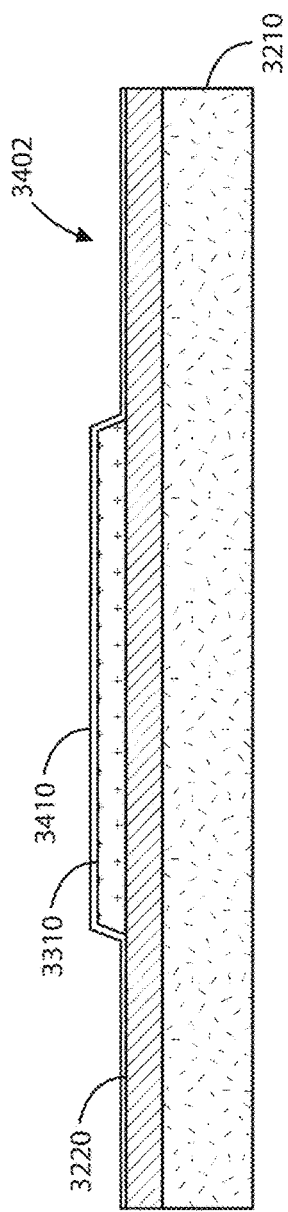

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide (SiOx), or other like materials. In a specific example, the first passivation layer 3410 can have a thickness ranging from about 50 nm to about 100 nm.

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide (SiO.sub.2), silicon nitride (SiN), or other like materials. In a specific example, this support layer 3510 can be deposited with a thickness of about 2-3 um. As described above, other support layers (e.g., SiNx) can be used in the case of a PSG sacrificial layer.

Figure 36C:
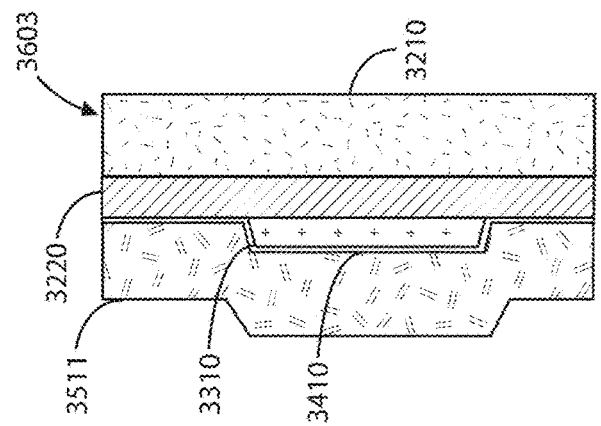
Figure 36A:
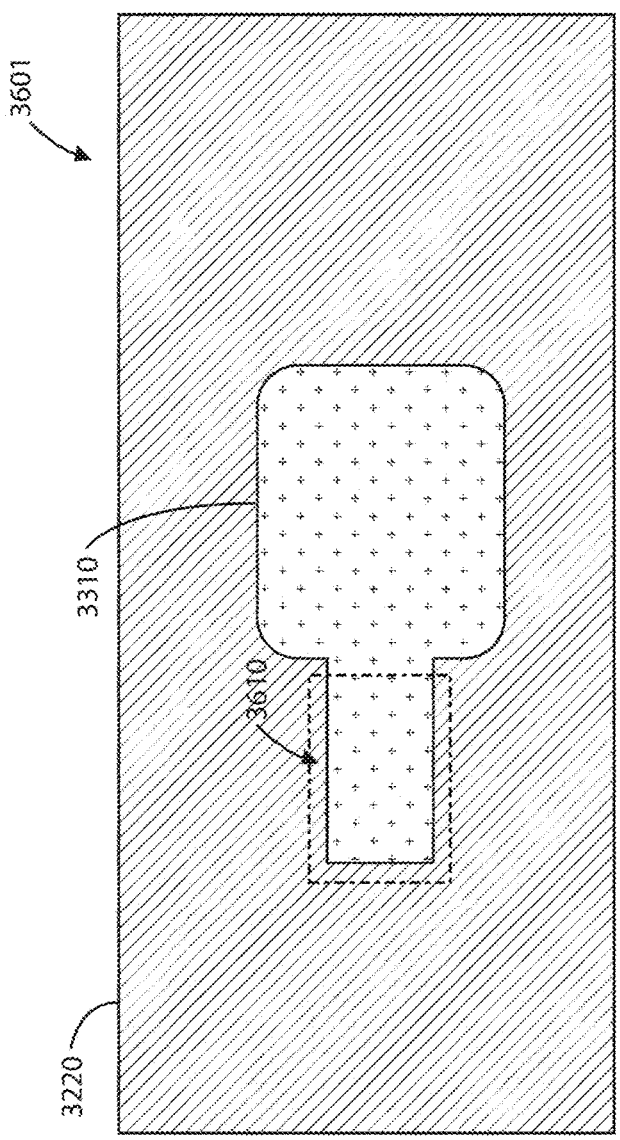
Figure 36B:
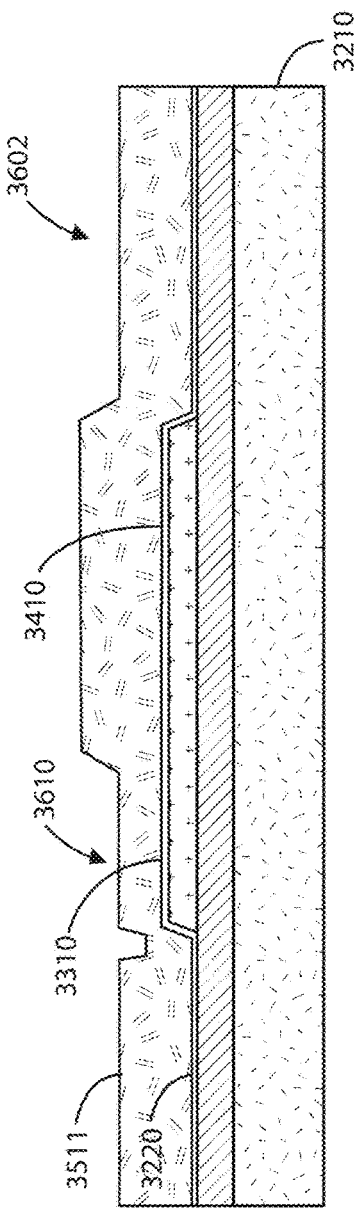

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

Figure 37C:
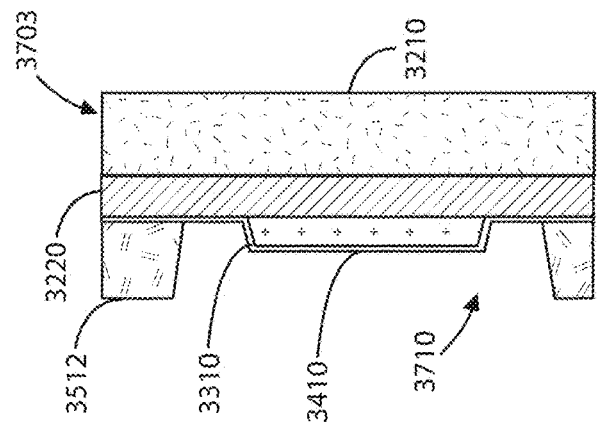
Figure 37A:
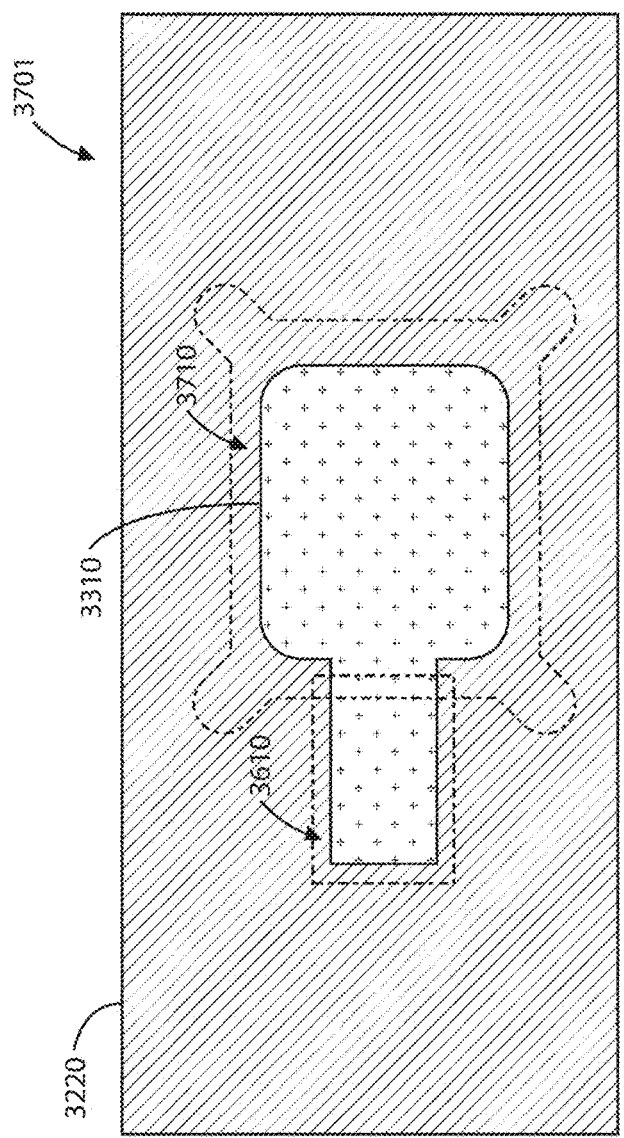
Figure 37B:
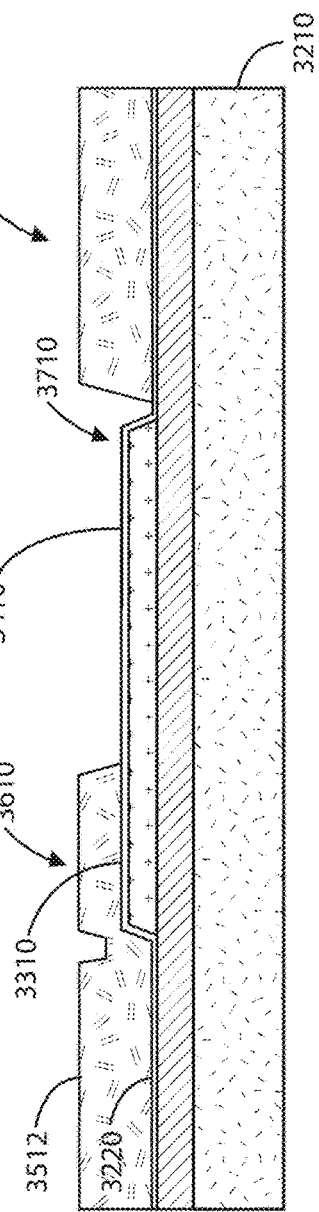

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 (SiO.sub.2 or like material) overlying a substrate having silicon (Si), sapphire (Al.sub.2O.sub.3), silicon dioxide (SiO.sub.2), silicon carbide (SiC), or other like materials. In a specific embodiment, the bonding support layer 3920 of the bond substrate 3910 is physically coupled to the polished support layer 3512. Further, the physical coupling process can include a room temperature bonding process following by a 300 degree Celsius annealing process.

Figure 40C:
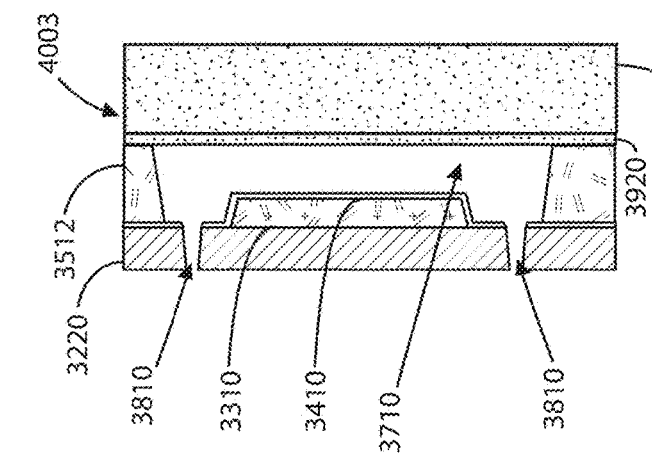
Figure 40A:
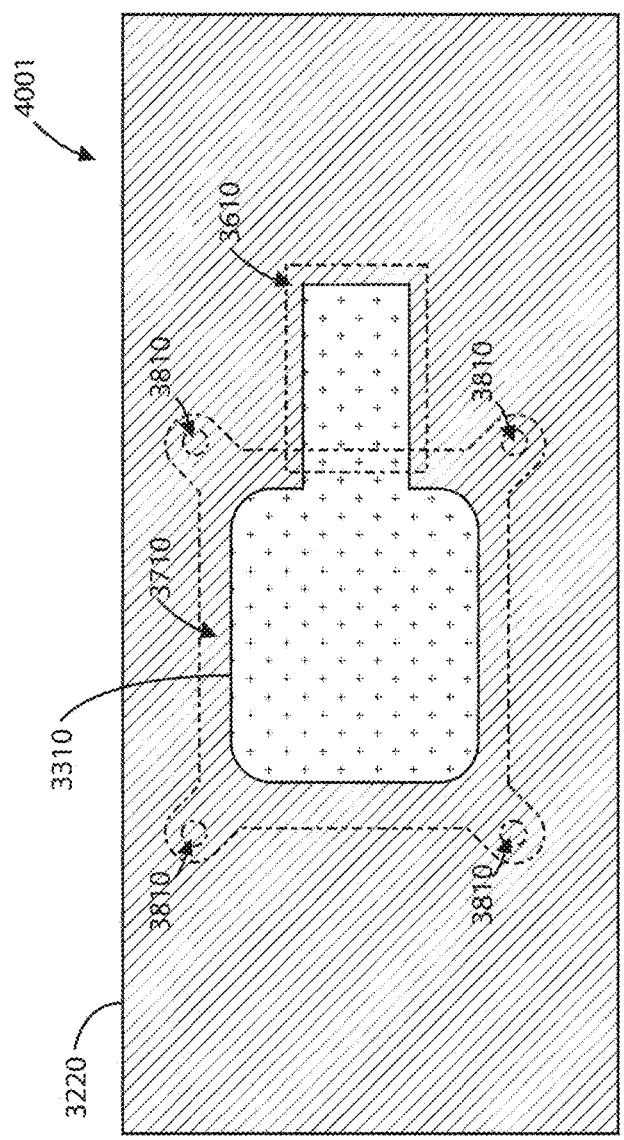
Figure 40B:
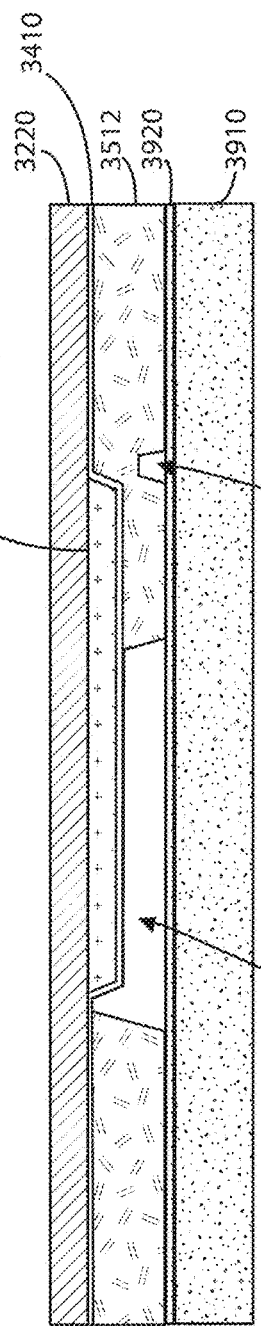

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

Figure 41C:
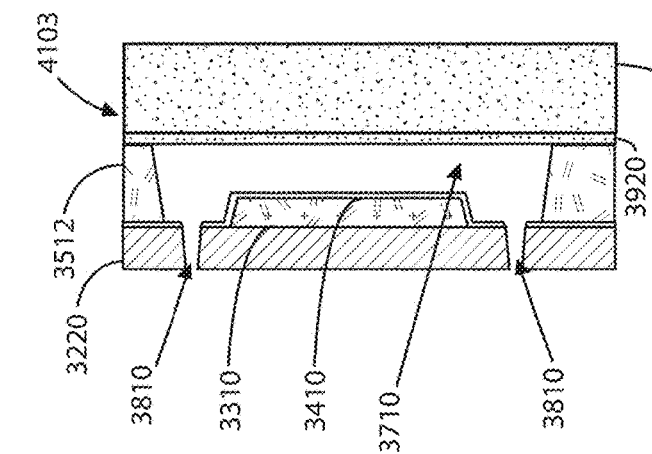
Figure 41A:
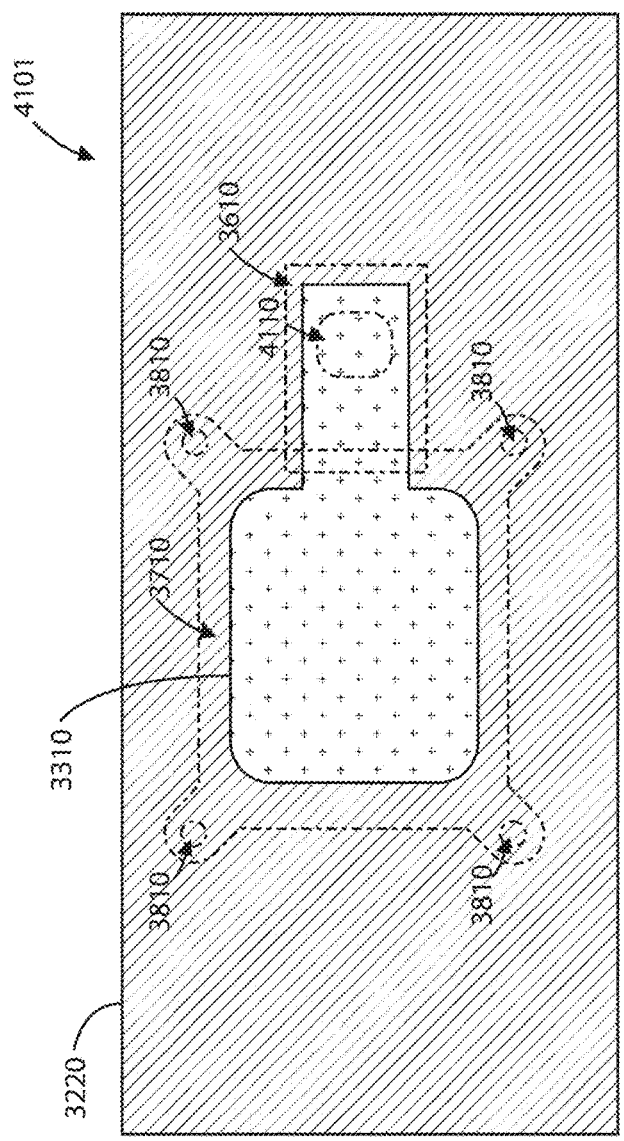
Figure 41B:
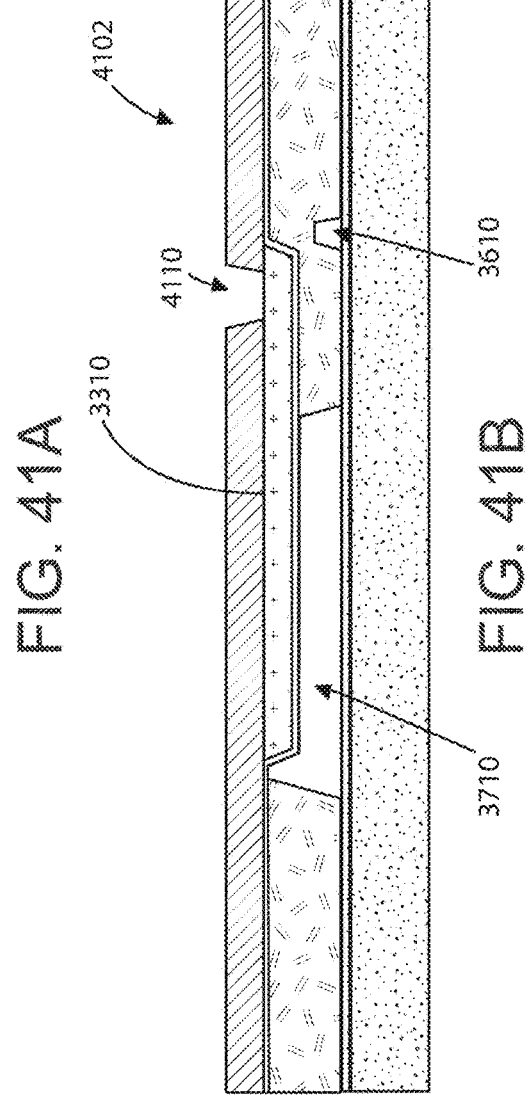

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

Figure 43A:
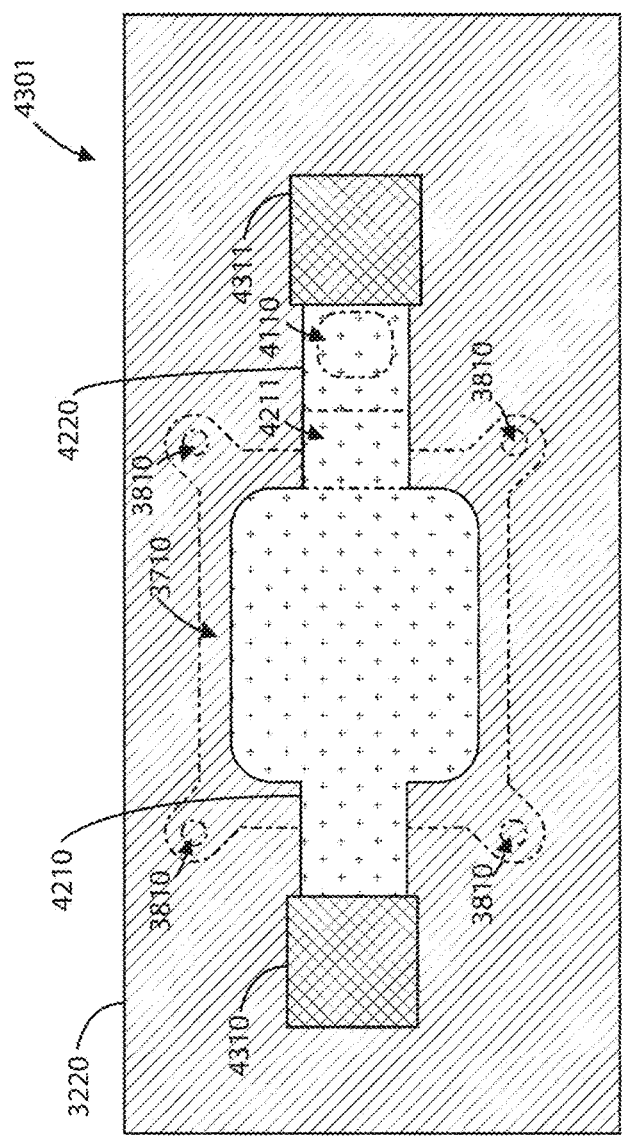
Figure 43B:
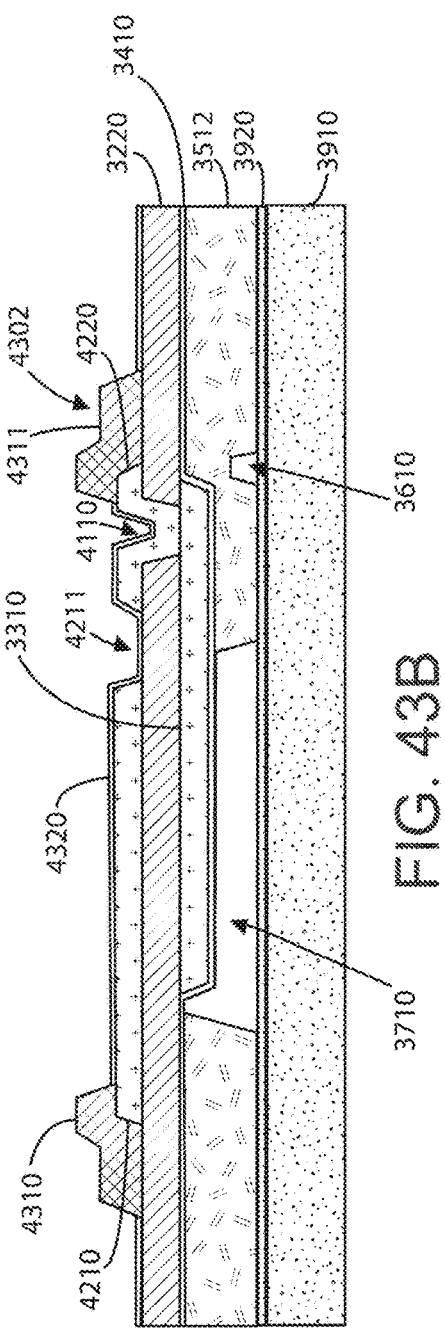
Figure 43C:
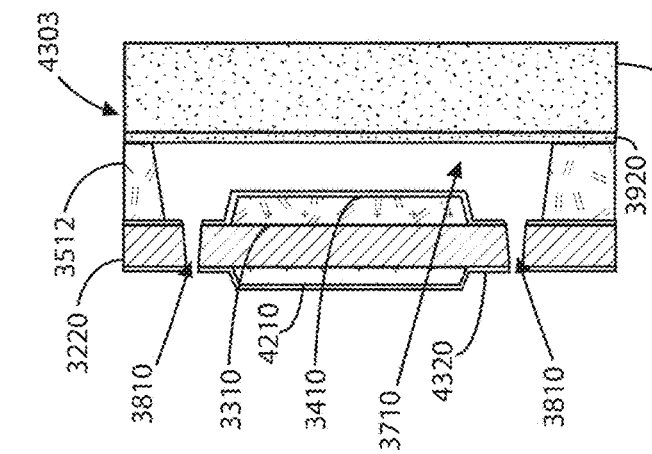

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide (SiOx), or other like materials. In a specific example, the second passivation layer 4320 can have a thickness ranging from about 50 nm to about 100 nm.

Figure 44C:
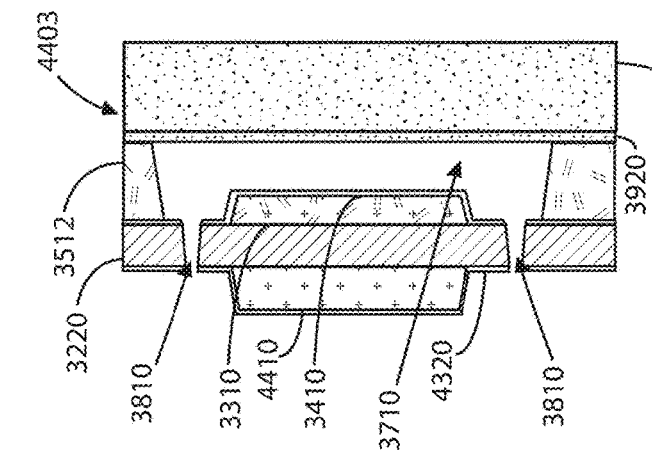
Figure 44A:
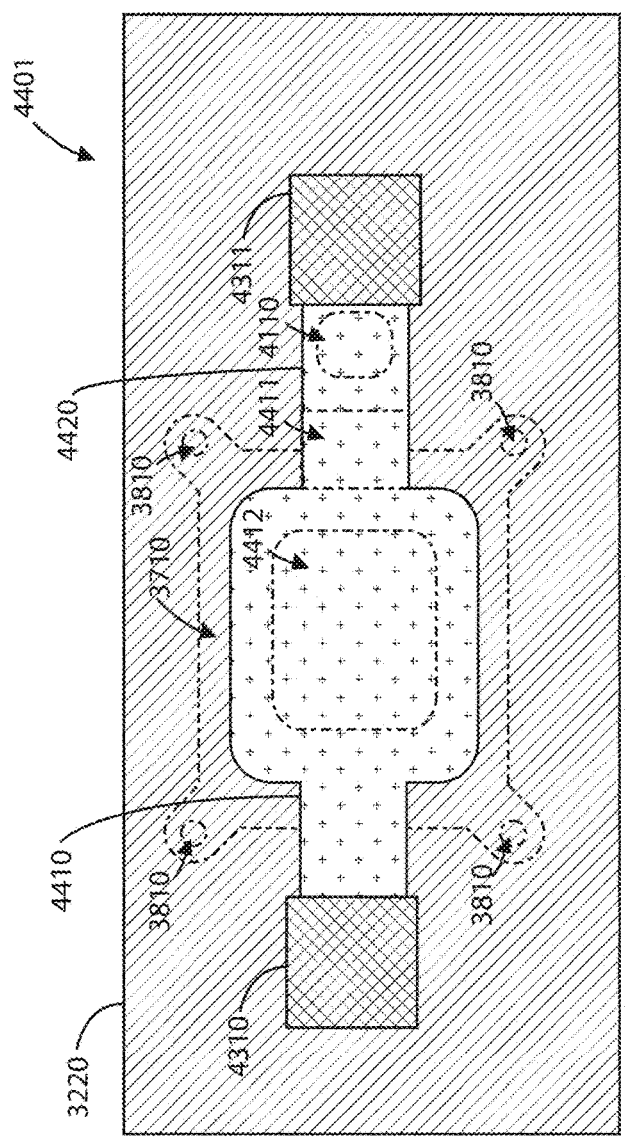
Figure 44B:
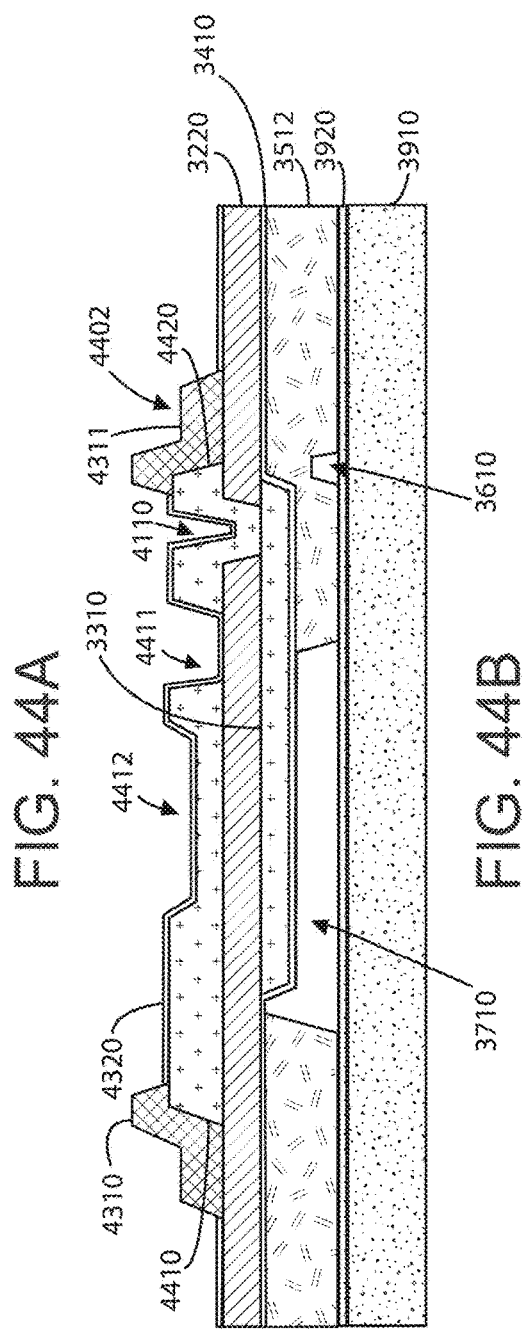

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

Figure 45C:
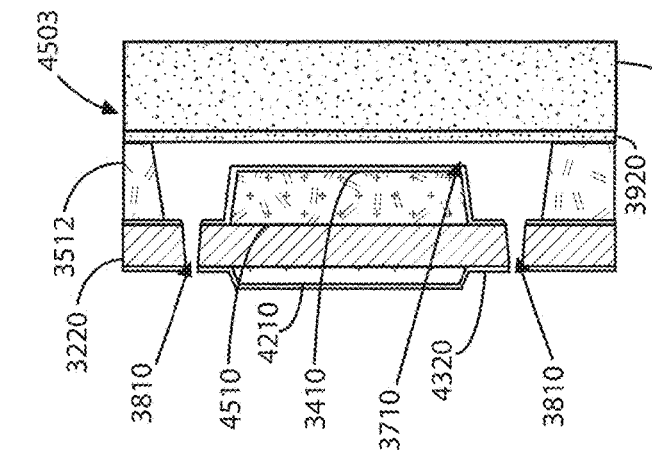
Figure 45A:
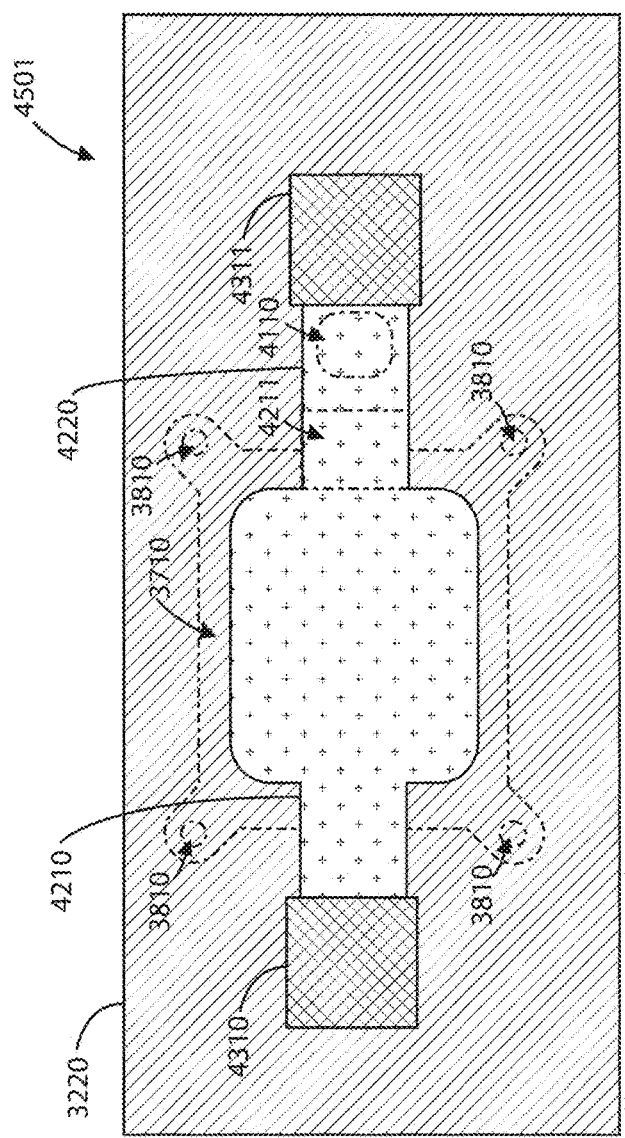
Figure 45B:
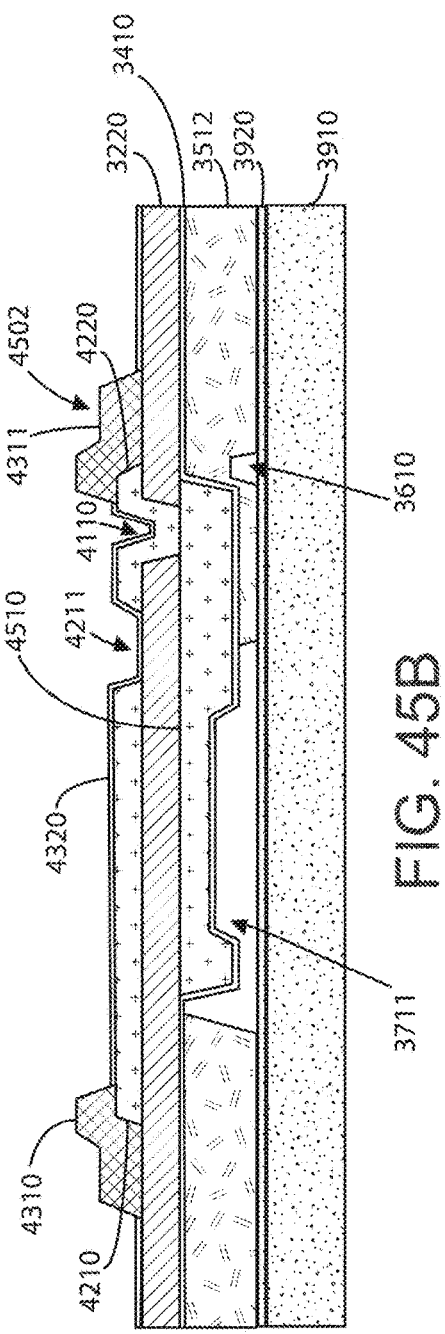

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
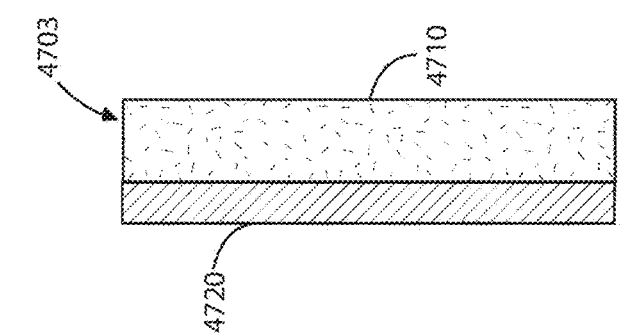
FIGS. 47A-47C though
Figure 47A:
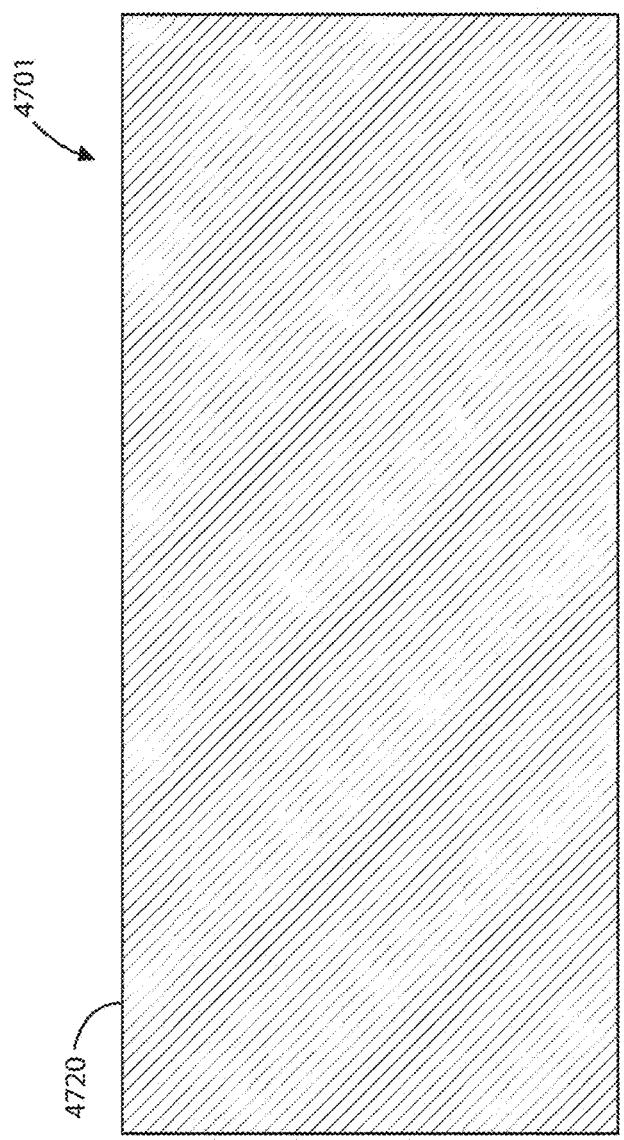
Figure 47B:
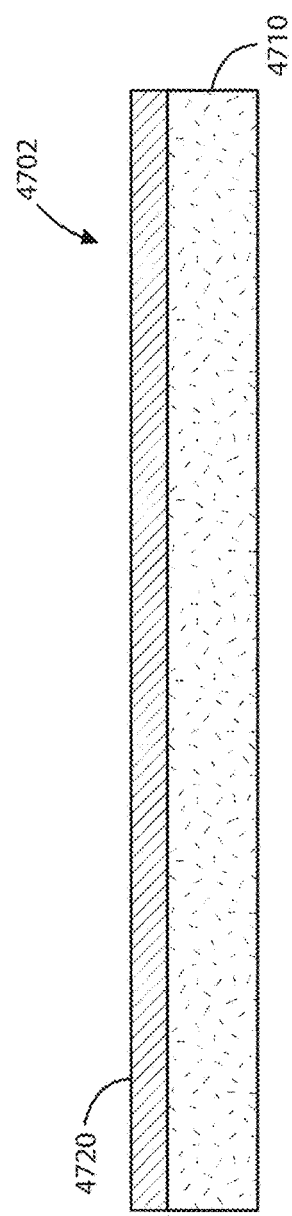

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials.

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

Figure 49C:
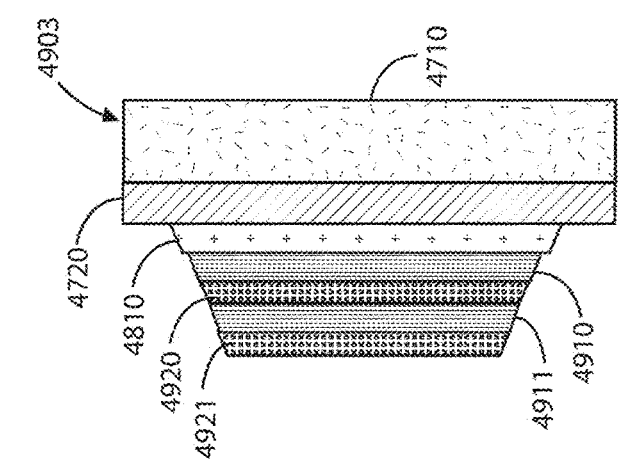
Figure 49A:
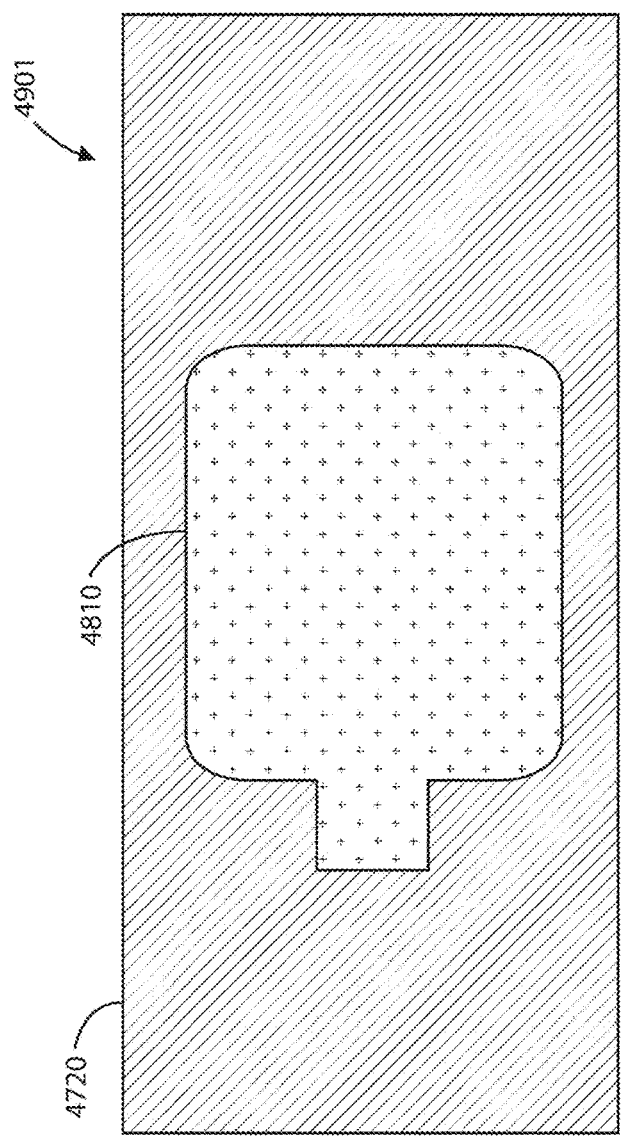
Figure 49B:
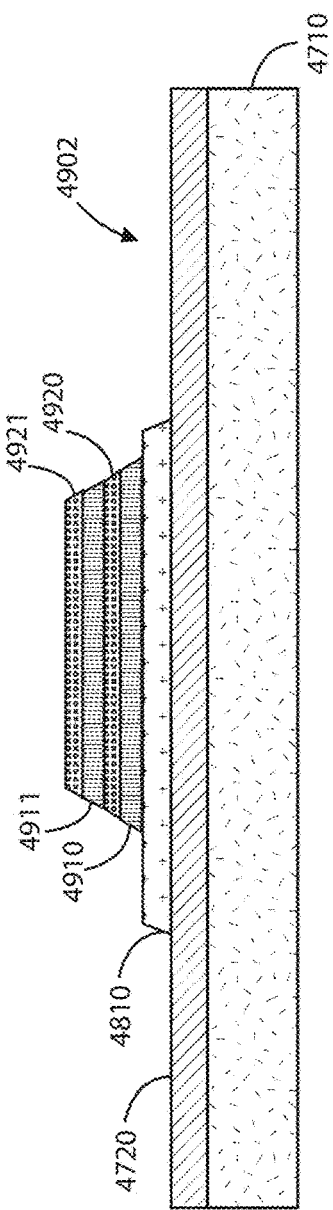

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

Figure 50C:
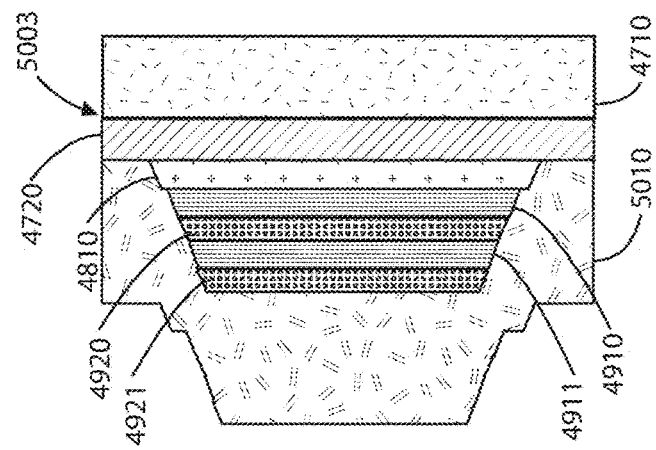
Figure 50A:
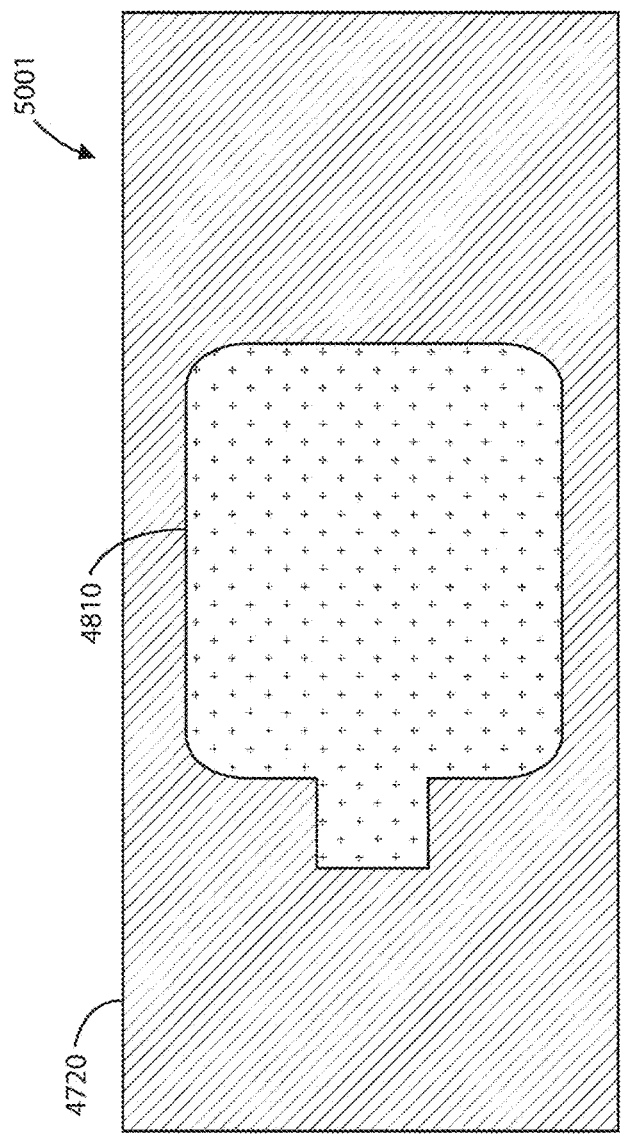
Figure 50B:
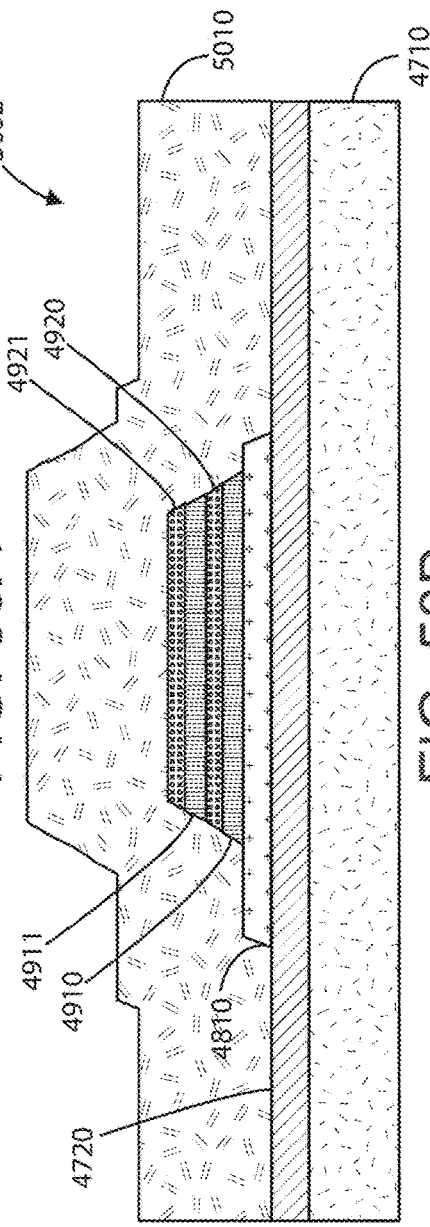

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide (SiO.sub.2), silicon nitride (SiN), or other like materials. In a specific example, this support layer 5010 can be deposited with a thickness of about 2-3 um. As described above, other support layers (e.g., SiNx) can be used.

Figure 51C:
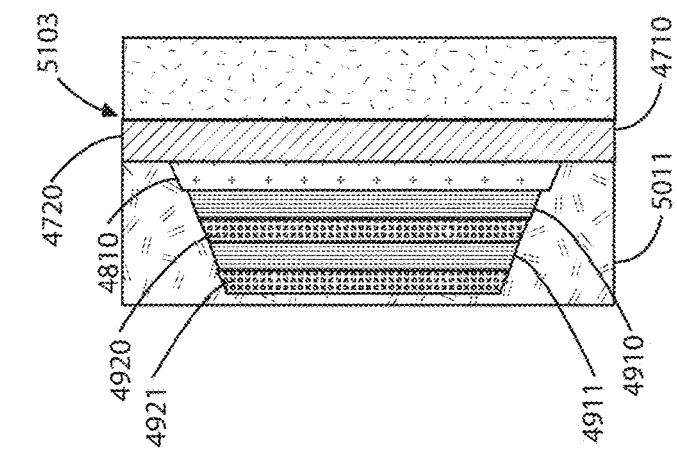
Figure 51A:
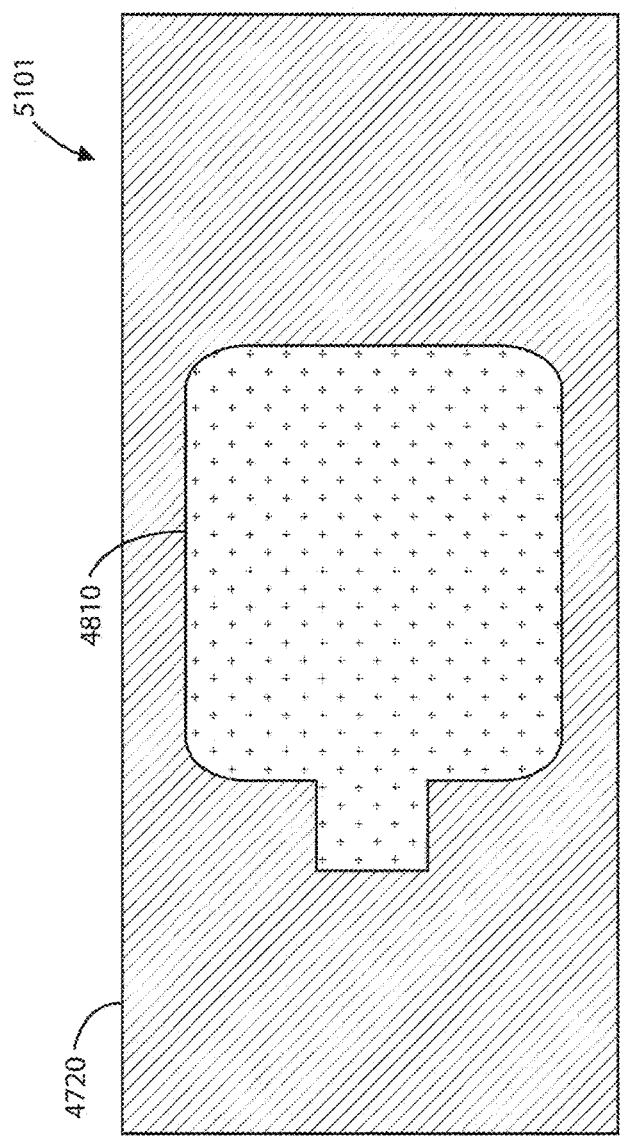
Figure 51B:
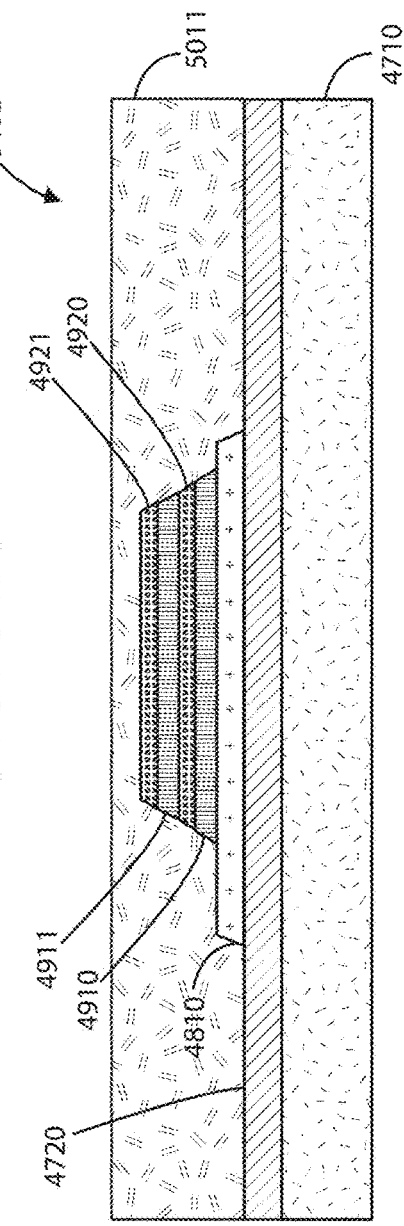

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 (SiO.sub.2 or like material) overlying a substrate having silicon (Si), sapphire (Al.sub.20.sub.3), silicon dioxide (SiO.sub.2), silicon carbide (SiC), or other like materials. In a specific embodiment, the bonding support layer 5220 of the bond substrate 5210 is physically coupled to the polished support layer 5011. Further, the physical coupling process can include a room temperature bonding process following by a 300 degree Celsius annealing process.

Figure 53C:
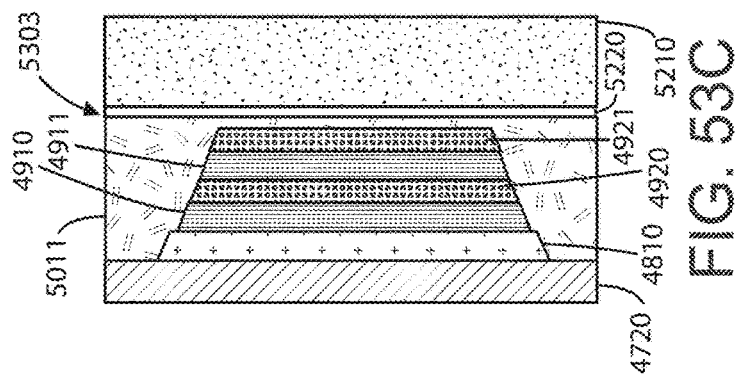
Figure 53A:
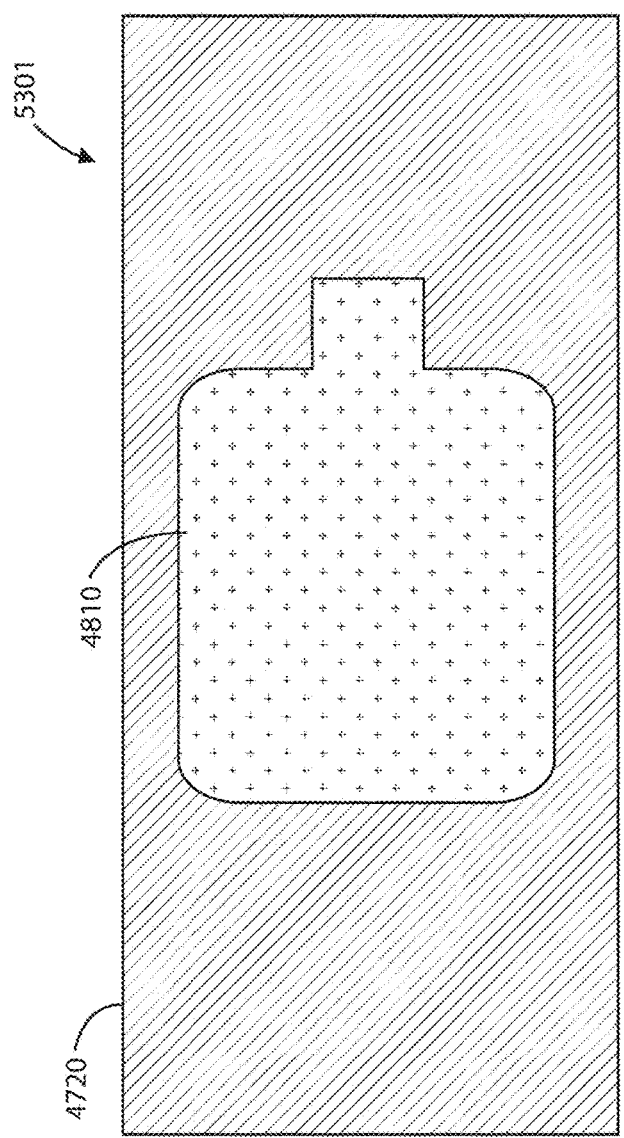
Figure 53B:
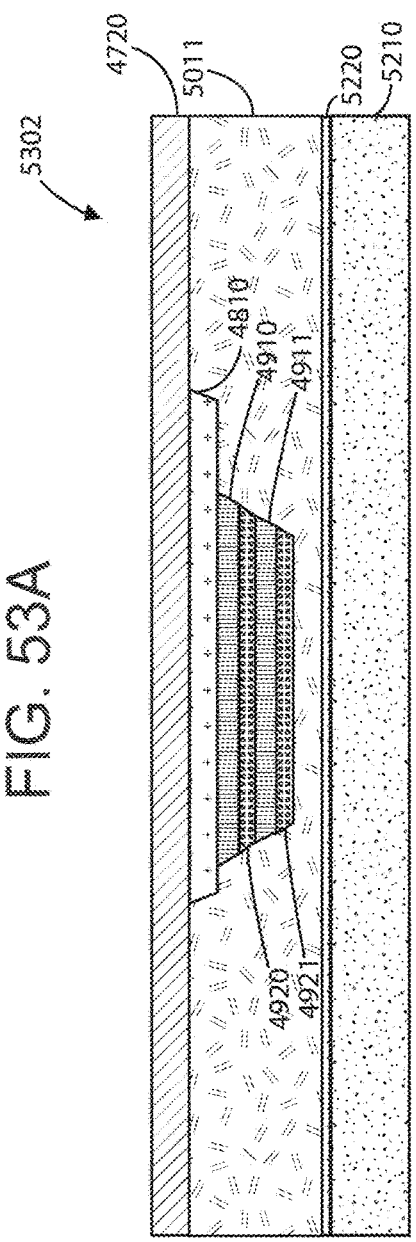

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

Figure 54A:
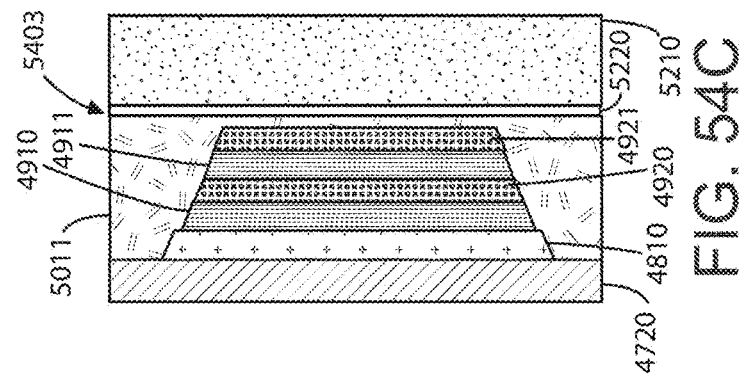
Figure 54B:
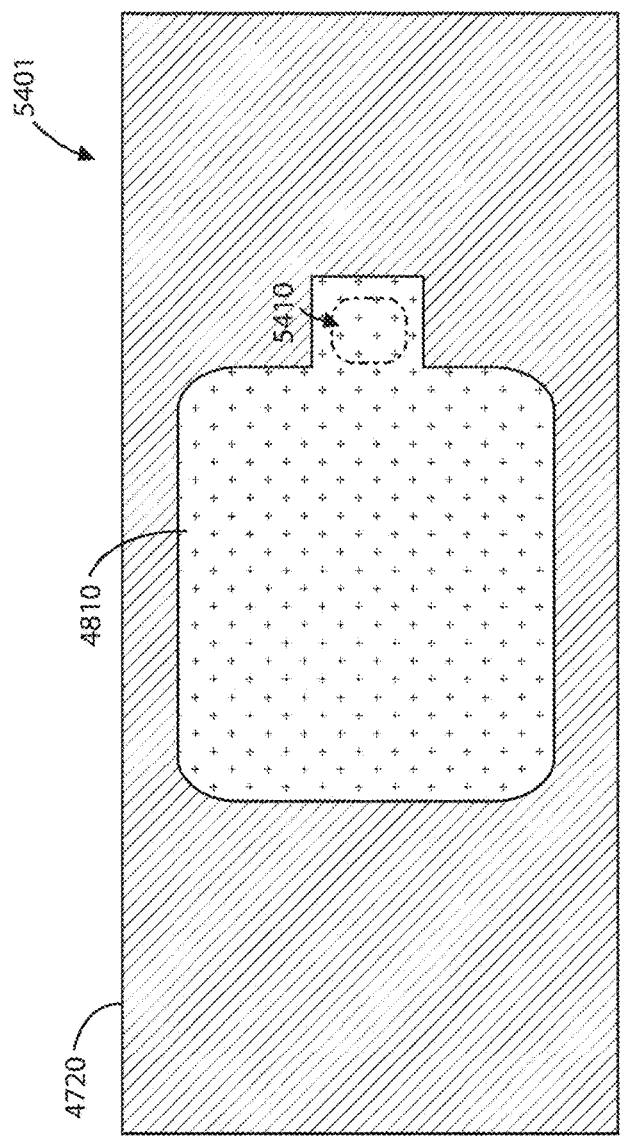
Figure 54C:
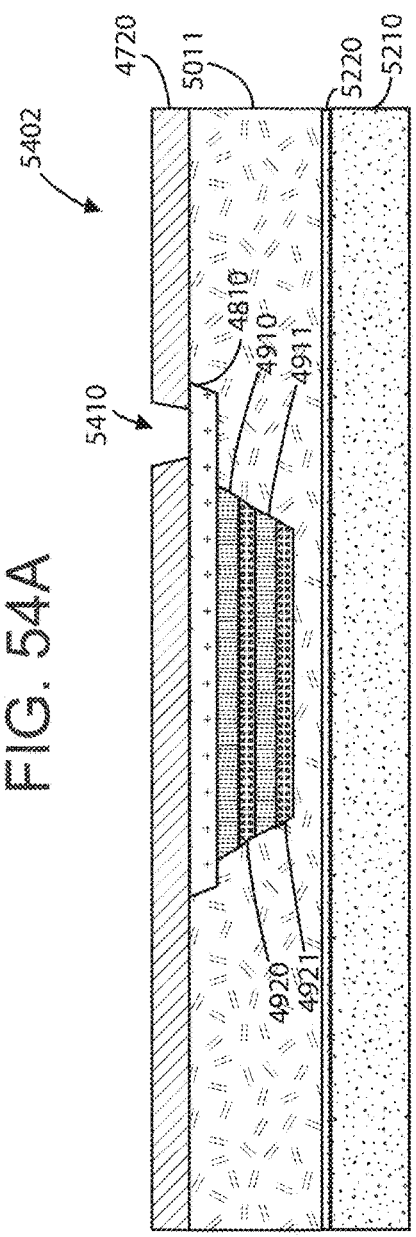

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide (SiOx), or other like materials. In a specific example, the second passivation layer 5620 can have a thickness ranging from about 50 nm to about 100 nm.

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed:

1. A method of forming a resonator structure, the method comprising:
   forming one or more template layers on a substrate;
   (a) epitaxially forming an AlScN layer on the template layer to a first thickness;
   (b) epitaxially forming an AlGaN interlayer on the AlScN layer to a second thickness that is substantially less than the first thickness; and
   repeating operations (a) and (b) until a total thickness of all AlScN layers and AlGaN interlayers provides a target thickness for a single crystal AlScN/AlGaN superlattice resonator structure on the template layer.

2. The method of claim 1 wherein the second thickness is about one tenth of the first thickness.

3. The method of claim 2 wherein the first thickness is about 20 nm, the second thickness is about 2 nm, and the total thickness is greater than about 40 nm.

4. The method of claim 1 wherein the template layer comprises AlGaN and epitaxially forming the AlGaN interlayer comprises:
   epitaxially forming the AlGaN interlayer on the AlScN layer with a concentration of Ga that matches a Ga concentration in the template layer.

5. The method of claim 4 wherein the template layer is $Al_{0.2}Ga_{0.8}N$ and the AlGaN interlayer is $Al_{0.2}Ga_{0.8}N$.

6. The method of claim 1 wherein a reaction chamber in which the resonator structure is formed is maintained between 800 and 950 degrees Centigrade when operations (a) and (b) are performed.

7. The method of claim 1 wherein repeating operations (a) and (b) further comprises:
   partitioning the target thickness into a first stage of layers having a first concentration of Sc in the AlScN layers, a second stage of layers having a second concentration of Sc in the AlScN layers that is greater than the first concentration, and a top stage of layers having a third concentration of Sc in the AlScN layers that is greater than the first and second concentrations.

8. The method of claim 1 wherein the concentrations of Sc in the AlScN layers are constant.

9. The method of claim 7, wherein the first second, and third concentrations of Sc are in a range between $Al_{0.85}Sc_{0.15}N$, and $Al_{0.79}Sc_{0.35}N$.

10. The method of claim 7 wherein the first, second, and third concentrations of Sc are graded.

11. The method of claim 1 wherein the template layer comprises one or more AlGaN layers, the method further comprising:
forming an AlN nucleation layer between the substrate and the AlGaN template layer(s).

12. The method of claim 1 wherein the substrate comprises Si, SiC, or $Al_2O_3$.

13. A method of forming a resonator structure, the method comprising:
forming a template layer on a substrate;
epitaxially forming a first portion of a AlScN layer on the template layer with a first concentration of Sc therein;
epitaxially forming a second portion of the AlScN layer on first portion with a second concentration of Sc therein that is greater than the first concentration; and
epitaxially forming a top portion of the AlScN layer on second portion with a third concentration of Sc therein that is greater than the first and second concentrations.

14. The method of claim 13 wherein a reaction chamber in which the resonator structure is formed is maintained between 800 and 950 degrees Centigrade when epitaxially forming the first, second, and top portions of the AlScN layer.

15. The method of claim 13 wherein the first second, and third concentrations of Sc are in a range between $Al_{0.85}Sc_{0.15}N$, and $Al_{0.65}Sc_{0.35}N$.

16. The method of claim 13 wherein the first, second, and third concentrations of Sc are graded.

* * * * *